(12) United States Patent
Ko et al.

(10) Patent No.: US 11,810,824 B2
(45) Date of Patent: Nov. 7, 2023

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chung-Ting Ko, Kaohsiung (TW); Sung-En Lin, Hsinchu County (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 242 days.

(21) Appl. No.: 17/461,608

(22) Filed: Aug. 30, 2021

(65) Prior Publication Data

US 2023/0065708 A1 Mar. 2, 2023

(51) Int. Cl.
*H01L 21/8234* (2006.01)
*H01L 29/786* (2006.01)
*H01L 29/423* (2006.01)
*H01L 29/06* (2006.01)
*H01L 21/8238* (2006.01)
*H01L 29/66* (2006.01)
*H01L 29/78* (2006.01)

(52) U.S. Cl.
CPC ........ *H01L 21/823481* (2013.01); *H01L 21/823412* (2013.01); *H01L 21/823431* (2013.01); *H01L 21/823437* (2013.01); *H01L 21/823821* (2013.01); *H01L 21/823878* (2013.01); *H01L 29/0673* (2013.01); *H01L 29/42392* (2013.01); *H01L 29/66795* (2013.01); *H01L 29/785* (2013.01); *H01L 29/78696* (2013.01)

(58) Field of Classification Search
CPC ..... H01L 21/823412; H01L 21/823431; H01L 21/823437; H01L 21/823481; H01L 21/823807; H01L 21/823821; H01L 21/823828; H01L 21/823878; H01L 27/088; H01L 27/0886; H01L 29/0673; H01L 29/42392; H01L 29/66439; H01L 29/6653; H01L 29/66583; H01L 29/66795; H01L 29/785; H01L 29/78696; B82Y 10/00; B82Y 40/00
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Cheung Lee
(74) *Attorney, Agent, or Firm* — Birch, Stewart, Kolasch & Birch, LLP

(57) ABSTRACT

A method for manufacturing a semiconductor device is provided. The method includes forming a semiconductor fin over a substrate; forming an isolation feature adjacent semiconductor fin; recessing the isolation feature to form a recess; forming a metal-containing compound mask in the recess; depositing a stress layer over the metal-containing compound mask, such that the stress layer is in contact with a top surface of the metal-containing compound mask; and annealing the metal-containing compound mask when the stress layer is in contact with the top surface of the metal-containing compound mask.

20 Claims, 47 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
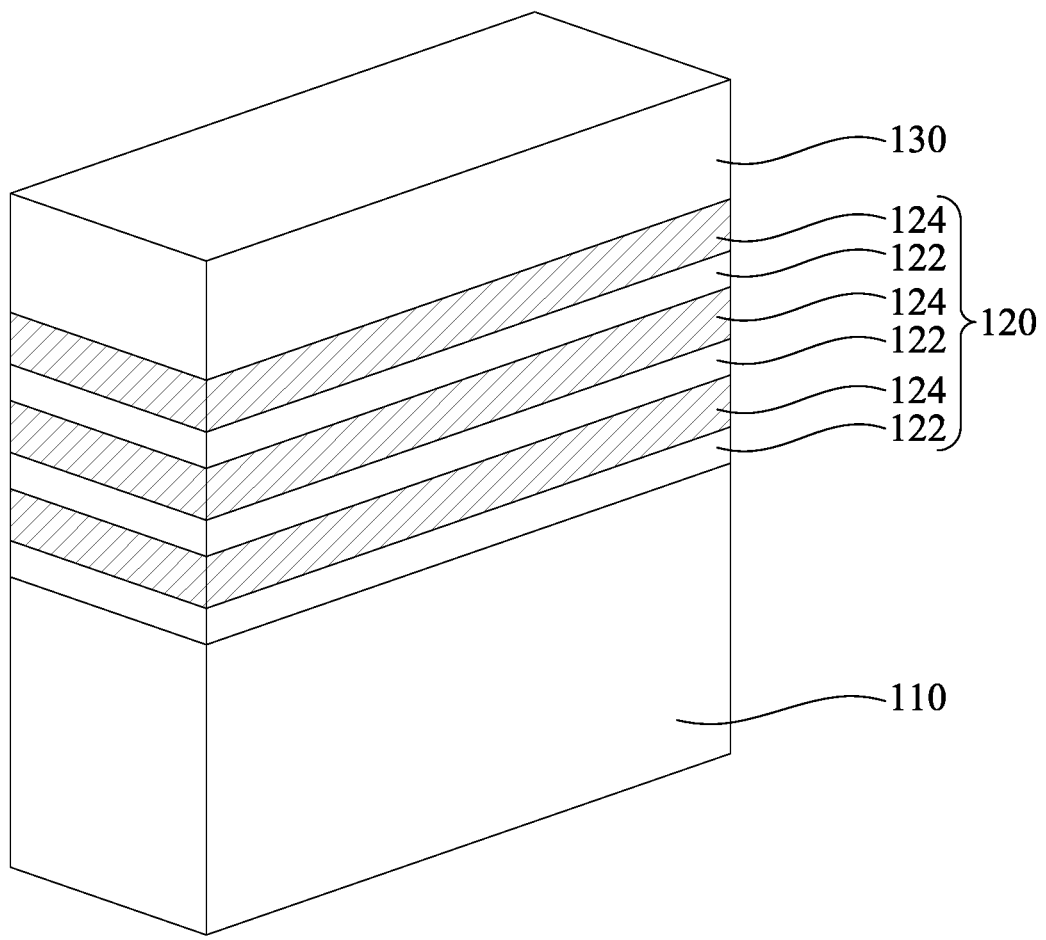
FIGS. 1-6B and 8-24 illustrate a semiconductor device at various stages of manufacturing in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to gate-all-around (GAA) devices including a crystallized hard mask with few or no seam/void therein. A GAA device includes a device that has its gate structure, or portions thereof, formed on four-sides of a channel region (e.g., surrounding a portion of a channel region). The channel region of a GAA device may include nanowire channels, bar-shaped channels, and/or other suitable channel configurations. In some embodiments, the channel region of a GAA device may have multiple horizontal nanowires or horizontal bars vertically spaced, making the GAA device a stacked horizontal GAA (S-HGAA) device. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1-6B and 8-24 illustrate a semiconductor device at various stages of manufacturing in accordance with some embodiments of the present disclosure. It is understood that additional operations may be provided before, during, and after the operations shown by FIGS. 1-6B and 8-24, and some of the operations described below can be replaced or eliminated for additional embodiments of the method. The order of the operations/processes may be interchangeable. In some embodiments, the shown semiconductor device shown may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. One or more epitaxial layers are grown on a substrate, thereby forming an epitaxial stack 120 over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method. In various embodiments, the substrate 110 may include any of a variety of substrate structures and materials.

The epitaxial stack 120 is formed on the substrate 110. The epitaxial stack 120 includes semiconductor layers 122 of a first composition interposed by semiconductor layers 124 of a second composition. The first and second compositions can be different, such that the semiconductor layers 122 may has a different oxidation rate and/or etch selectivity from that of the semiconductor layers 124 under the same etchant. In some embodiments, a germanium concentration of the semiconductor layers 122 is greater than that of the semiconductor layers 124, such that the oxidation rate of the semiconductor layers 124 is less than the oxidation rate of the semiconductor layers 122. For example, the semiconductor layers 122 are SiGe and the semiconductor layers 124 are silicon (Si). However, other embodiments are possible including those that provide for a first composition and a second composition having different oxidation rates and/or etch selectivity under the same etchant. In some alternative embodiments, the semiconductor layers 122 may include Si and where the semiconductor layers 124 include SiGe.

The semiconductor layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the semiconductor layers 124 to define a channel or channels of a device is further discussed below.

The semiconductor layers 124 serving as channel layers may have a thickness chosen based on device performance considerations. The semiconductor layers 122 in channel regions(s) may eventually be removed and serve to define a vertical distance between adjacent channel layers for a subsequently-formed multi-gate device and the thickness is chosen based on device performance considerations. Accordingly, the semiconductor layers 122 may also be referred to as sacrificial layers, and semiconductor layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the semiconductor layers 124 include the same material as the substrate 110. In some embodiments, the epitaxially grown layers 122 and 124 include a different material than the substrate 110. As stated above, in at least some examples, the semiconductor layers 122 include an epitaxially grown silicon germanium (SiGe) layer and the semiconductor layers 124 include an epitaxially grown silicon (Si) layer. Alternatively, in some embodiments, either of the semiconductor layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the semiconductor layers 122 and 124 may be chosen based on providing differing oxidation and/or etching selectivity properties. In some embodiments, the semiconductor layers 122 and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

It is noted that three layers of the semiconductor layers 122 and three layers of the semiconductor layers 124 are alternately arranged as illustrated in FIG. 1 for illustrative purposes. It can be appreciated that any number of epitaxial layers can be formed in the epitaxial stack 120; the number of layers depending on the desired number of channels regions for the transistor. For example, there may be more than three semiconductor layers 122 and three semiconductor layers 124.

In some embodiments, a cap semiconductor layer 130 is formed on the epitaxial stack 120 through epitaxy. The cap semiconductor layer 130 may include a third composition different from the second composition of the semiconductor layers 124, such that the cap semiconductor layer 130 may has a different oxidation rate and/or etch selectivity from that of the semiconductor layers 124 under the same etchant. In some embodiments, a germanium concentration of the cap semiconductor layer 130 is greater than that of the semiconductor layers 124, such that the oxidation rate of the semiconductor layers 124 is less than the oxidation rate of the cap semiconductor layer 130. For example, the cap semiconductor layer 130 and the semiconductor layers 122 are SiGe and the semiconductor layers 124 are silicon (Si). In some embodiments, the germanium concentration of the cap semiconductor layer 130 may be substantially equal to the germanium concentration of the semiconductor layers 122. In some embodiments, the germanium concentration of the cap semiconductor layer 130 may less or greater than the germanium concentration of the semiconductor layers 122, but lower than that of the semiconductor layers 124.

Figure 2A:
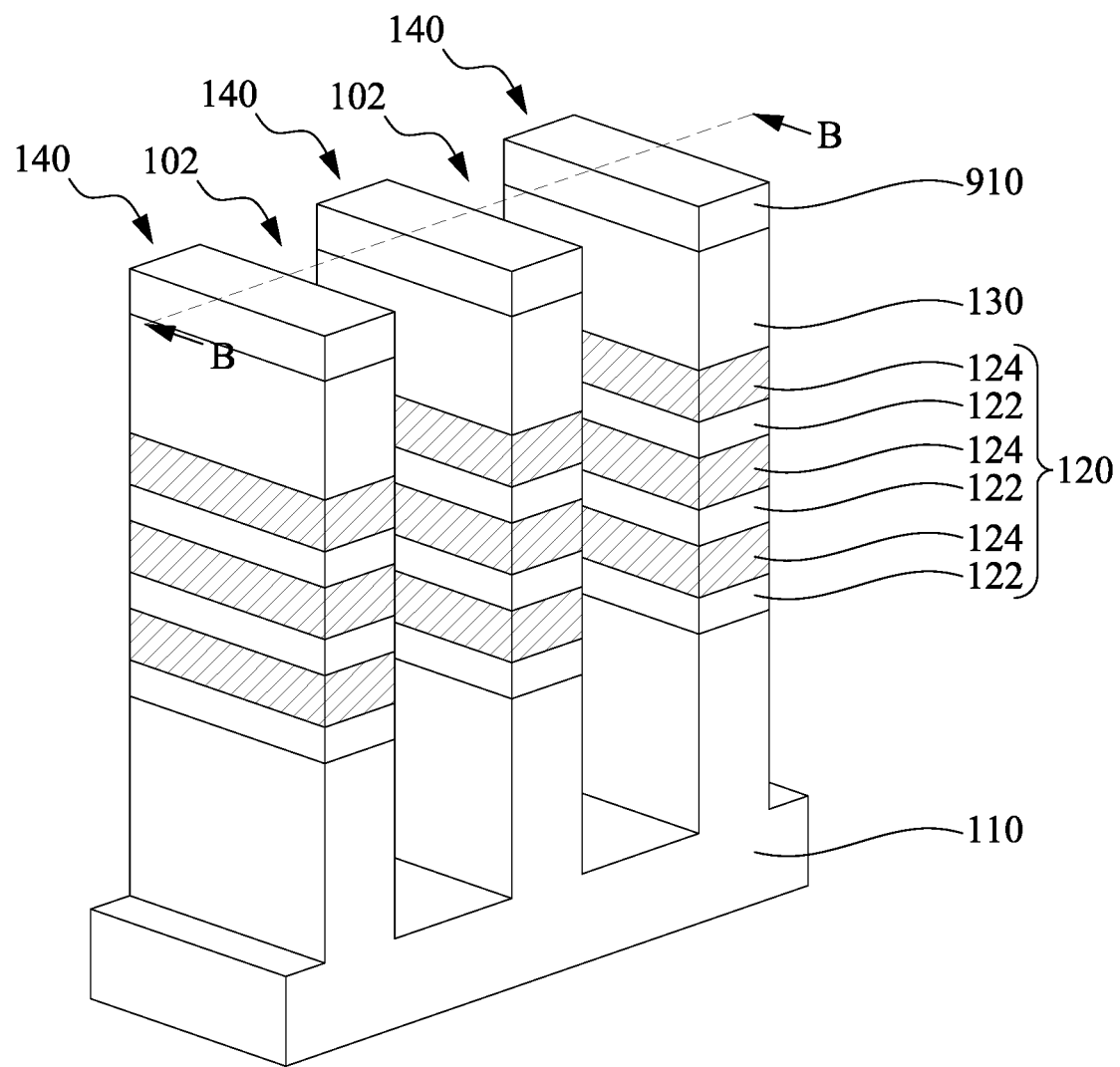
Figure 2B:
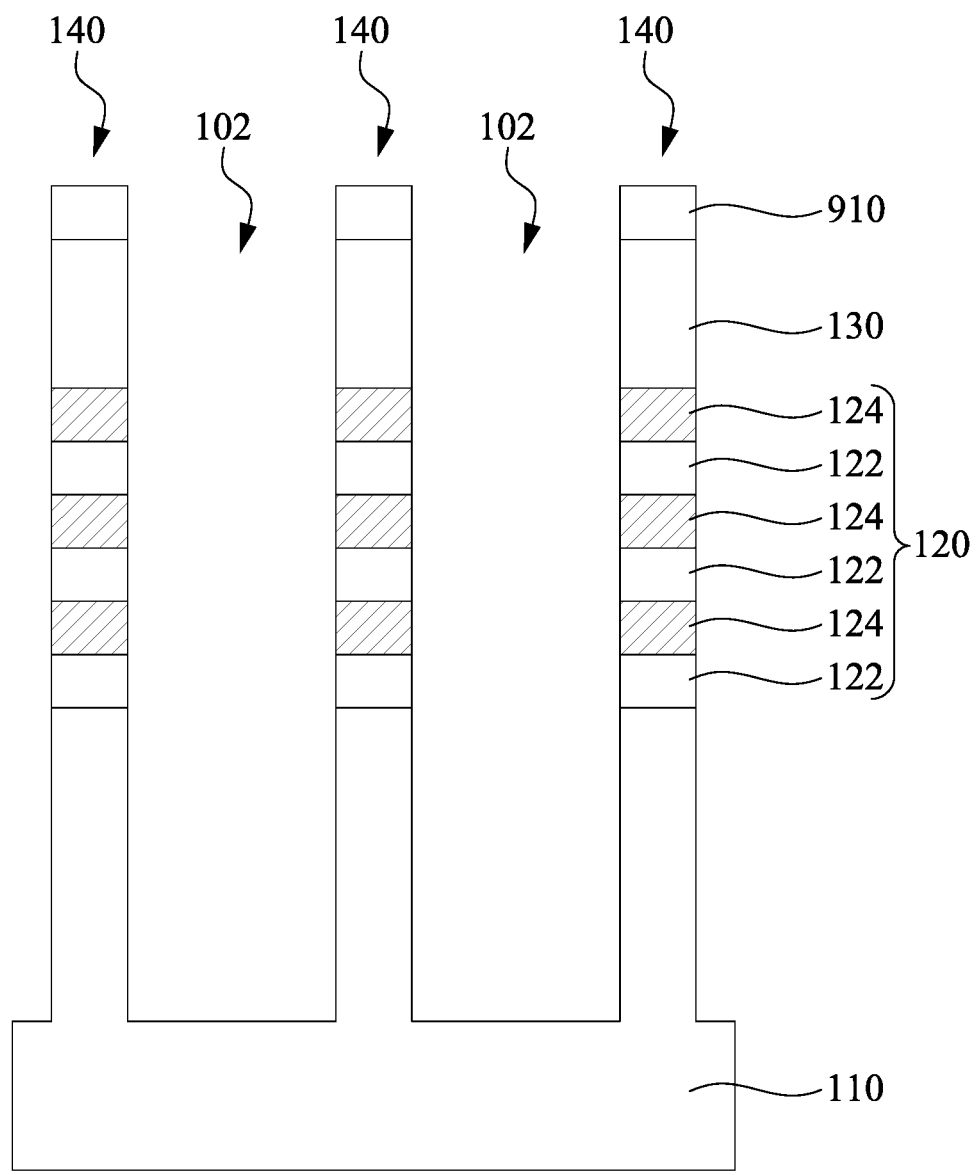

Reference is made to FIGS. 2A and 2B. FIG. 2B is a cross-sectional view taken along a line B-B in FIG. 2A. The cap semiconductor layer 130, the epitaxial stack 120, and the substrate 110 are patterned to form plural semiconductor fins 140. In various embodiments, each of the semiconductor fins 140 includes a substrate portion 112 formed from the substrate 110, portions of each of the epitaxial layers of the epitaxial stack including semiconductor layers 122 and 124, and a portion of the cap semiconductor layer 130. The semiconductor fins 140 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 140 by etching initial epitaxial stack 120. The etching process can include dry etching, wet etching, reactive ion etching (RIE), and/or other suitable processes.

In the illustrated embodiments as illustrated in FIGS. 1, 2A, and 2B, a hard mask (HM) layer 910 is formed over the epitaxial stack 120 and patterned through suitable photolithography process. In some embodiments, the HM layer 910 includes an oxide layer (e.g., a pad oxide layer that may include SiO2) and a nitride layer (e.g., a pad nitride layer that may include $Si_3N_4$) formed over the oxide layer. Subsequently, the epitaxial stack 120 and the substrate 110 of FIG. 1 are etched using the patterned hard mask 910 as a mask to form trenches 102 between adjacent semiconductor fins 140. The trenches 102 may be etched using a dry etch (e.g., reactive ion etching), a wet etch, and/or combination thereof.

Figure 3A:
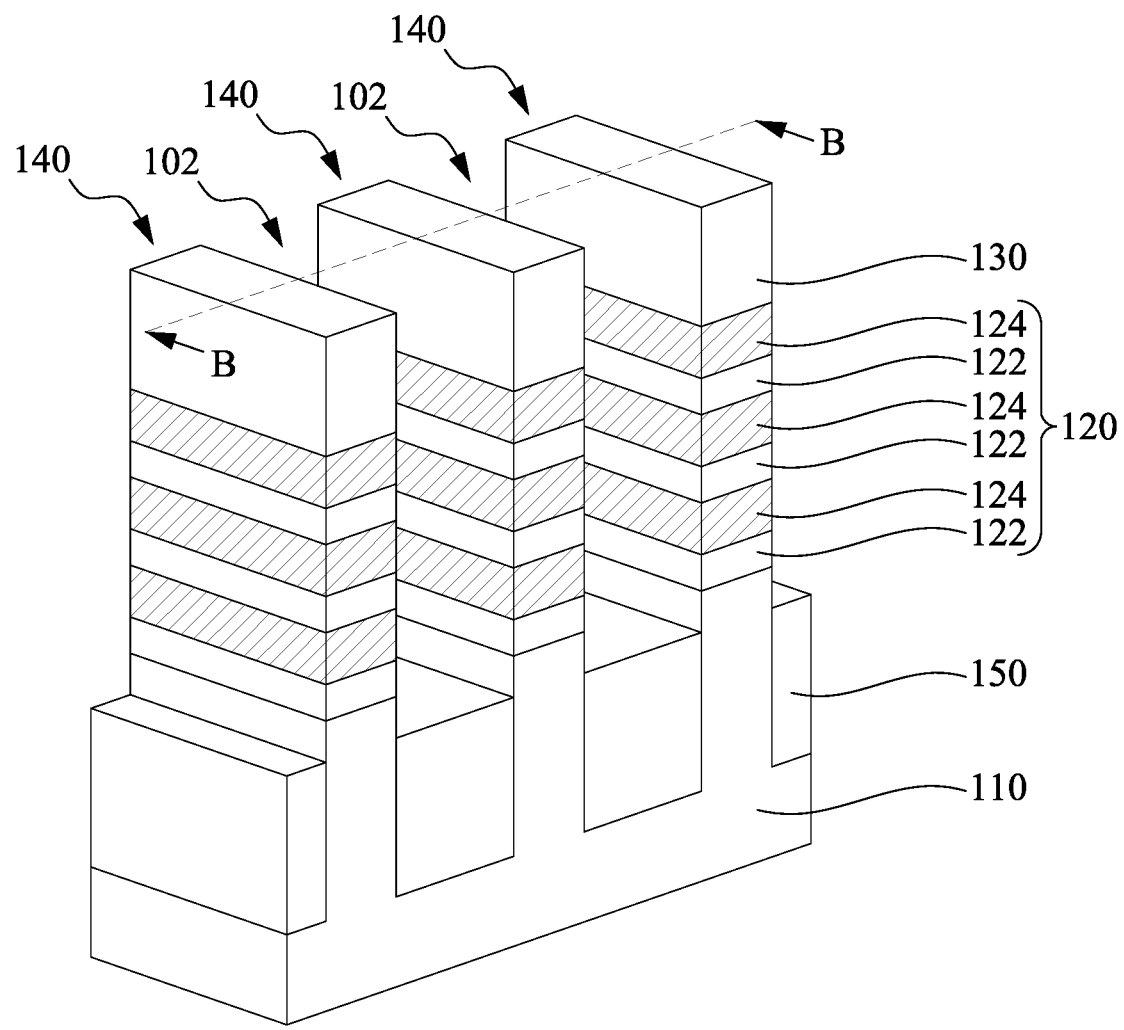
Figure 3B:
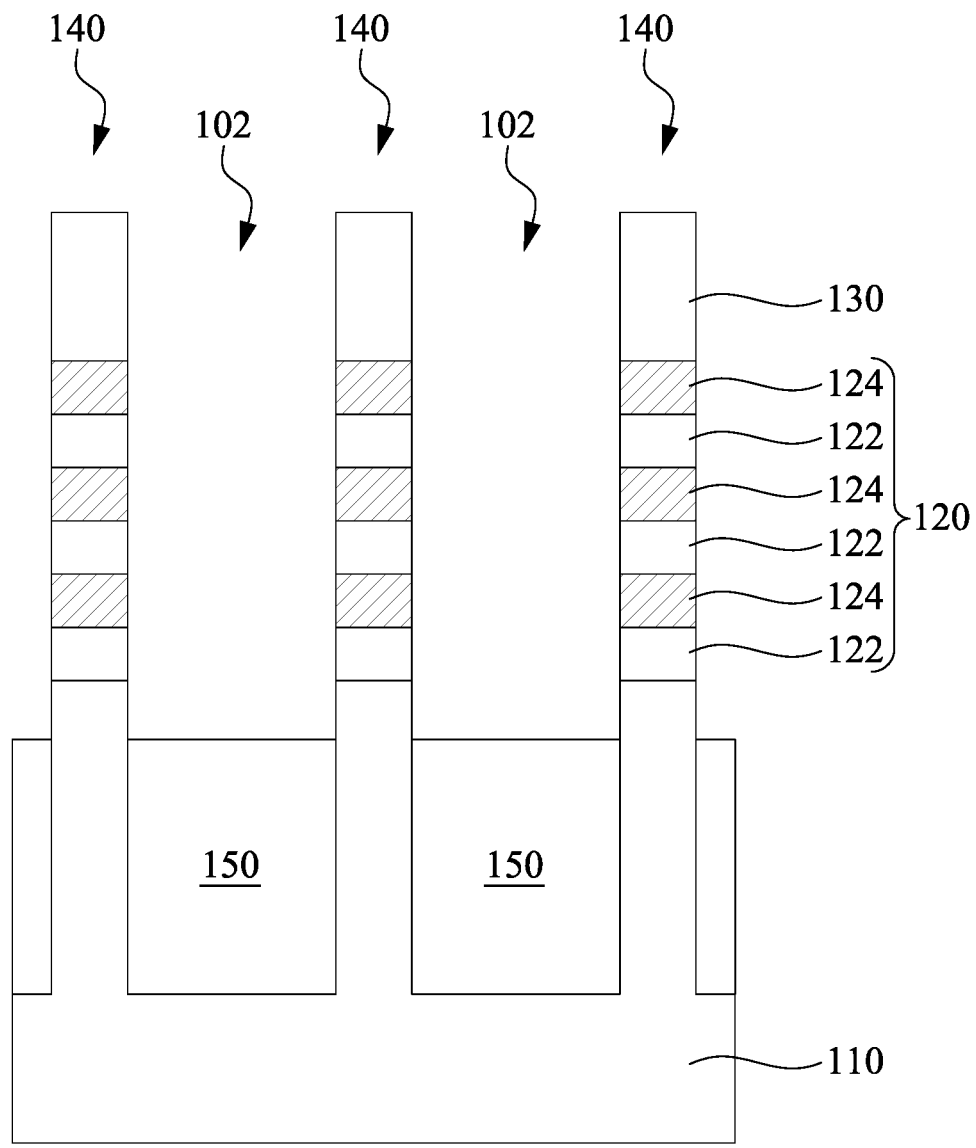

Reference is made to FIGS. 3A and 3B. FIG. 3B is a cross-sectional view taken along a line 3B-3B in FIG. 3A. Shallow trench isolation (STI) features 150 are formed interposing the semiconductor fins 140. In some embodiments, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure may be annealed, for example, to improve the quality of the dielectric layer. In some embodiments, the dielectric layer (and subsequently formed STI features 150) may include a multi-layer structure, for example, having one or more liner layers.

After deposition of the dielectric layer, the deposited dielectric material may be thinned and planarized, for example by a chemical mechanical polishing (CMP) process. In some embodiments, the HM layer 910 (referring to FIGS. 2A and 2B) may function as a CMP stop layer. Subsequently, the STI features 150 interposing the fins 140 may be recessed. Referring to the example of FIGS. 3A and 3B, the STI features 150 are recessed providing the fins 140 extending above the STI features 150. In some embodiments, the recessing process may include a dry etching process, a wet etching process, and/or a combination thereof. The HM layer 910 (referring to FIGS. 2A and 2B) may also be removed before, during, and/or after the recessing of the STI features 150. For example, the nitride layer of the HM layer 910 may be removed, for example, by a wet etching process. In some embodiments, the oxide layer of the HM layer 910 is removed by the same etchant used to recess the STI features 150. In some embodiments, a recessing depth is controlled (e.g., by controlling an etching time) so as to result in a desired height of the exposed upper portion of the fins 140. In the illustrated embodiments, the desired height exposes each of the layers of the epitaxial stack 120 in the fins 140.

Figure 4A:
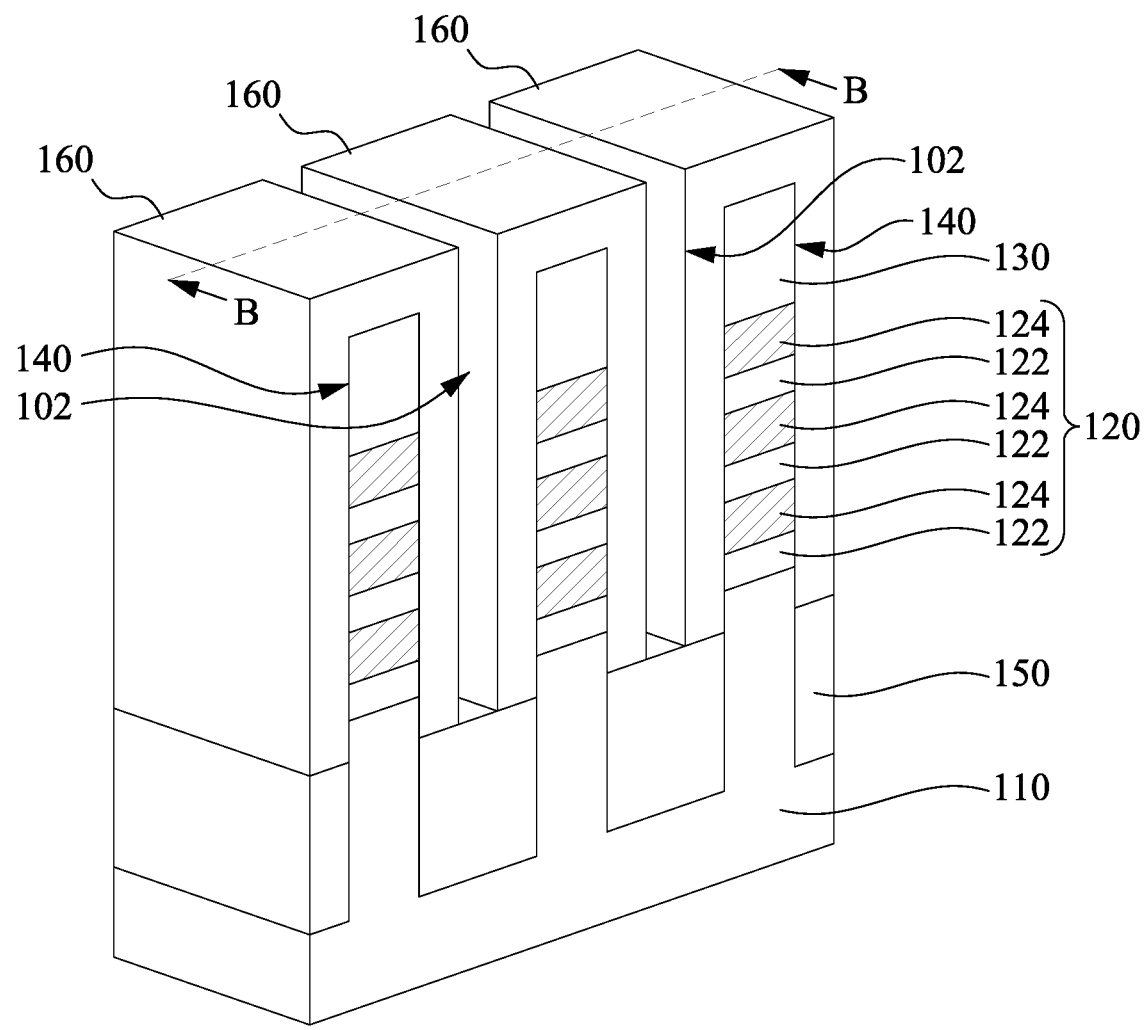
Figure 4B:
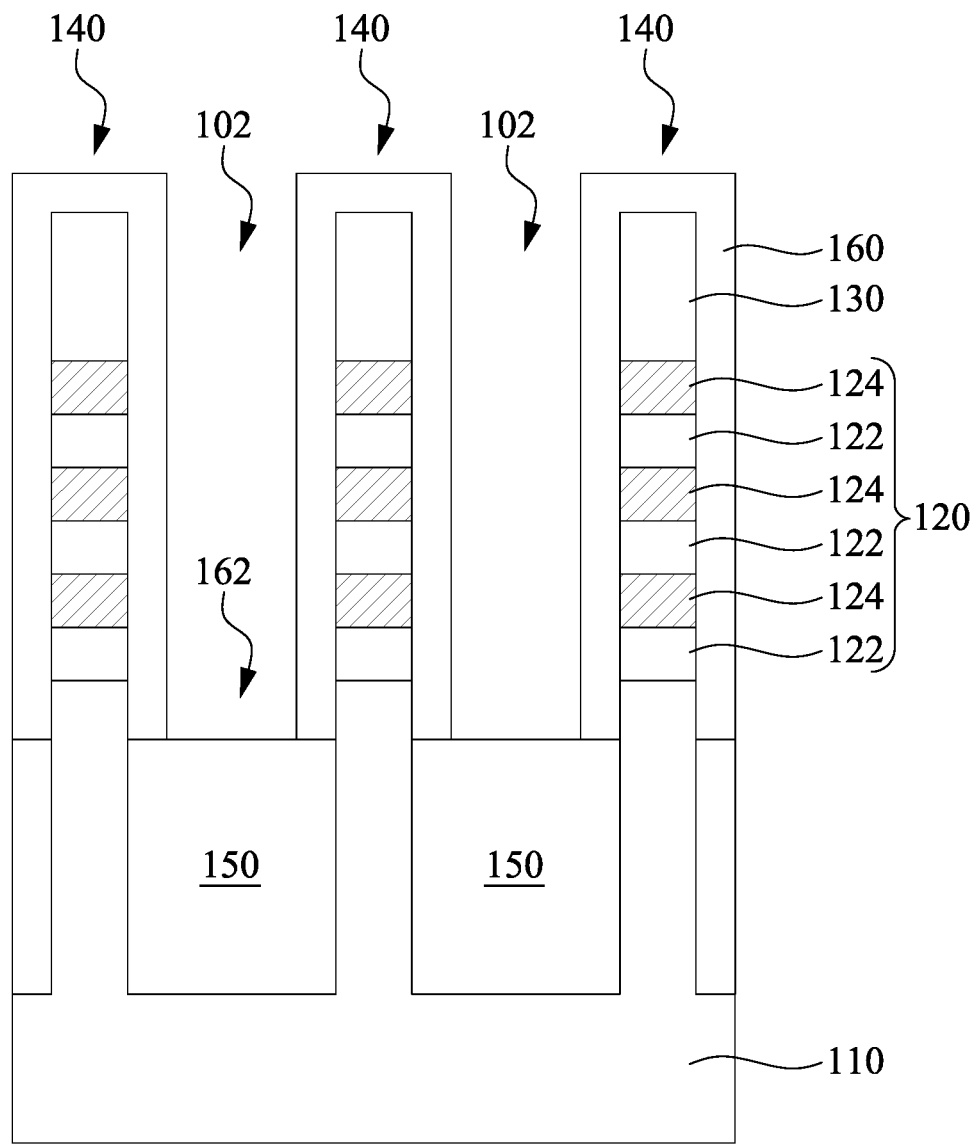

Reference is made to FIGS. 4A and 4B. FIG. 4B is a cross-sectional view taken along a line B-B in FIG. 4A. Cladding layers 160 are formed above the STI features 150 and respectively cover the semiconductor fins 140. In some embodiments, the cladding layers 160 are made of semiconductor materials, such as SiGe or other suitable materials. The cladding layers 160 may include a composition different from the second composition of the semiconductor layers 124, such that the cladding layers 160 may has a different oxidation rate and/or etch selectivity from that of the semiconductor layers 124 under the same etchant. In some embodiments, the cladding layers 160 may have a materials/composition substantially the same or similar to that of the cap semiconductor layer 130 and/or the semiconductor layers 122, such the cladding layers 160, the cap semiconductor layer 130, and/or the semiconductor layers 122 have similar etching rates under the same etchant. The formation of the cladding layers 160 may be include conformally depositing a semiconductor layer over the structure of FIGS. 3A and 3B, and etching away horizontal portions of the semiconductor layer over the STI features 150. Through the formation process, the cladding layers 160 are separated from each other, trenches 162 are formed therebetween and exposing top surfaces of the STI features 150.

Figure 5A:
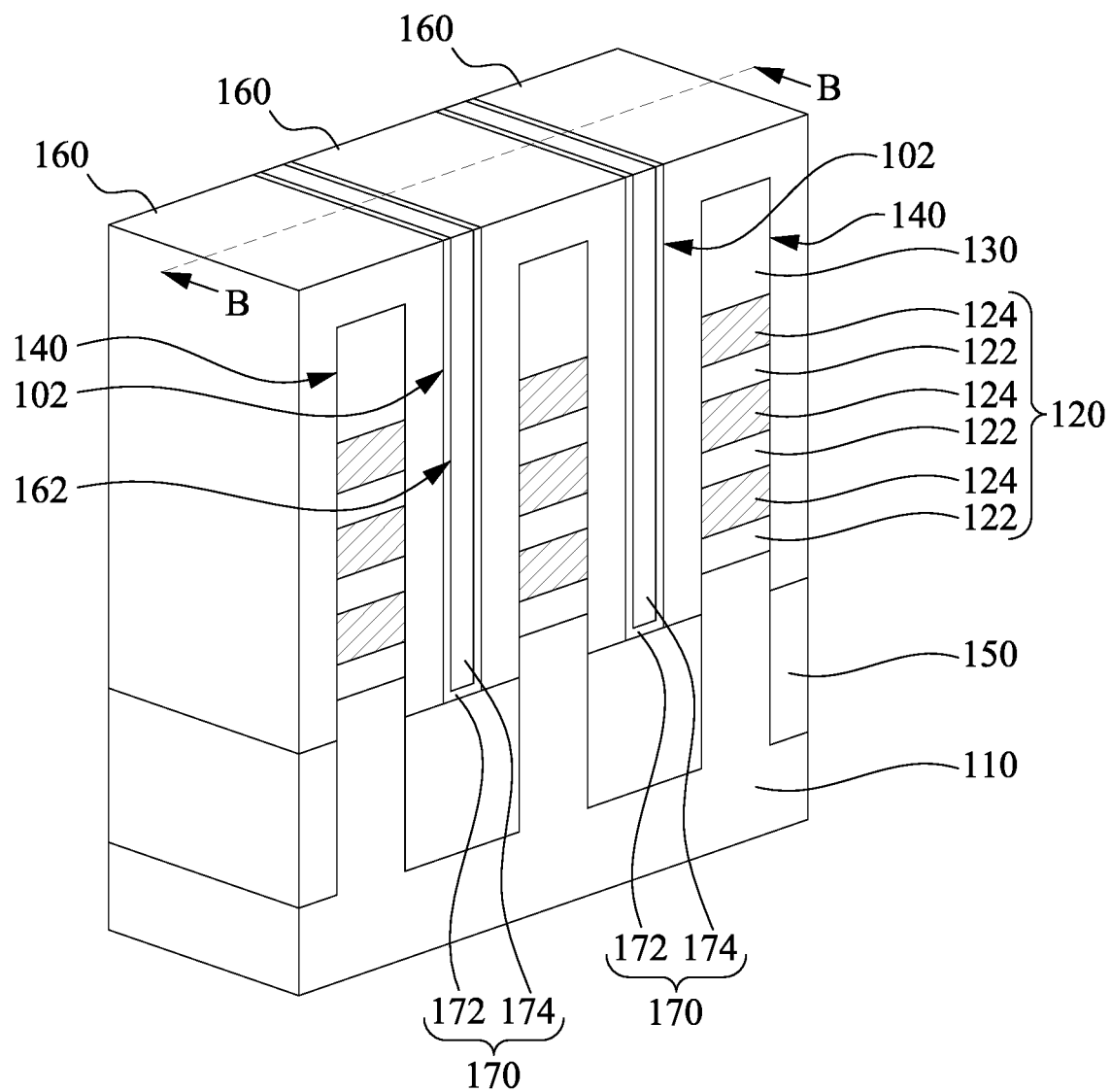
Figure 5B:
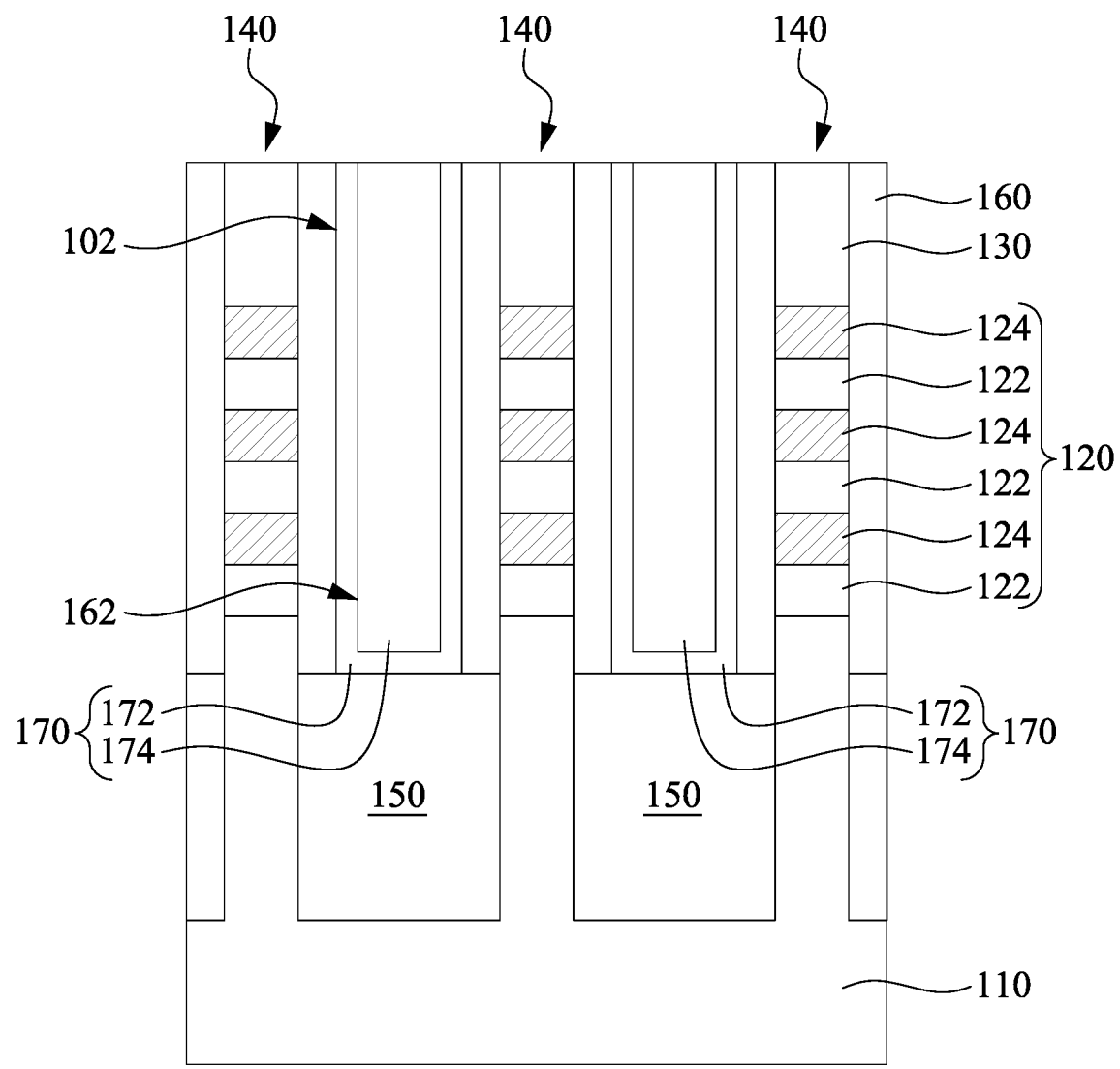

Reference is made to FIGS. 5A and 5B. FIG. 5B is a cross-sectional view taken along a line B-B in FIG. 5A. Dielectric fin structures 170 are formed over the STI features 150 and interposing the semiconductor fins 140. In some embodiments, a dielectric layer is conformally formed above the structure of FIGS. 4A and 4B, and a filling material is deposited to fill the trenches 102 and 162. A planarization (e.g., CMP) process is then performed to remove excess portions of the dielectric layer and the filling material to form the dielectric fin structures 170 respectively in the trenches 102. As such, each of the dielectric fin structures 170 includes a dielectric layer 172 and a filling dielectric fin 174 above the dielectric layer. In some embodiments, the dielectric layer 172 is deposited with an ALD process or other suitable processes. In some embodiments, the dielectric layer 172 and the filling dielectric fin 174 include silicon nitride, silicon oxide, silicon oxynitride, SiCN, SiCON, SiOC, or other suitable materials. For example, the dielectric layer 172 includes silicon nitride, and the filling dielectric fin 174 includes silicon dioxide.

The dielectric fin structures 170 are configured to limit the space for the source/drain epitaxial structures, which are epitaxially grown later. As a result, the source/drain epitaxial structures may be confined between the dielectric fin structures 170. This can be used to produce any desirable size of the source/drain epitaxial structures, for reducing parasitic capacitances.

Figure 6A:
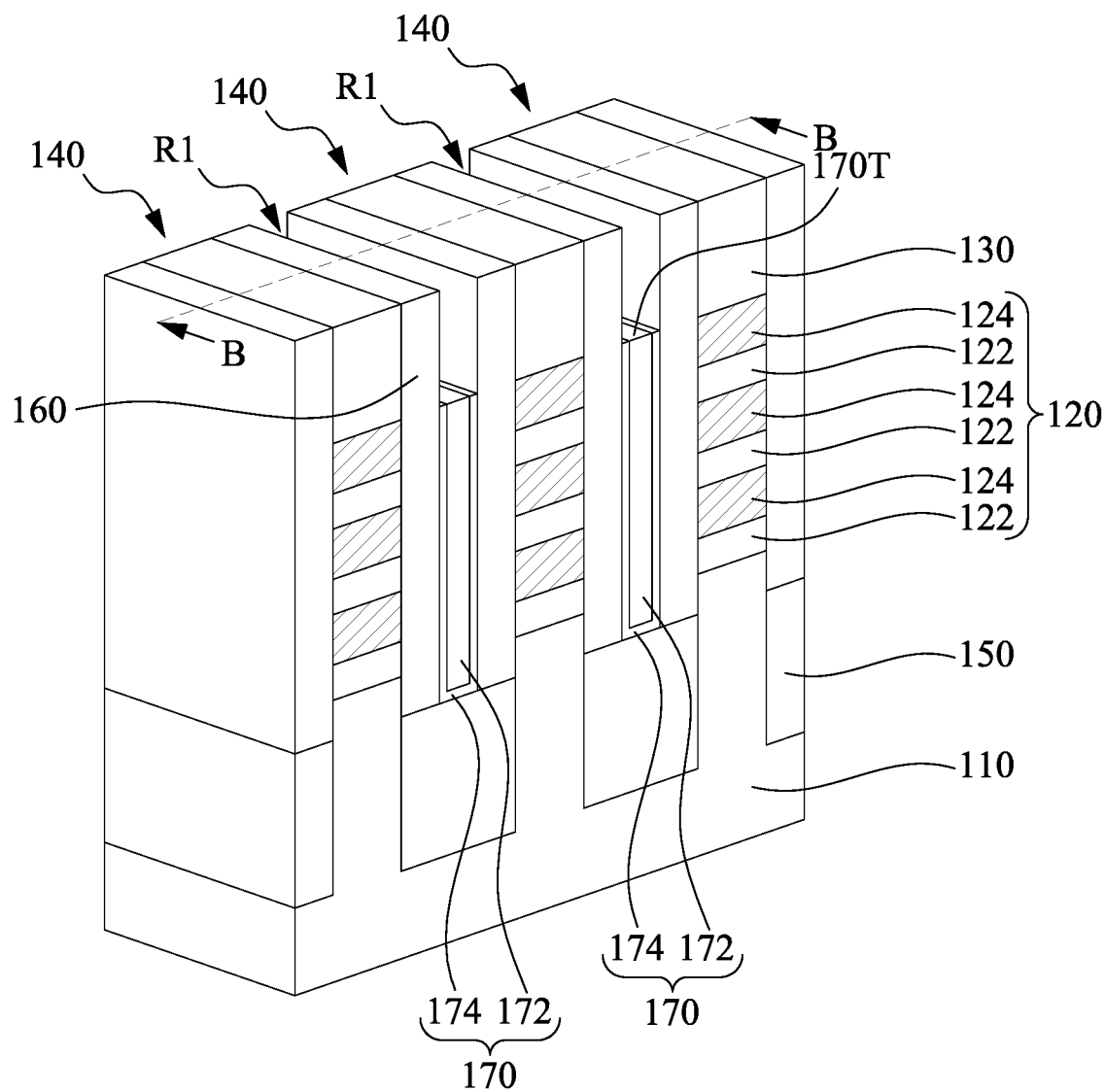
Figure 6B:
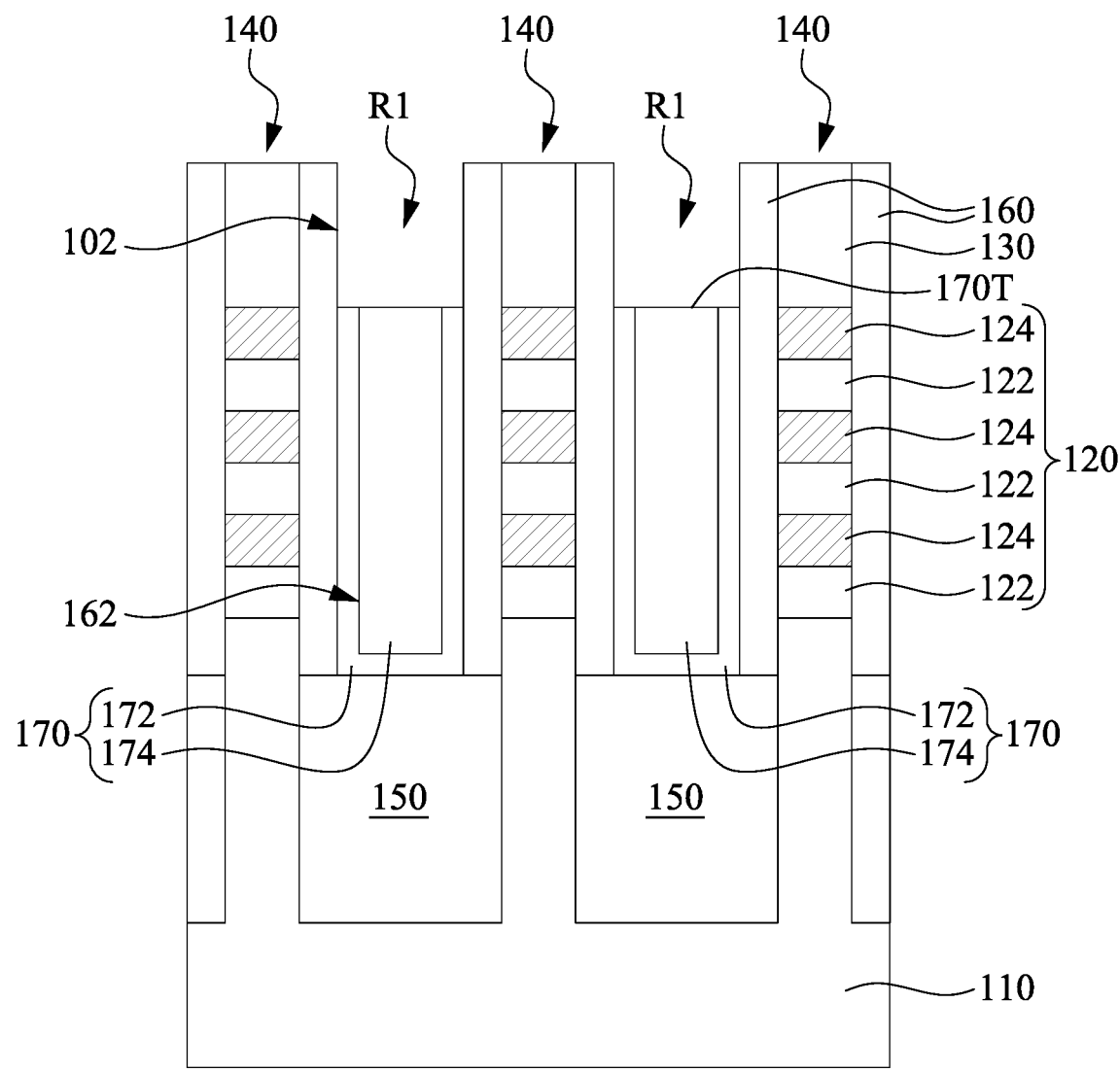

Reference is made to FIGS. 6A and 6B. FIG. 6B is a cross-sectional view taken along a line B-B in FIG. 6A. The dielectric fin structures 170 are recessed to form recesses R1 thereon. The recesses R1 may accommodate crystallized mask layers (e.g., the hard masks 180' in FIGS. 12A and 12B) subsequently formed. In some embodiments, multiple etching processes are performed to recess the dielectric fin structures 170. The etching processes include dry etching process, wet etching process, or combinations thereof. In some embodiments, during recessing of the dielectric fin structures 170, horizontal portions of the cladding layers 160 over the fins 140 are removed. In some embodiments, after the recessing process, a top surface 170T of the dielectric fin structures 170 is substantially level with the top surface of the topmost semiconductor layer 124, or may be at an intermediate level between the top surface and the bottom surface of the cap semiconductor layer 130.

Figure 7A:
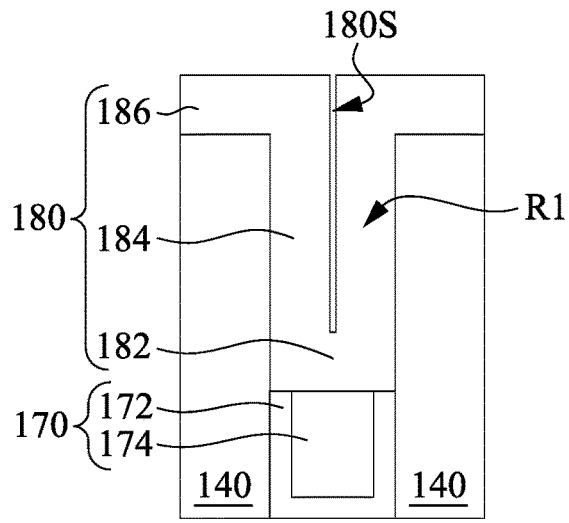
FIGS. 7A-7C illustrate a method for manufacturing a crystallized hard mask in a semiconductor device at various stages in accordance with some embodiments of the present disclosure.
Figure 7B:
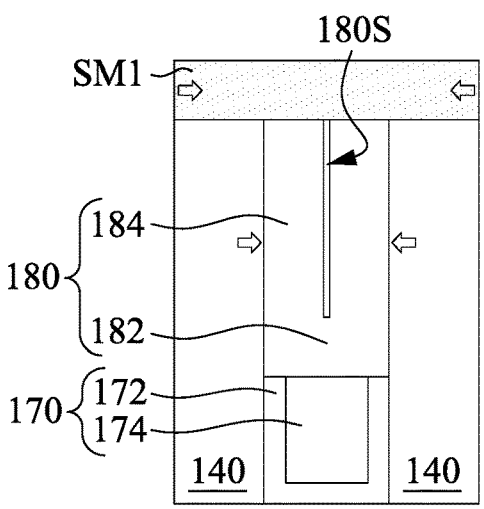
Figure 7C:
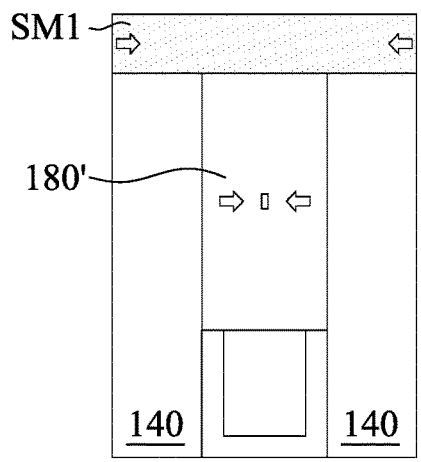

FIGS. 7A-7C illustrate a method for manufacturing a crystallized hard mask (e.g., the hard masks 180' in FIGS. 12A and 12B) in a semiconductor device at various stages in accordance with some embodiments of the present disclosure. In some embodiments of the present embodiments, the crystallized hard mask may fill a recess/gap/trench in the semiconductor device, and therefore also referred to as a gap fill mask.

Referring to FIG. 7A, the semiconductor device is illustrated as having a recess R1. The recess R1 may also be referred to as a gap or trench in some other embodiments. In the exemplary embodiments, the recess R1 is formed between the semiconductor fins 140 and over the dielectric fin structure 170.

A metal-containing compound material 180 is conformally deposited into the recess R1 and over the top surfaces of the semiconductor fins 140. For example, the metal-containing compound material 180 may be metal oxides (e.g., $HfO_2$, $Al_2O_3$, or the like) or metal nitrides (e.g., WCN). In some embodiments, the metal-containing compound material 180 may be deposited by atomic layer deposition (ALD), chemical vapor deposition (CVD), or other suitable deposition method. In some embodiments, the deposited metal-containing compound material 180 may be in amorphous state. The metal-containing compound material 180 may have a bottom portion 182 extending along a bottom of the recess R1, side portions 184 respectively extending along the sidewalls of the recesses R1, and a top portion 186 extending along the top surfaces of the semiconductor fins 140. Due to the conformal deposition process, according to the profile of the recess R1, the metal-containing compound material 180 may have a slit 180S surrounded by the side portions 184 and over the bottom portion 182.

Referring to FIGS. 7B, a planarization process (e.g., a CMP process) is performed, thereby removing portions of the metal-containing compound material 180 out of recesses R1. For example, the top portion 186 (referring to FIG. 7A) is removed. Subsequently, a stress material SM1 is deposited over the remaining portions of the metal-containing compound material 180. The stress material SM1 is capable of creating a high tensile stress field over and across the metal-containing compound material 180.

In some embodiments, the stress material SM1 may include a dielectric material that is selected to have hydrogen terminals. The hydrogen terminals may result in nano gas bubbles in the stress material SM1, and the nano gas bubbles may shrink when temperature degrades, thereby result in the tensile stress in subsequent annealing process. In some embodiments, the formation of the stress material SM1 may include using a $SiH_2Cl_2$ precursor to react with a $NH_3$ plasma, for example, at a temperature higher than 500° C., thereby forming $SiNH_2$ or SiNH as the resulted stress material SM1. Therefore, the resulted stress material SM1 (e.g., $SiNH_2$ or SiNH) has hydrogen terminal therein. In some embodiments, materials of the stress material SM1 may include the group of NH, $NH_2$, CH, $CH_3$, or the like. For example, the stress material SM1 includes silicon nitride (including NH, $NH_2$), SiC, SiCN, SiCON (including CHO, $CH_x$, the like, or the combination thereof. Quality and quantity of the hydrogen terminals can be examined by suitable analysis method, such as Fourier-transform infrared (FT-IR) spectrophotometer.

In some embodiments, the stress material SM1 may include material that can crystalize, such as metal-containing compounds. In the present embodiments, the stress material SM1 may crystallized by the subsequent annealing process, thereby providing tensile stress. In the present embodiments, for exerting the tensile stress onto the metal-containing compound material 180, the stress material SM1 is designed to have a thickness greater than that of the metal-containing compound material 180 (i.e., the depth of the recess R1).

Referring to FIGS. 7C, an annealing process is performed to induce crystallization in the metal-containing compound material 180. After the annealing process, the metal-containing compound material 180 is referred to as a crystallized hard mask 180'. The crystallized hard mask 180' may have a higher etch resistance to subsequent etching process than a dielectric hard mask layer (e.g., silicon nitride mask) since the crystalline structure show strong bonding.

The annealing process may include heating the metal-containing compound material 180 up to a temperature where the metal-containing compound material 180 can be converted from amorphous state to crystalline state. For example, in some embodiments where the metal-containing compound material 180 includes $HfO_2$, the annealing process may include heating the metal-containing compound material 180 up to a temperature ranging from 450° C. to 950° C., or from 600° C. to 950° C. If the temperature is too low, the metal-containing compound material 180 may not crystallize, which may result in an amorphous mask that have less etch resistance. If the temperature is too high, it may make structure bending, distortion, and interdiffusion. In some embodiments, the annealing process may be performed with an environment containing $H_2O$, $O_2$, or other gas.

In some embodiments, the annealing process may also induce the merge of the side portions 184 (referring to FIG. 7B), such that the slit 180S (referring to FIG. 7B) may disappear. In some cases, due to the slit volume shrinkage and surface tension balance, seam/void was easily formed and observed during material crystallization and grain growth near the merge interface.

In some embodiments of the present disclosure, since the stress material SM1 may create a high tensile stress field across the metal-containing compound material 180, a driving force from the external stress is exerted on the metal-containing compound material 180 when the side portions 184 (referring to FIG. 7B) are merged during annealing process. Through the configuration, the crystallized hard mask 180' may have less or no seam/void. In some embodiments, the method shown in FIGS. 7A-7C is applied to the structure of FIG. 6B, thereby forming crystallized hard mask 180' over the structure of FIG. 6B, which are illustrated in FIGS. 8-11.

Figure 8:
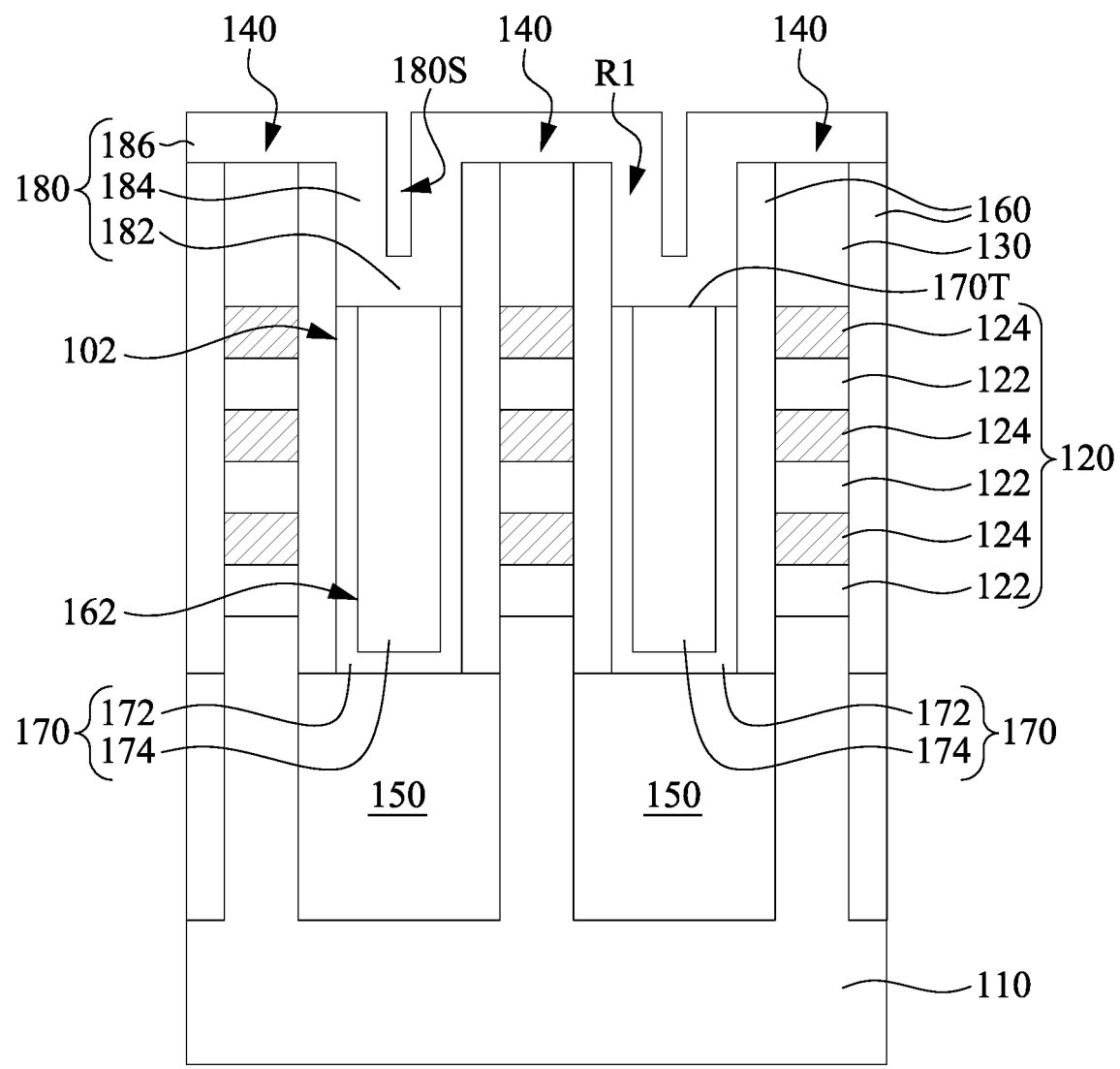

Reference is made to FIG. 8. A metal-containing compound material 180 is conformally deposited into the recess R1 and over the top surfaces of the semiconductor fins 140. As illustrated previously, the metal-containing compound material 180 may have a bottom portion 182 extending along a bottom of the recess R1, side portions 184 respectively extending along the sidewalls of the recesses R1, and a top portion 186 extending along the top surfaces of the semiconductor fins 140. Due to the conformal deposition process, according to the profile of the recess R1, the metal-containing compound material 180 may have a slit 180S surrounded by the side portions 184 and over the bottom portion 182.

Figure 9:
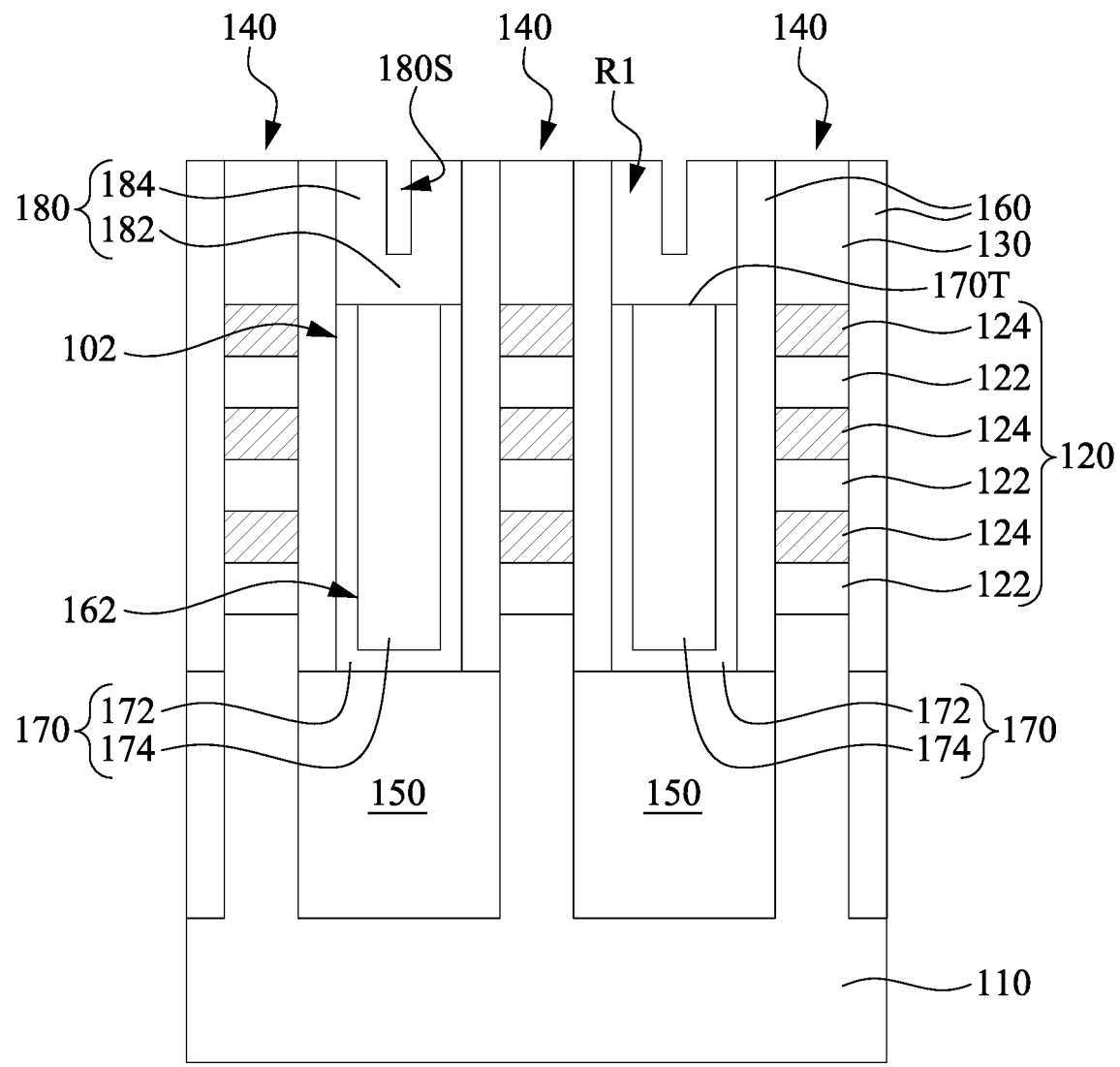

Reference is made to FIG. 9. A planarization process (e.g., a CMP process) is performed, thereby removing portions of the metal-containing compound material 180 out of recesses R1 (e.g., the top portion 186 in FIG. 8).

Figure 10:
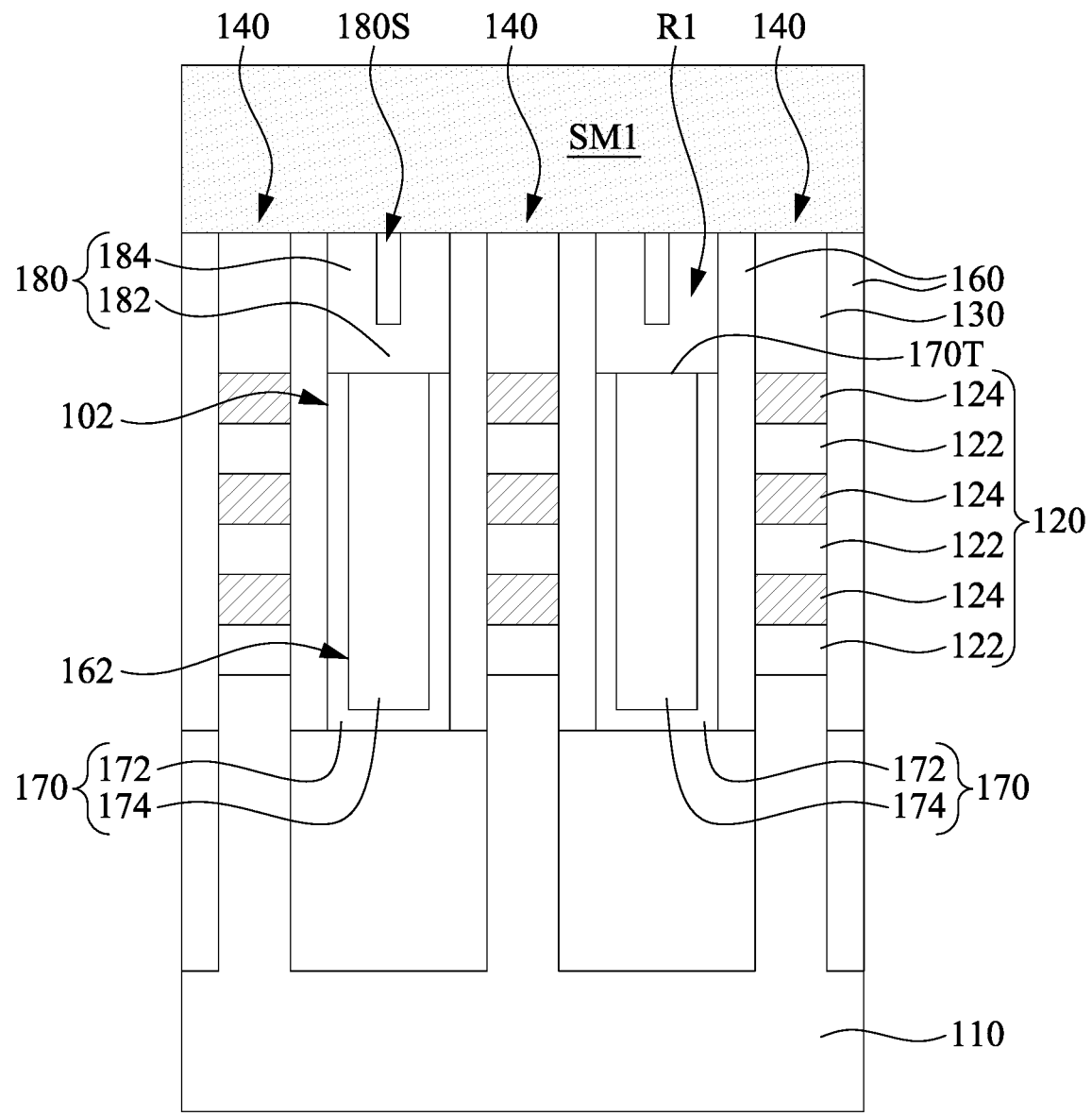

Reference is made to FIG. 10. A stress material SM1 is deposited over a top surface of the metal-containing compound material 180. The stress material SM1 may create a high tensile stress field across the metal-containing compound material 180.

Figure 11:
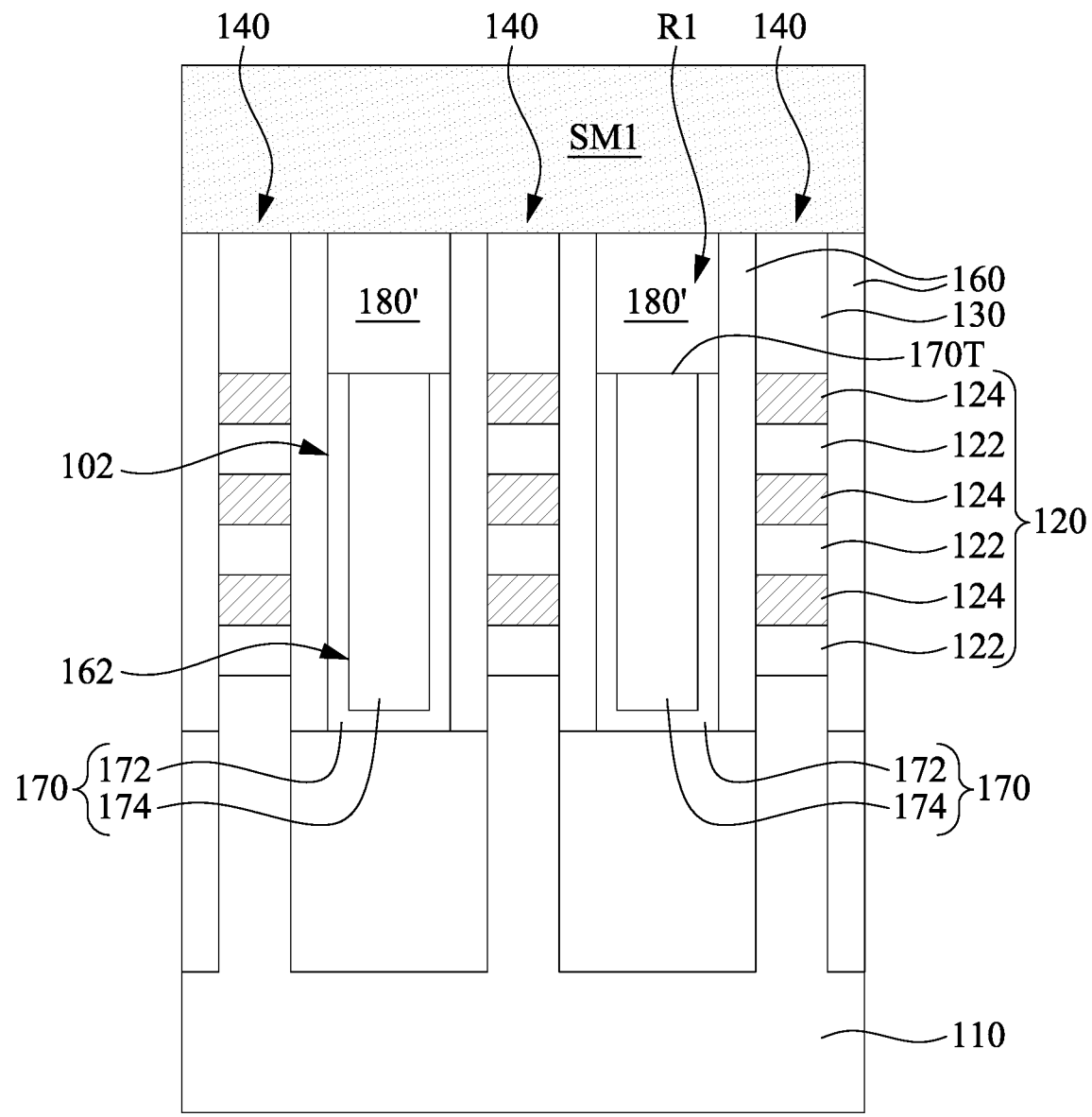

Reference is made to FIG. 11. An annealing process is performed to induce crystallization in the metal-containing compound material 180, thereby converting the metal-containing compound material 180 into the crystallized hard masks 180'. Through the annealing process performed under the high tensile stress, the slit 180S (referring to FIG. 10) is eliminated, and the crystallized hard masks 180' have little or no seam/void.

Figure 12A:
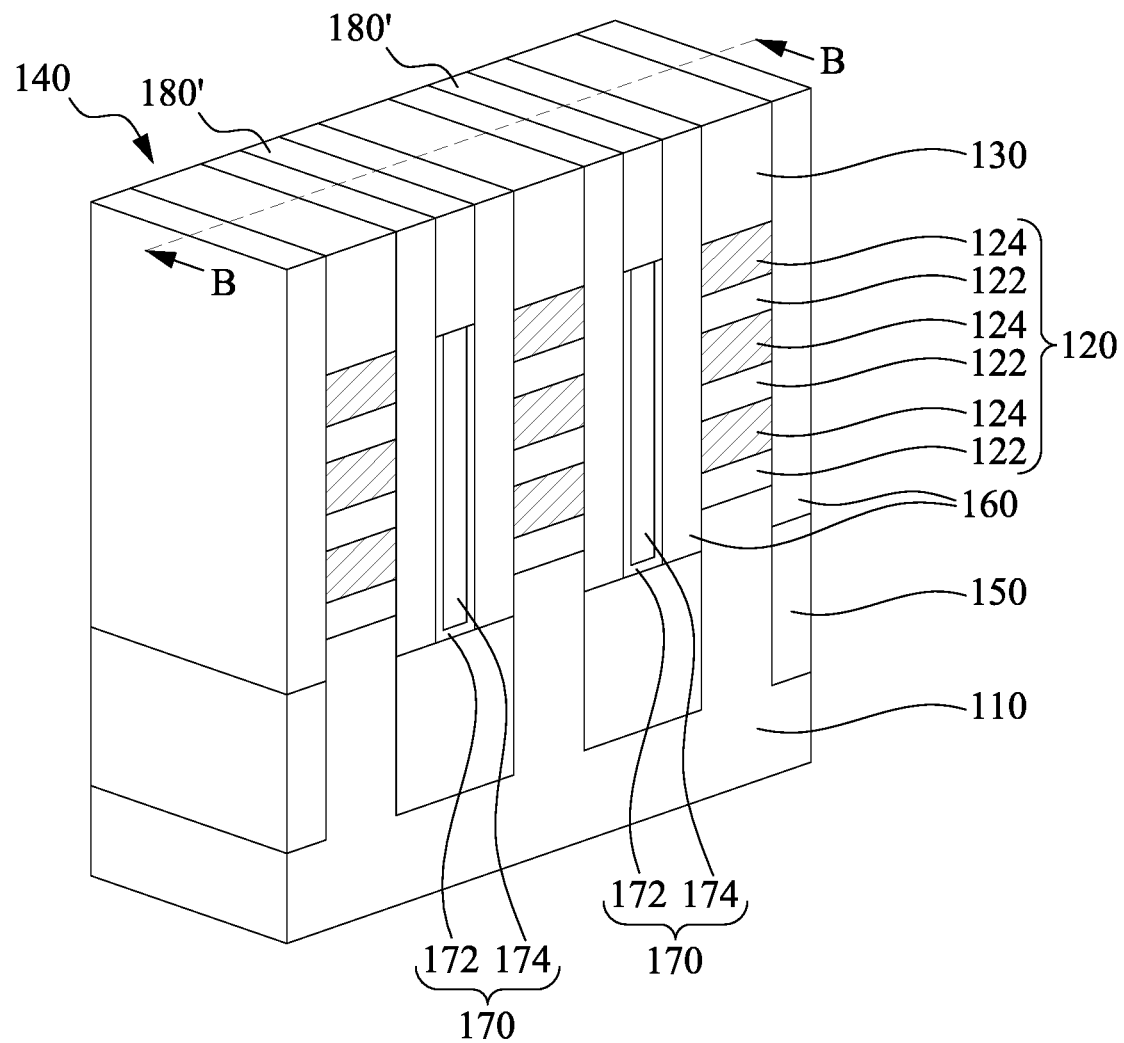
Figure 12B:
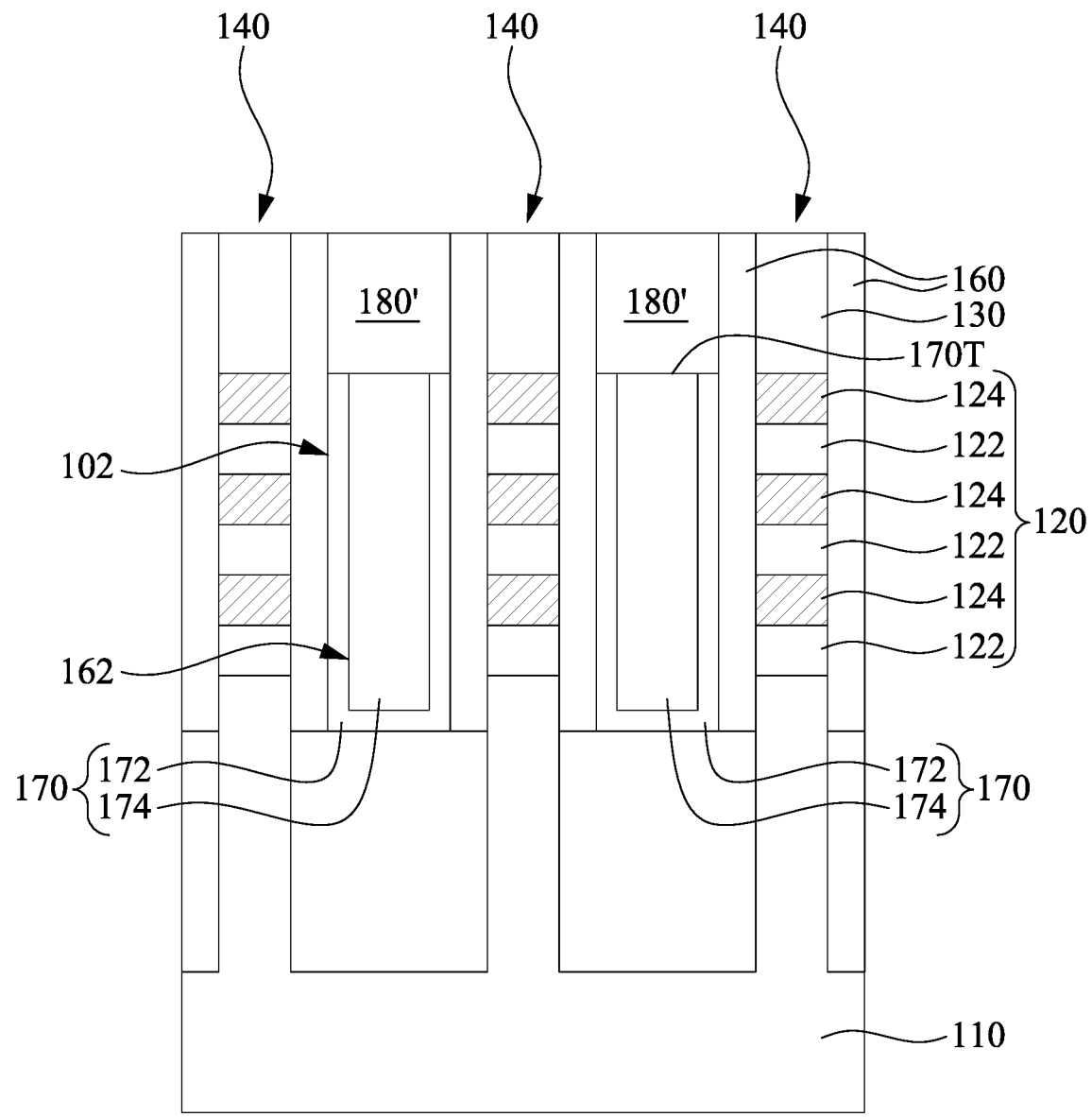

Reference is made to FIGS. 12A and 12B. FIG. 12B is a cross-sectional view taken along a line B-B in FIG. 12A. After the formation of the crystallized hard masks 180', the stress material SM1 is removed from top surfaces of the cap semiconductor layers 130 and the crystallized hard masks 180'. The removal of the stress material SM1 may include suitable etching process, such as wet etching/cleaning, dry etching, or the combination thereof. For example, the wet etching/cleaning process may use a liquid etchant such as diluted Hf or the like. The wet etching/cleaning process may have an etch selectivity between the stress material SM1 and the cap semiconductor layers 130, and an etch selectivity between the stress material SM1 and the crystallized hard mask 180'. In other words, the cap semiconductor layers 130 and the crystallized hard mask 180' may have a higher etch resistance to the etching process than that of the stress material SM1, such that the wet etching/cleaning process may not consume the cap semiconductor layers 130 and the crystallized hard mask 180'.

Figure 13A:
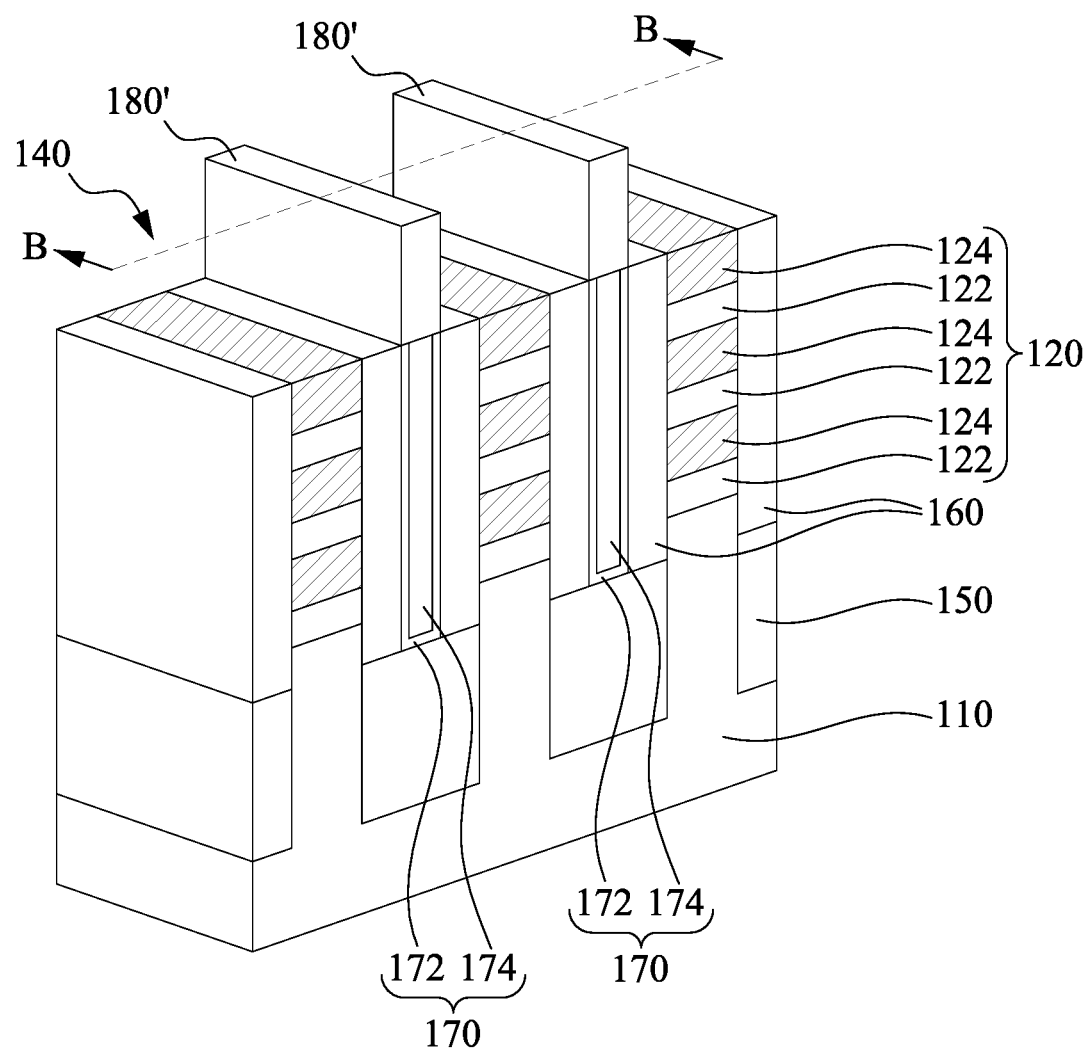
Figure 13B:
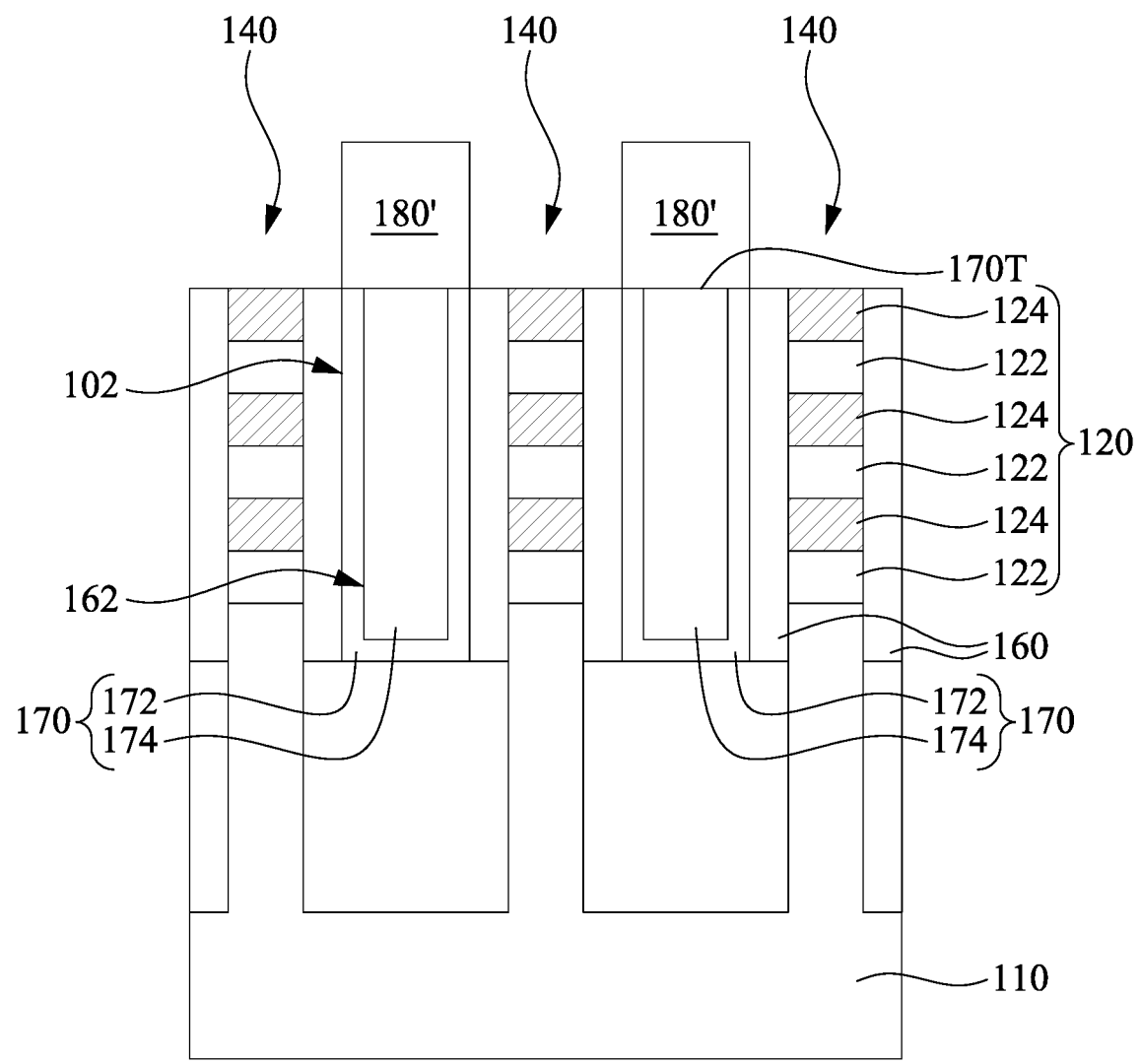

Reference is made to FIGS. 13A and 13B. FIG. 13B is a cross-sectional view taken along a line B-B in FIG. 13A. The cap semiconductor layer 130 and the cladding layers 160 (referring to FIGS. 12A and 12B) may be etched back, such that the cap semiconductor layer 130 (referring to FIGS. 12A and 12B) and portions of the cladding layers 160 above top surfaces of the topmost semiconductor layer 124 are removed. The etching back process may show etch selectivity between the layers 130/160 and the semiconductor layer 124. For example, during the etching back process, an etch rate of the semiconductor layer 124 is less than an etch rate of the cap semiconductor layer 130 (referring to FIGS. 12A and 12B), and an etch rate of the semiconductor layer 124 is less than an etch rate of the cladding layers 160. In some embodiments, the crystallized hard masks 180' may act as an etch stop layer during the etching back process, thereby preventing underlying dielectric fin structures 170 from being etched. The etching back processes include dry etching process, wet etching process, or combinations thereof.

Figure 14:
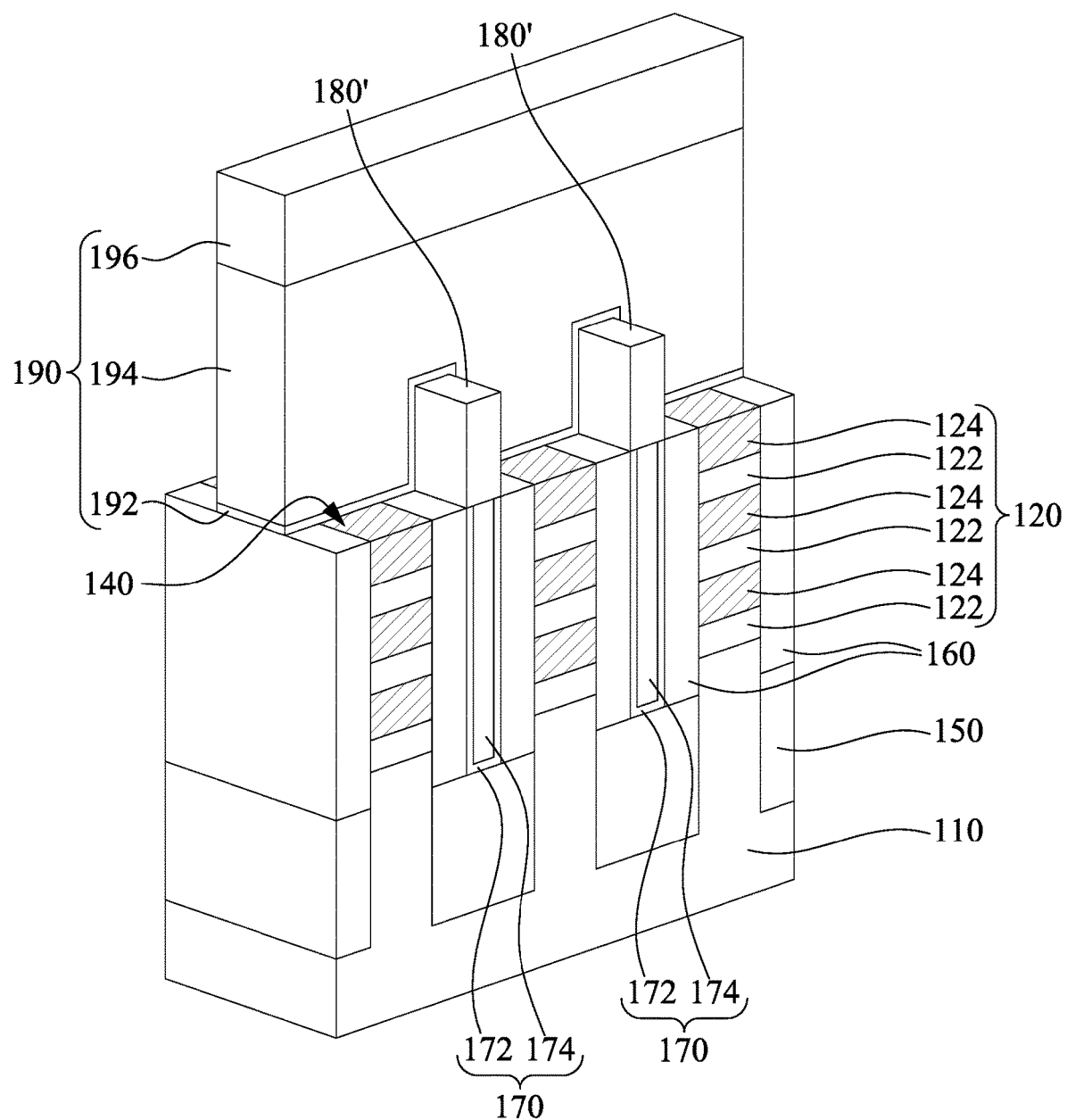

Reference is made to FIG. 14. A gate structure 190 is formed over the structure of FIG. 13A. In some embodiments, the gate structure 190 is a dummy (sacrificial) gate structure that is subsequently removed. Thus, in some embodiments using a gate-last process, the gate structure 190 is a dummy gate structure and will be replaced by the final gate structure at a subsequent processing stage of the integrated circuit structure. In particular, the dummy gate structure 190 may be replaced at a later processing stage by a high-k dielectric layer (HK) and metal gate electrode (MG) as discussed below. While the present discussion is directed to a replacement gate process whereby a dummy gate structure is formed and subsequently replaced, other configurations may be possible.

In some embodiments, the dummy gate structure 190 is formed over the substrate 110 and is at least partially disposed over the fins 140. The portion of the fins 140 underlying the dummy gate structure 190 may be referred to as the channel region. The dummy gate structure 190 may also define a source/drain (S/D) region of the fins 140, for example, the regions of the fin 140 adjacent and on opposing sides of the channel region.

In the illustrated embodiments, a dummy gate dielectric layer 192 is first formed over the fins 130. In some embodiments, the dummy gate dielectric layer 192 may include $SiO_2$, silicon nitride, a high-k dielectric material and/or other suitable material. In various examples, the dummy gate dielectric layer 192 may be deposited by a CVD process, a subatmospheric CVD (SACVD) process, a flowable CVD process, an ALD process, a PVD process, or other suitable process. By way of example, the dummy gate dielectric layer 192 may be used to prevent damages to the fins 140 by subsequent processes (e.g., subsequent formation of the dummy gate structure). Subsequently, other portions of the dummy gate structure 190, including a dummy gate electrode layer 194 and a hard mask 196 which may include multiple layers (e.g., an oxide layer and a nitride layer) are formed. In some embodiments, the dummy gate structure 190 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 194 may include polycrystalline silicon (polysilicon). In some embodiments, the hard mask 196 includes an oxide layer such as a pad oxide layer that may include $SiO_2$, and a nitride layer such as a pad nitride layer that may include $Si_3N_4$ and/or silicon oxynitride. In some embodiments, after patterning the dummy gate electrode layer 194, the dummy gate dielectric layer 192 is removed from the S/D regions of the fins 130. The etch process may include a wet etch, a dry etch, and/or a combination thereof. The etch process is chosen to selectively etch the dummy gate dielectric layer 192 without substantially etching the fins 140, the dummy gate electrode layer 194, and the hard mask 196.

Figure 15:
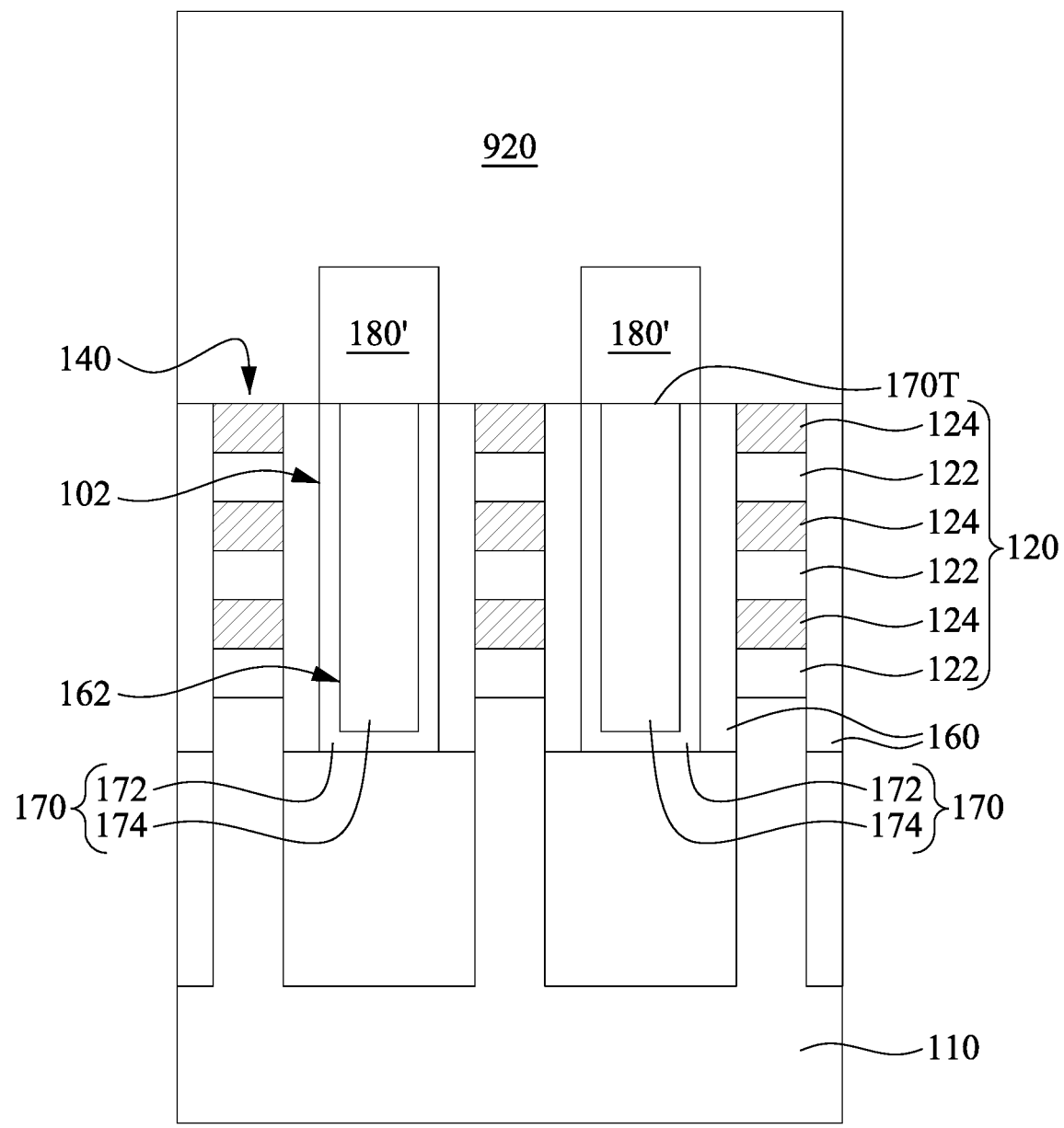

Reference is made to FIG. 15. A mask layer 920 is coated over a top surface of the structure of FIG. 14. The mask layer 920 may include a bottom anti-reflection coating (BARC). The BARC may be inorganic or organic (e.g., a polymer resin with photo compounds).

Figure 16:
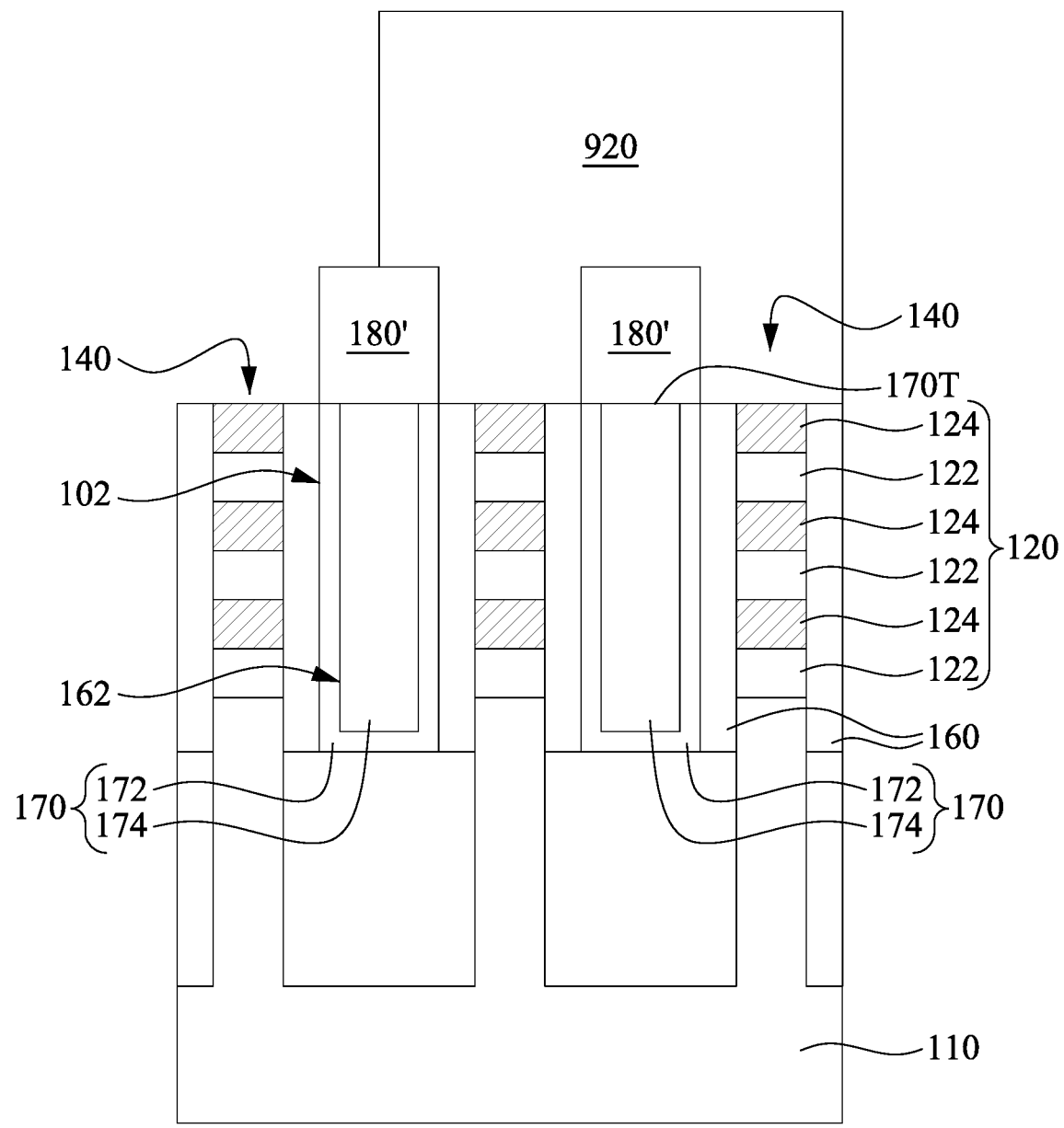

Reference is made to FIG. 16. The mask layer 920 is patterned by suitable lithography process. For example, the lithography process (e.g., photolithography or e-beam lithography) may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. A portion of the mask layer 920 uncovered by the photoresist is removed by suitable methods, such that the mask layer 920 exposes tops of some of the fins 140 and the cladding layers 160 after the patterning process.

Figure 17:
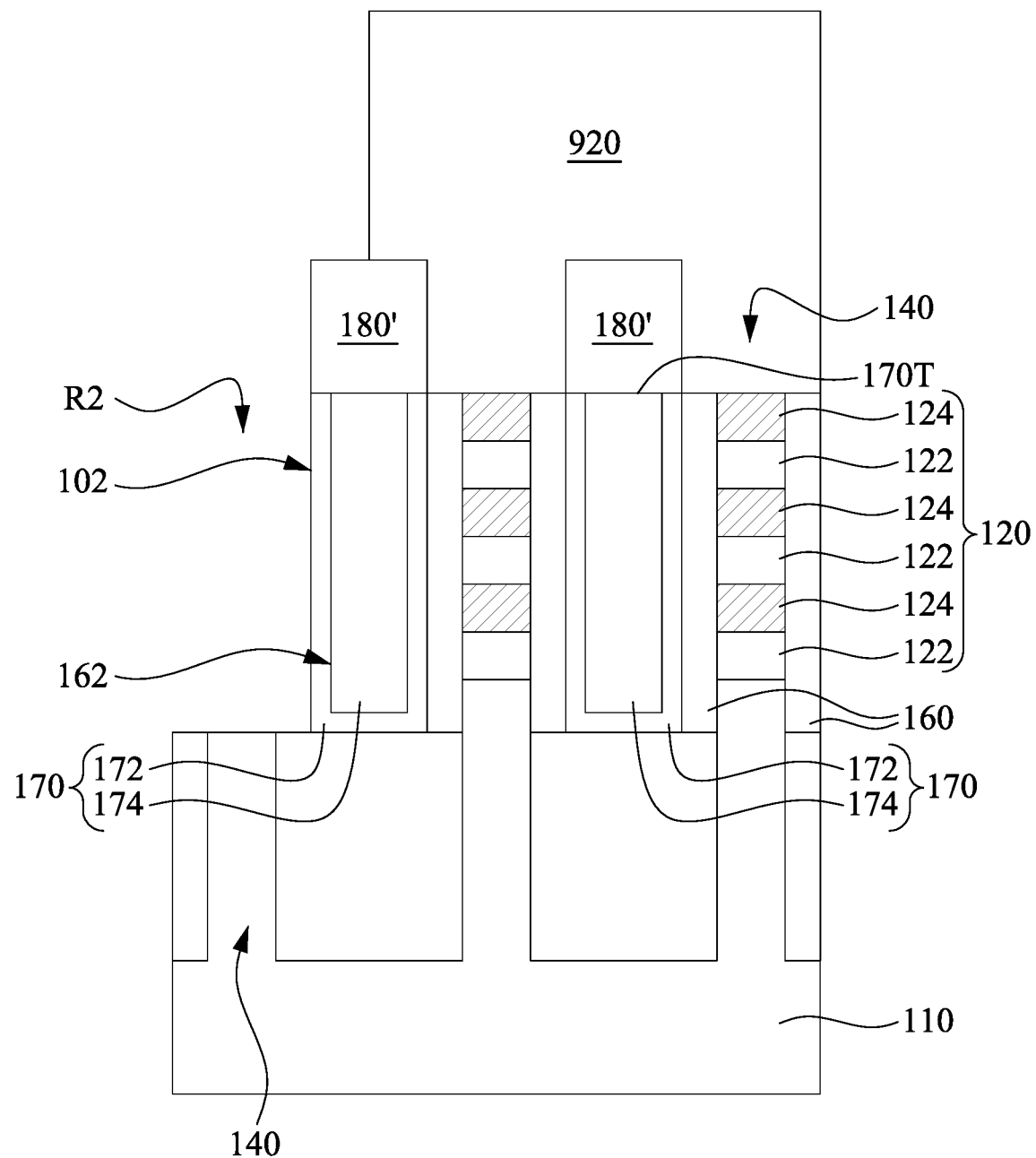

Reference is made to FIG. 17. One or plural etching process is performed to remove the epitaxial stack 120 of the exposed fin 140 and the cladding layers 160, thereby forming recesses R2 between the dielectric fin structures 170. The crystallized hard masks 180' may serve as a etch mask, such that the removal of the epitaxial stack 120 and the cladding layers 160 is performed with a self-aligned patterning process. The patterning process may include dry etch and wet etch process.

Figure 18:
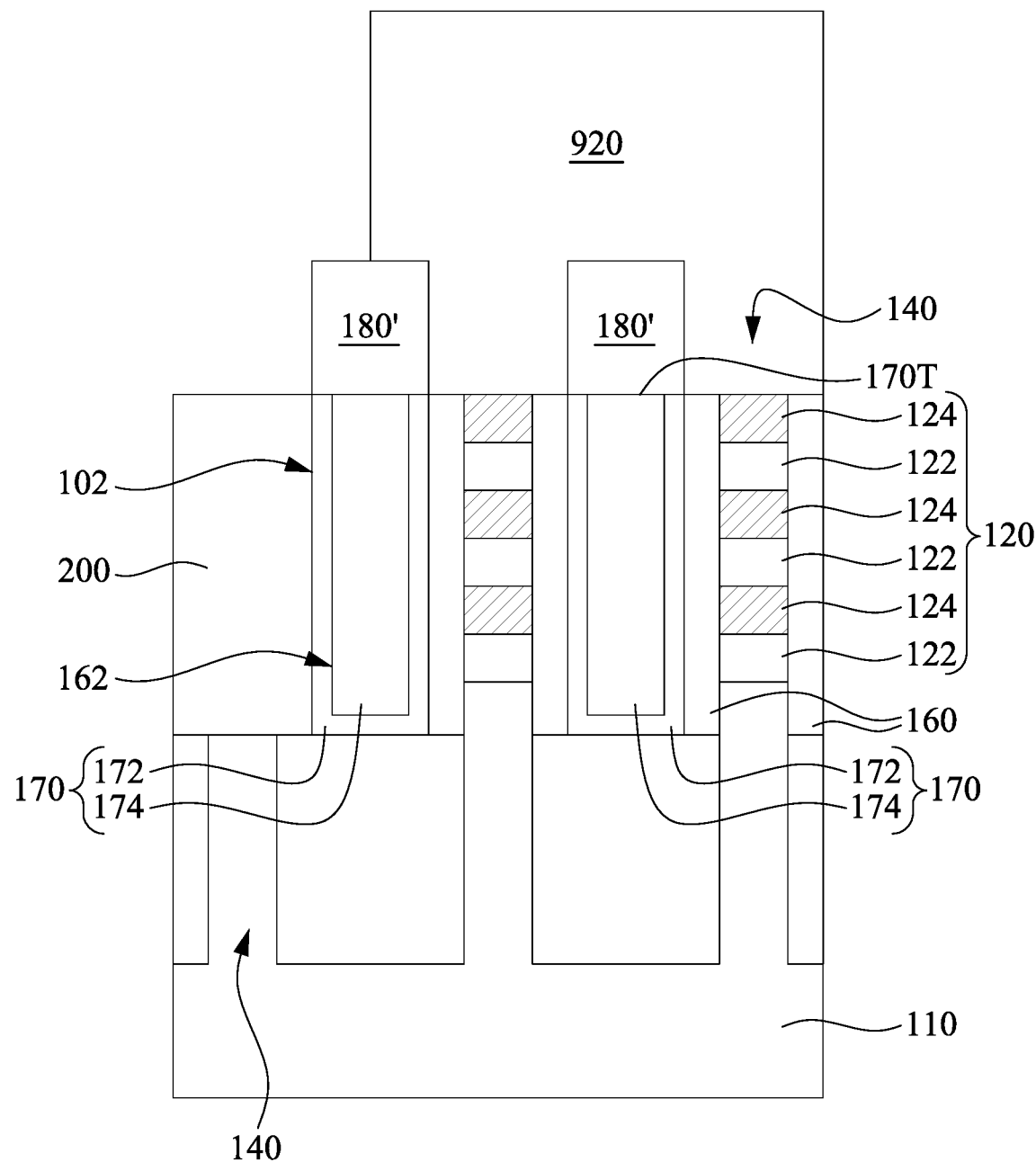
Figure 19:
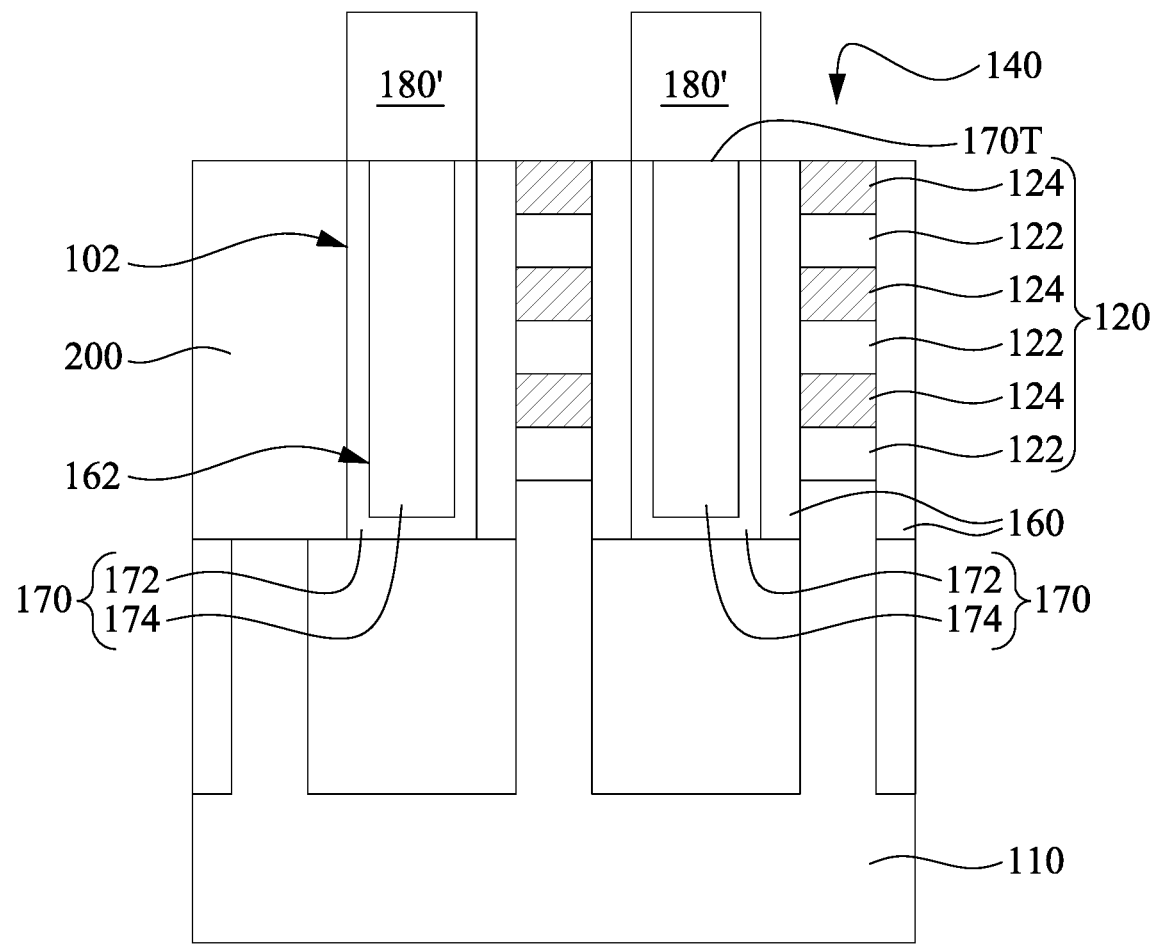

Reference is made to FIG. 18. One or plural epitaxial structures 200 are formed on the remaining portion of the fins 140. In some embodiments, semiconductor materials are deposited on top surfaces of the remaining fins 140, thereby forming the epitaxial structures 200. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). In some embodiments, the epitaxial structures 200 may be referred to as source/drain epitaxial structures. In some embodiments, where an N-type device is desired, the epitaxial structures 200 may include an epitaxially grown silicon phosphorus (SiP) or silicon carbon (SiC). In some embodiments, where a P-type device is desired, the epitaxial structures 200 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation process, gas and/or solid source diffusion process, other suitable process, or combinations thereof. After the formation of the epitaxial structures 200, referring to FIG. 19, the mask layer 920 may be removed by suitable methods, such as, for example, wet strip or plasma ashing method.

Figure 20:
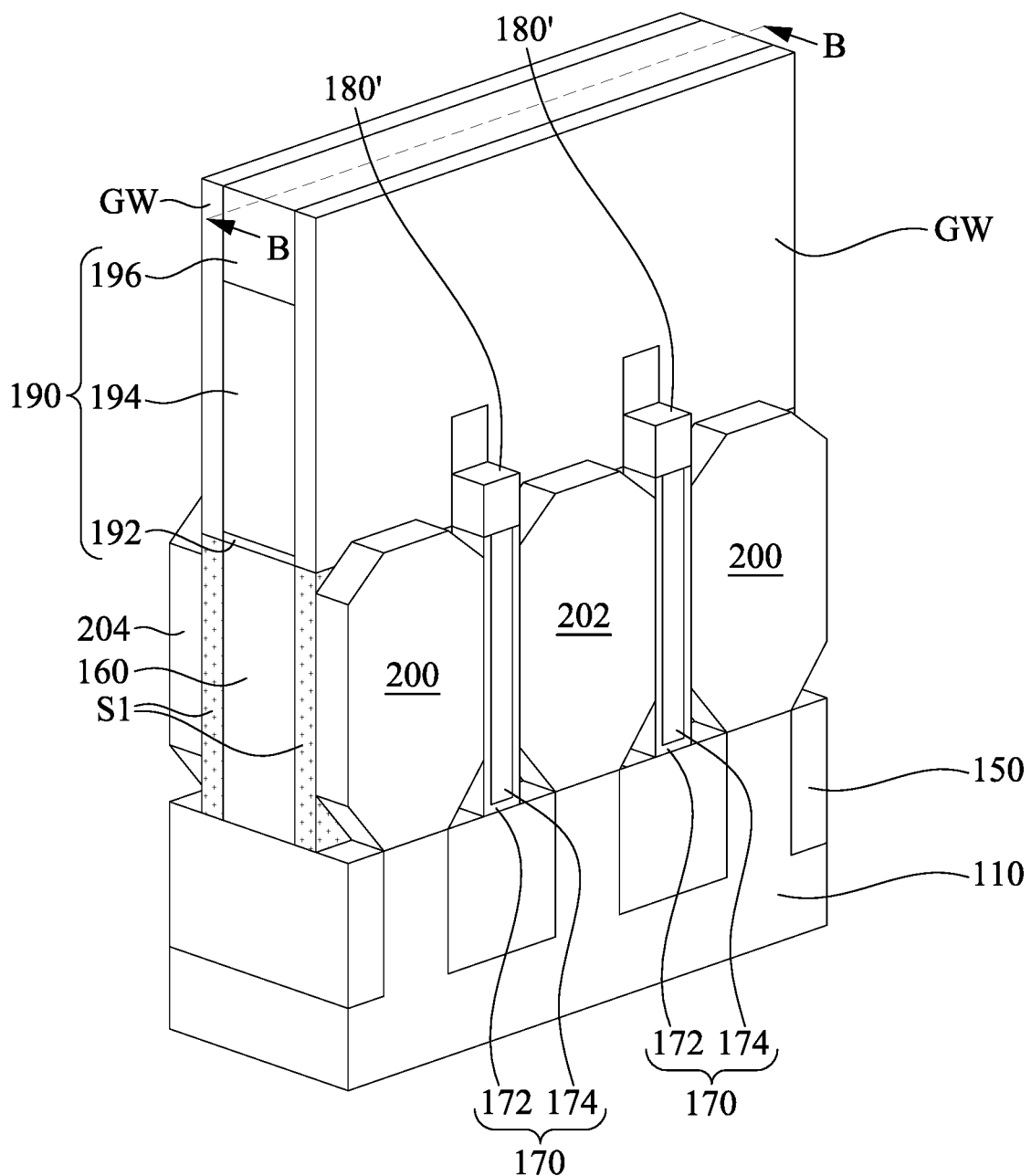

Reference is made to FIG. 20. Plural epitaxial structures 202 and 204 can be formed by processes similar to those shown in FIGS. 15-19. For example, formation of the epitaxial structures 202 and 204 may include self-align patterning and the deposition of semiconductor materials. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). In some embodiments, the epitaxial structures 202 and 204 may be referred to as source/drain epitaxial structures. In some embodiments, where an N-type device is desired, the epitaxial structures 202 and 204 may include an epitaxially grown silicon phosphorus (SiP) or silicon carbon (SiC). In some embodiments, where a P-type device is desired, the epitaxial structures 200 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation process, gas and/or solid source diffusion process, other suitable process, or combinations thereof.

In some embodiments, prior to the formation of the epitaxial structures 200-204, gate spacers GW are formed on opposite sidewalls of the gate structure 190. In some embodiments, inner spacers S1 may be formed after etching the recesses R2 and prior to depositing the epitaxial structure 200. The gate spacers GW and the inner spacers S1 may include suitable dielectric material, such as silicon nitride, silicon oxynitride, or the like.

Figure 21:
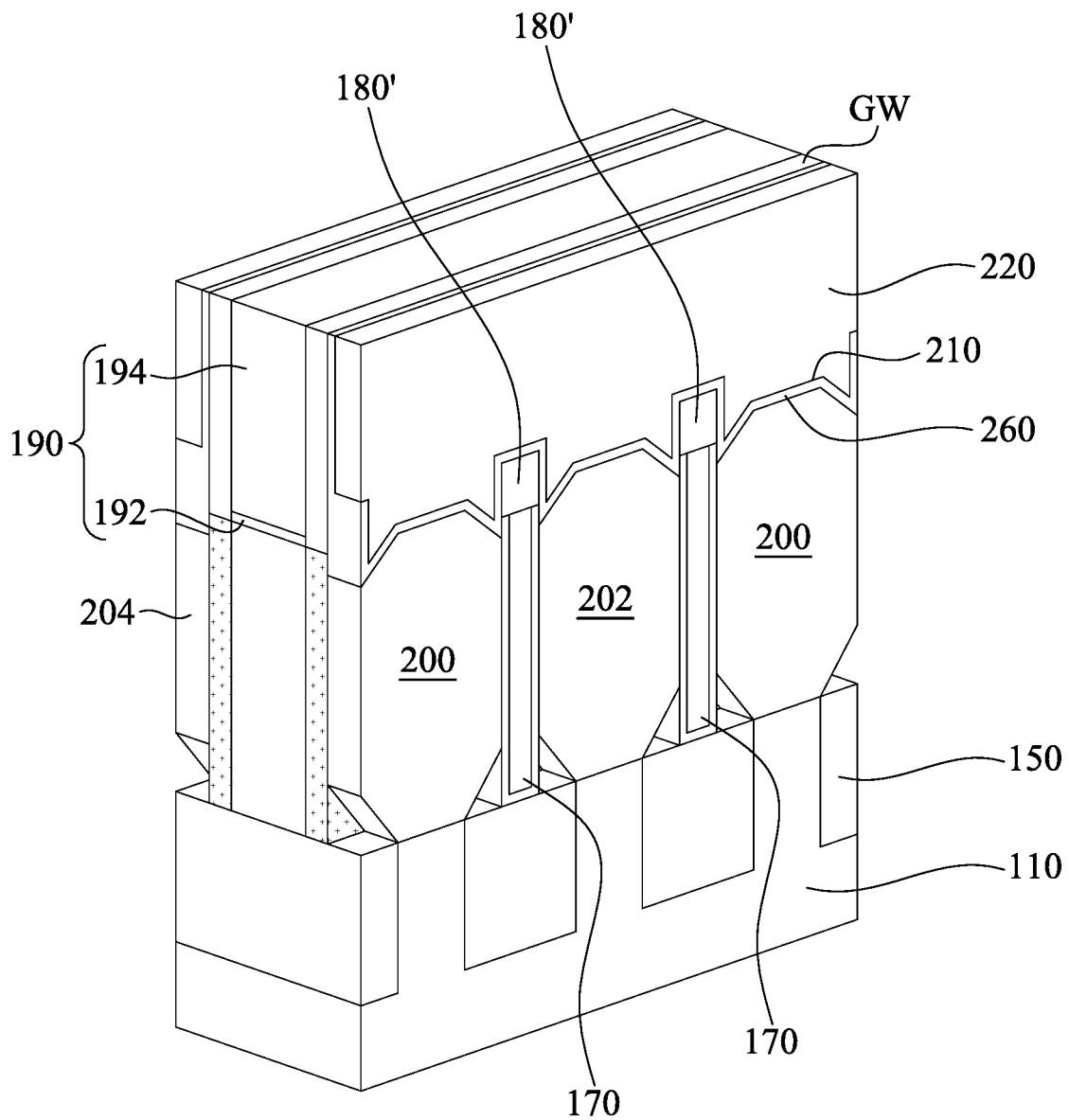

Reference is made to FIG. 21. A contact etch stop layer (CESL) 210 is conformally formed over the structure of FIG. 20. In some embodiments, the CESL 210 can be a stressed layer or layers. In some embodiments, the CESL 210 has a tensile stress and is formed of $Si_3N_4$. In some other embodiments, the CESL 210 includes materials such as oxynitrides. In yet some other embodiments, the CESL 210 may have a composite structure including a plurality of layers, such as a silicon nitride layer overlying a silicon oxide layer. The CESL 210 can be formed using plasma enhanced CVD (PECVD), however, other suitable methods, such as low pressure CVD (LPCVD), atomic layer deposition (ALD), and the like, can also be used.

An interlayer dielectric (ILD) 220 is then formed on the CESL 210. The ILD 220 may be formed by chemical vapor deposition (CVD), high-density plasma CVD, spin-on, sputtering, or other suitable methods. In some embodiments, the ILD 220 includes silicon oxide. In some other embodiments, the ILD 220 may include silicon oxy-nitride, silicon nitride, compounds including Si, O, C and/or H (e.g., silicon oxide, SiCOH and SiOC), a low-k material, or organic materials (e.g., polymers). After the ILD 220 is formed, a planarization operation, such as CMP, is performed, so that the hard mask 196 (see FIG. 20) are removed and the dummy gate electrode layer 194 is exposed.

Figure 22A:
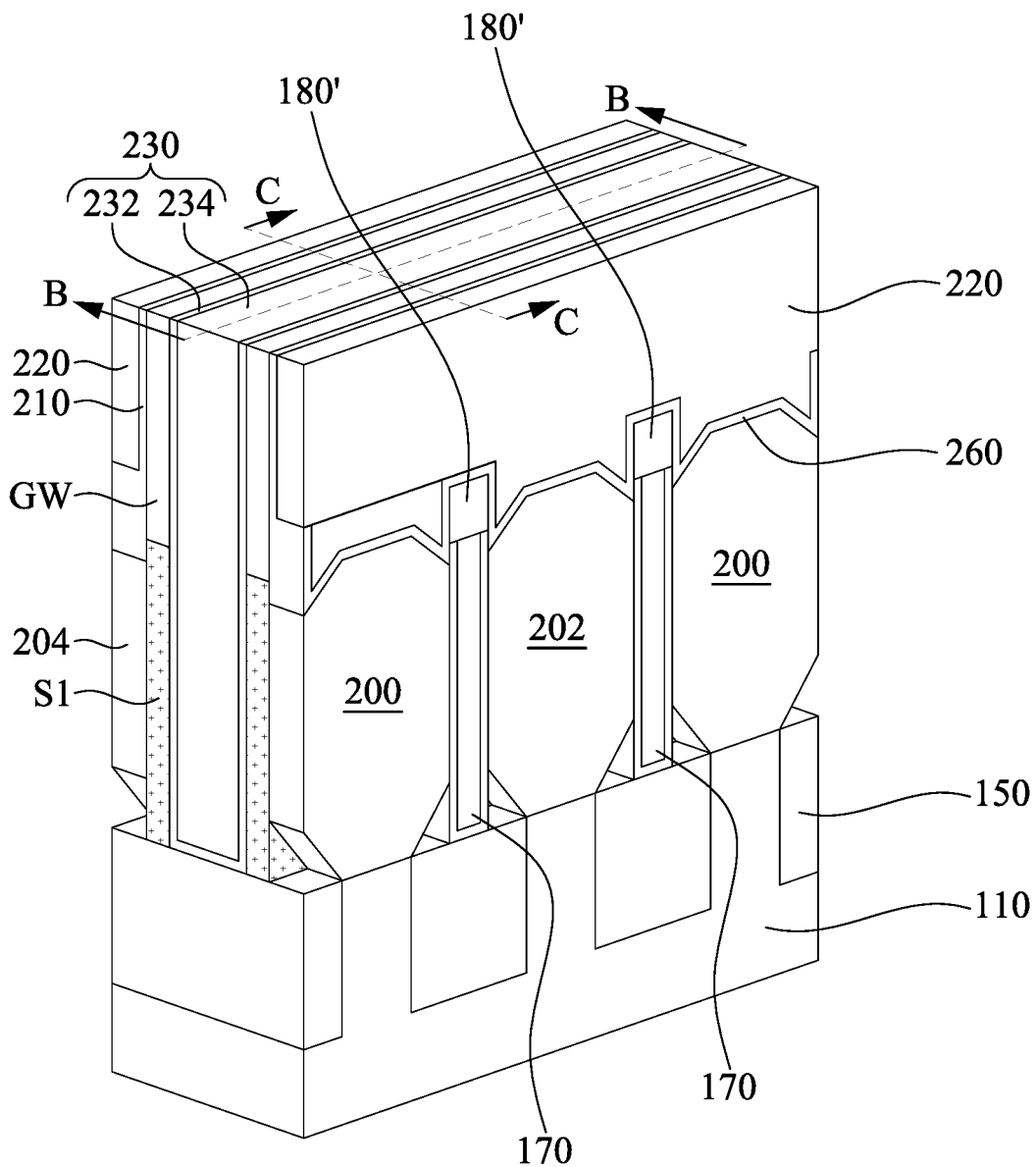
Figure 22B:
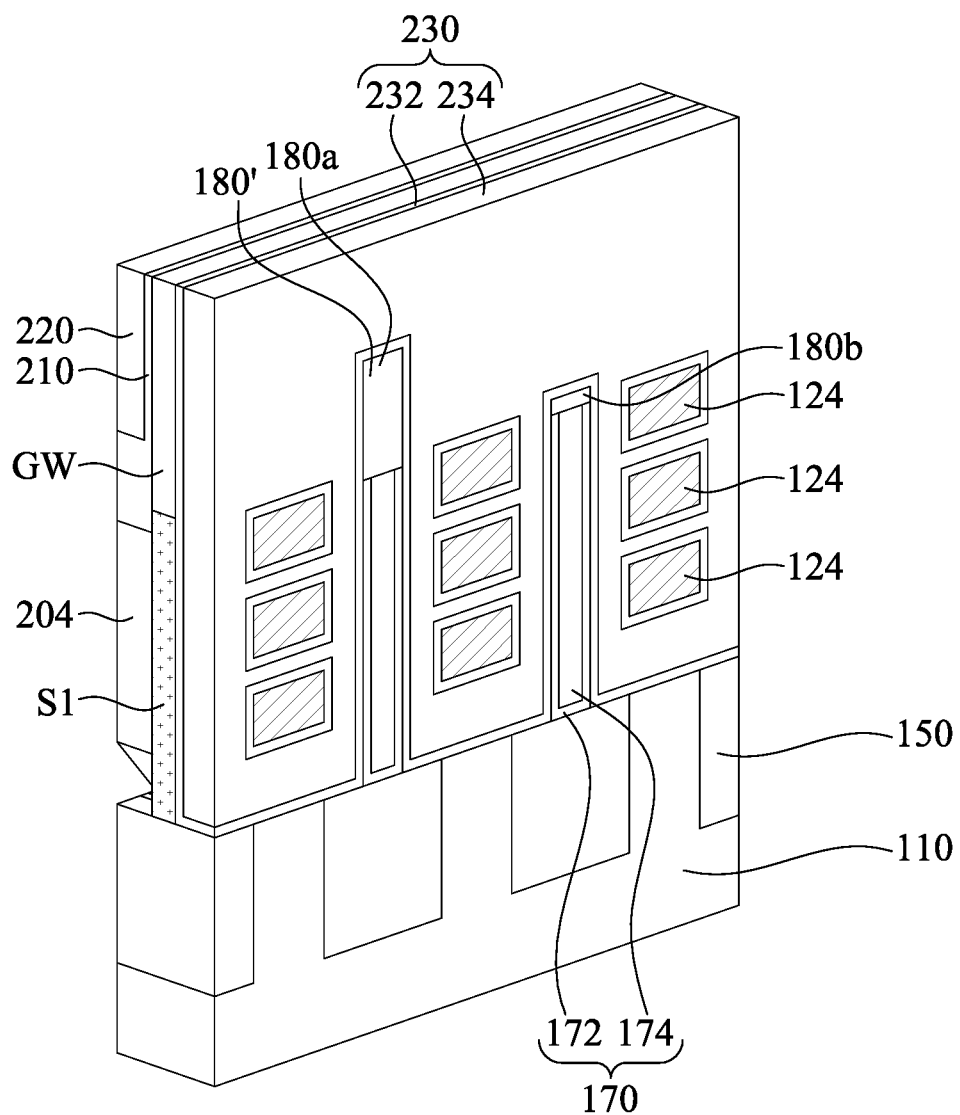
Figure 22C:
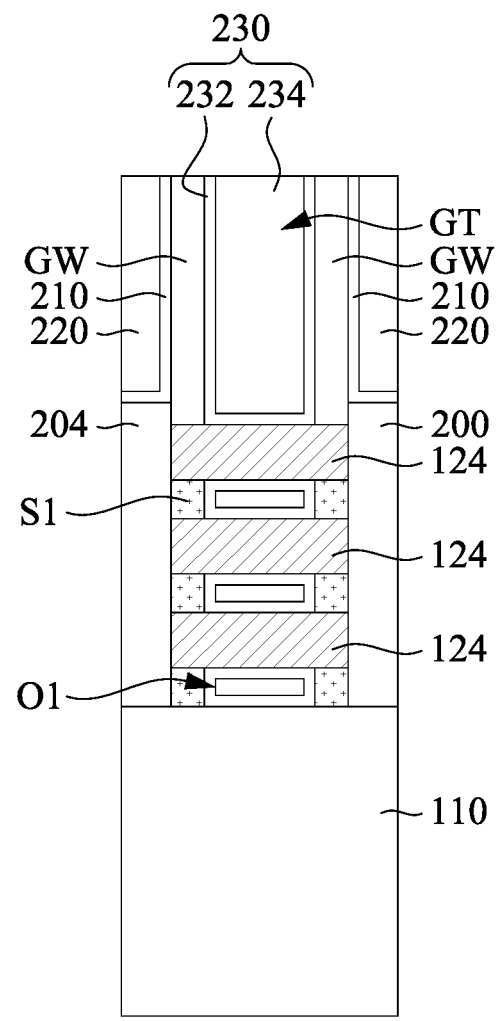

Reference is made to FIGS. 22A-22C. FIG. 22B is a cross-sectional view taken along line B-B in FIG. 22A. FIG. 22C is a cross-sectional view taken along line C-C in FIG. 22A. The dummy gate structure 190 is removed to form a gate trench GT between the gate spacers GW. Subsequently, the semiconductor layers 122 are removed to form openings O1 between the semiconductor layers 124. Then, a gate structure 230 is formed in the gate trench GT between the gate spacers GW and the openings O1 between the semiconductor layers 124. The gate structure 230 includes a gate dielectric layer 232 and a gate electrode 234 over the gate dielectric layer 232.

The gate dielectric layer 232 may include an interfacial layer (e.g., silicon oxide layer) and a high-k dielectric layer conformally formed over the interfacial layer. The high-k dielectric layer may include a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials.

The gate electrode 234 may include a work function metal layer and a filling metal over the work function metal layer. The work function metal layer is conformally formed on the gate dielectric layer 232, and the work function metal layer surrounds the semiconductor layers 134 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process. The filling metal may fill the remained space between the gate spacers GW and between the inner sidewall spacers S1 (e.g., the gate trench GT and the openings O1). After the deposition of the gate dielectric layer 232 and the gate electrode 234, a planarization process, such as a CMP process, may be then performed to remove excess portions of the gate dielectric layer 323 and the gate electrode 234 to form the gate structure 230.

In some embodiments, some of the crystallized hard masks 180' in the gate trench GT are recessed prior to the formation of the gate structure 230. For clear illustration, the two crystallized hard masks 180' are labelled as crystallized hard mask 180a and 180b. For example, during or after the removal of the dummy gate structure 190 (referring to FIG. 19), a portion of the crystallized hard mask 180b in the gate trench GT is recessed by suitable lithography process and etching process, while the crystallized hard mask 180a in the gate trench GT is not substantially recessed. As a result, a top surface of the crystallized hard mask 180a is higher than a top surface of the crystallized hard mask 180b.

Figure 23A:
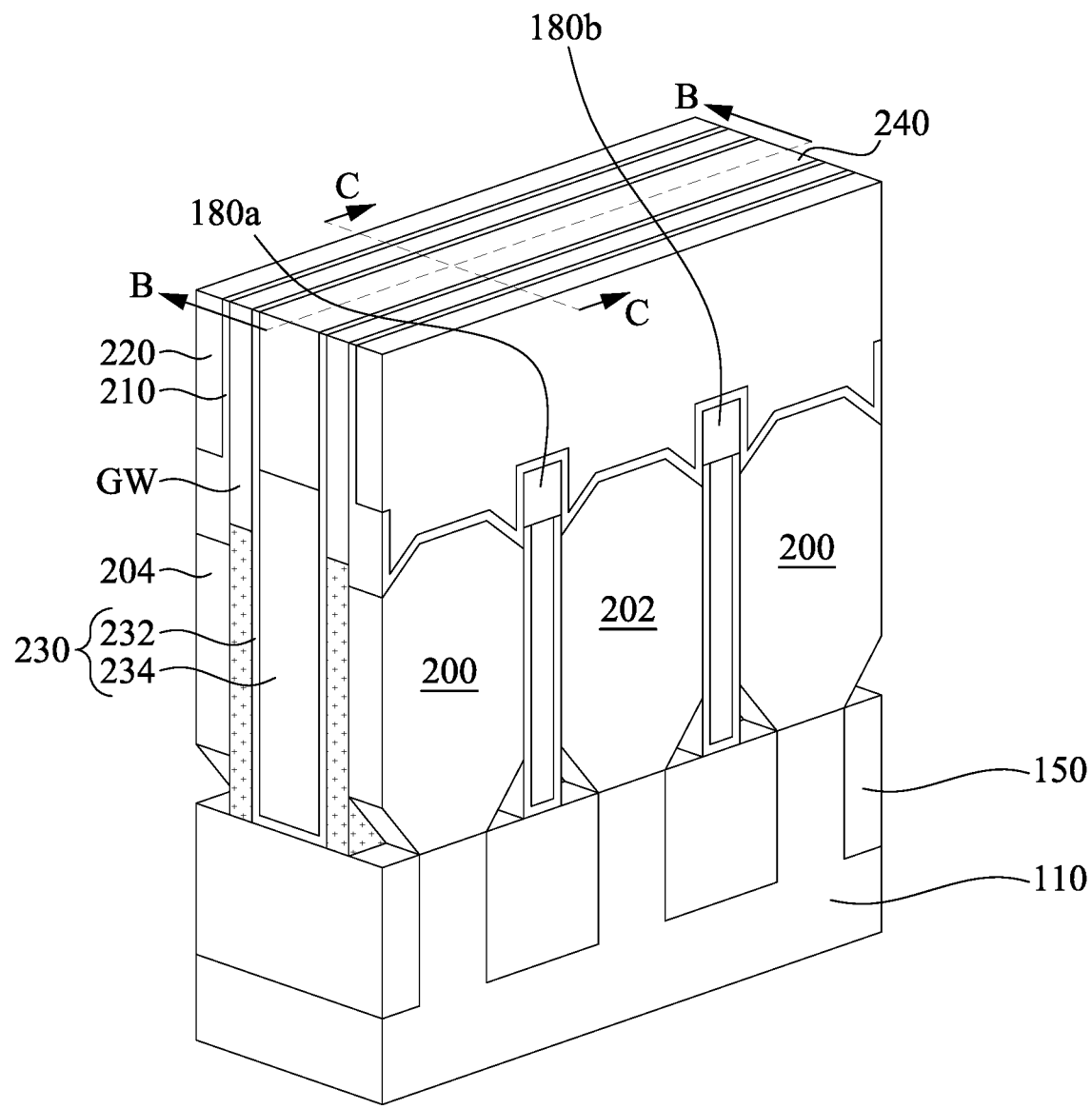
Figure 23B:
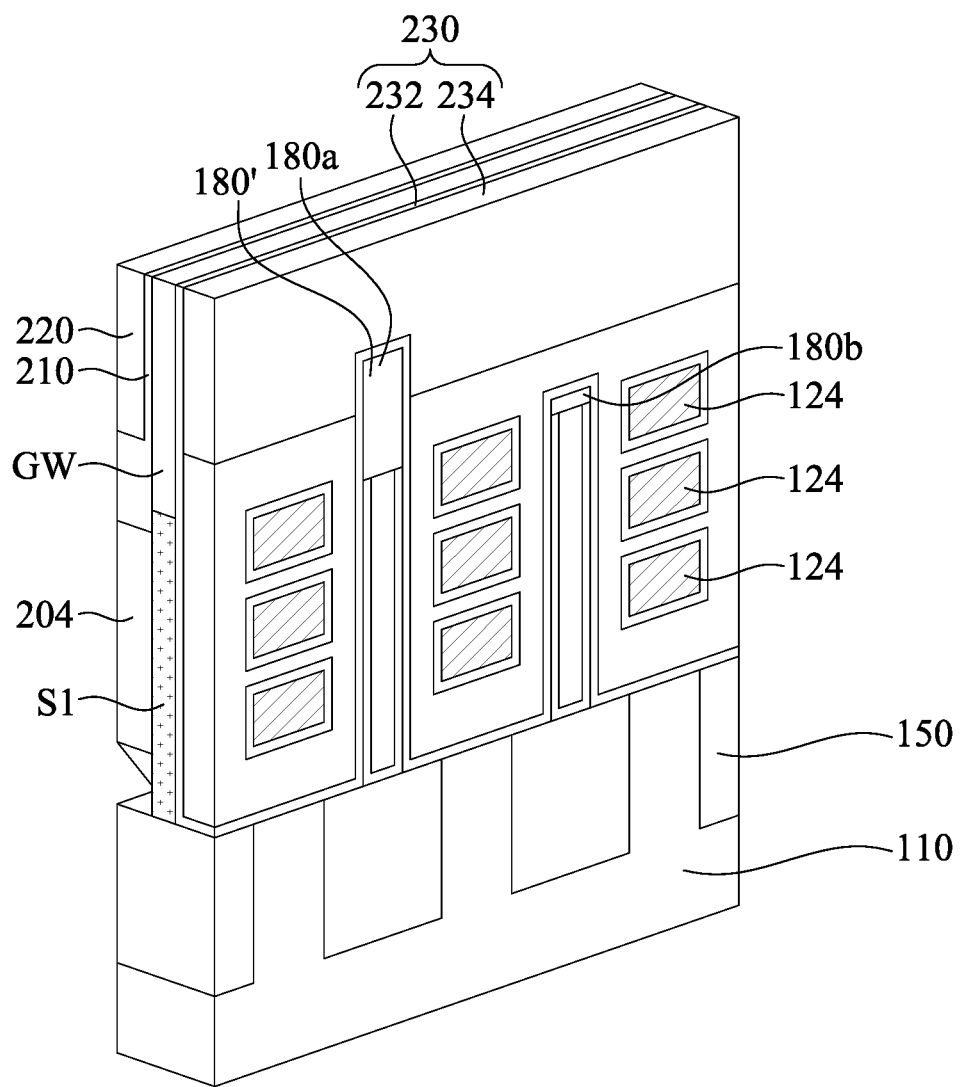
Figure 23C:
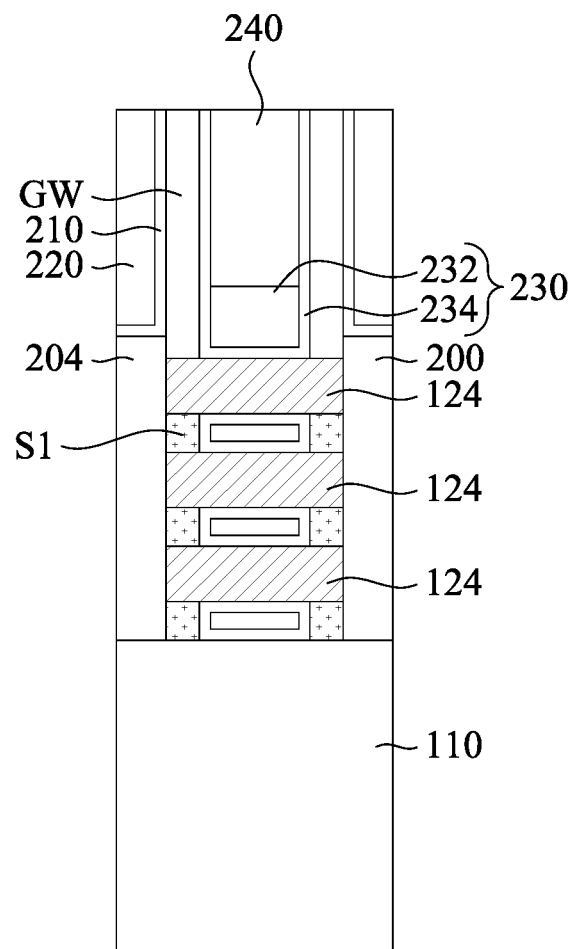

Reference is made to FIGS. 23A-23C. FIG. 23B is a cross-sectional view taken along line B-B in FIG. 23A. FIG. 23C is a cross-sectional view taken along line C-C in FIG. 23A. In some embodiments, the gate electrode 234 of the gate structure 230 is etched back to a predetermined level and form a gate trench thereon. As such, a portion of the crystallized hard mask 180a protrudes from the gate electrode 234 while the crystallized hard mask 180b is embedded in the gate electrode 234. Then, a capping layer 240 is formed over the etched gate electrode 234 using, for example, a deposition process to deposit a dielectric material over the substrate 110, followed by a CMP process to remove excess dielectric material outside the gate trenches. In some embodiments, the capping layer 240 includes silicon nitride, silicon oxide, silicon oxynitride, SiCN, SiCON, SiOC, or other suitable dielectric material. By way of example, if the capping layer 240 is SiN, the spacer GW and/or the ILD 220 are dielectric materials different from SiN. The capping layer 240 can be used to define self-aligned contact region and thus referred to as SAC structures or a SAC layer. The capping layer 240 is in contact with the gate dielectric layer 232, and a portion of the crystallized hard mask 180a is embedded in the capping layer 240.

Figure 24:
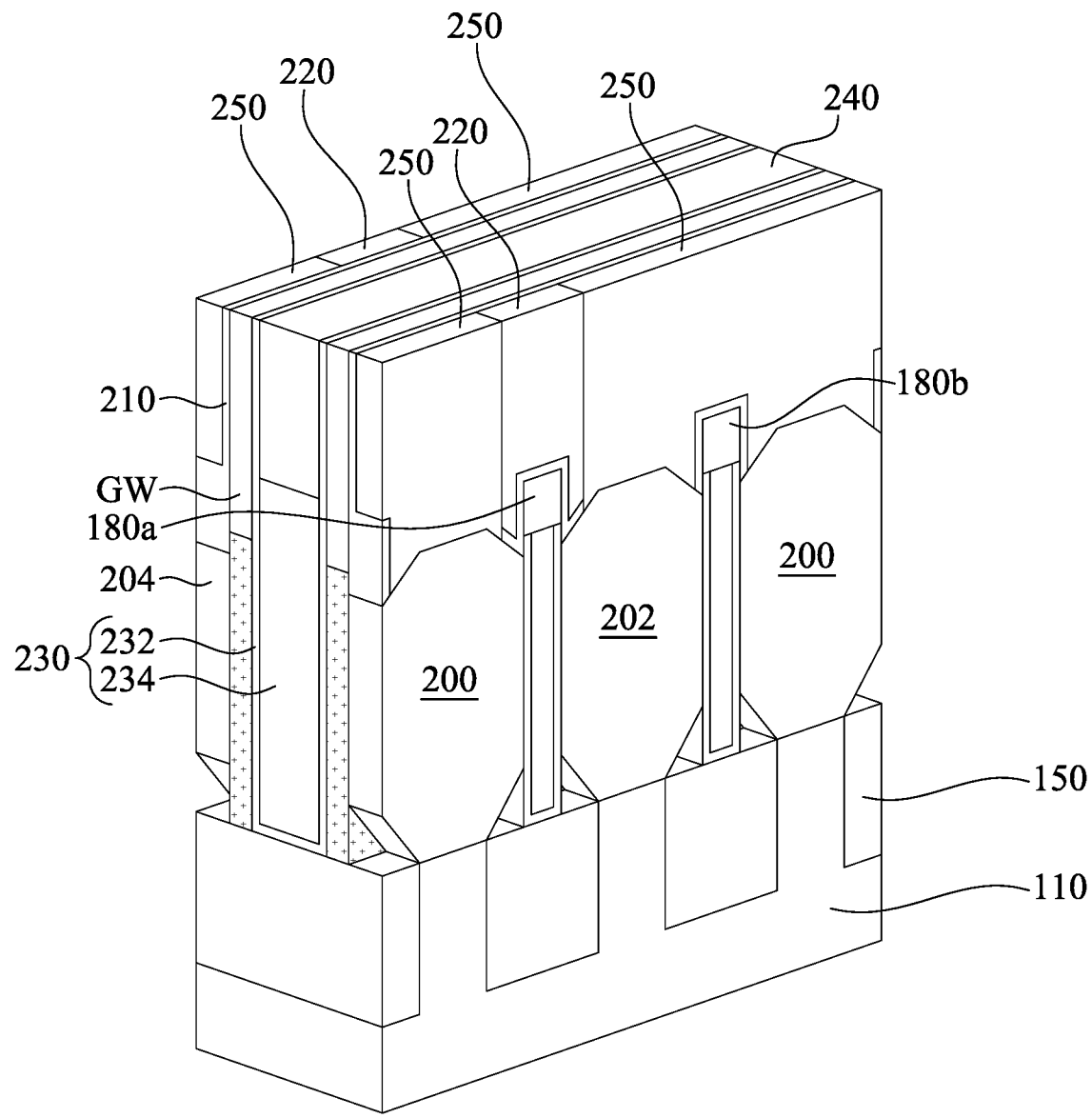

Reference is made to FIG. 24. The ILD 220 is patterned to form trenches on opposite sides of the gate structure 230 and the capping layer 240, and then the CESL 210 is patterned to expose the epitaxial structures 200-204. In some embodiments, multiple etching processes are performed to pattern the ILD 220 and the CESL 210. The etching processes include dry etching process, wet etching process, or combinations thereof.

Contacts 250 are formed in the trenches in the ILD 220 and the CESL 210. As such, the contacts 250 are in contact with the epitaxial structures 200-204. Some of the contacts 250 may interconnects the adjacent epitaxial structures 200-204. In some embodiments, the contacts 250 may be made of metal, such as W, Co, Ru, Al, Cu, or other suitable materials. After the deposition of the contacts 250, a planarization process, such as a chemical mechanical planarization (CMP) process, may be then performed. As such, a top surface of the contacts 250 and a top surface of the contacts 250 are substantially coplanar. In some embodiments, metal alloy layers (such as silicide) may be formed between the contacts 250 and the epitaxial structures 200-204. Further, barrier layers may be formed in the trenches in the ILD 220 and the CESL 210 before the formation of the contacts 250. The barrier layers may be made of TiN, TaN, or combinations thereof.

FIGS. 25A-25E illustrate a method for manufacturing a crystallized hard mask (e.g., the crystallized hard mask 180' in FIGS. 12A and 12B) in a semiconductor device at various stages in accordance with some embodiments of the present disclosure. The present embodiments are similar to the embodiments illustrated in FIG. 7A-7C, except that a compressive stress material SM2 is used to create a compressive stress field over the metal-containing compound material 180 in the present embodiments.

Figure 25A:
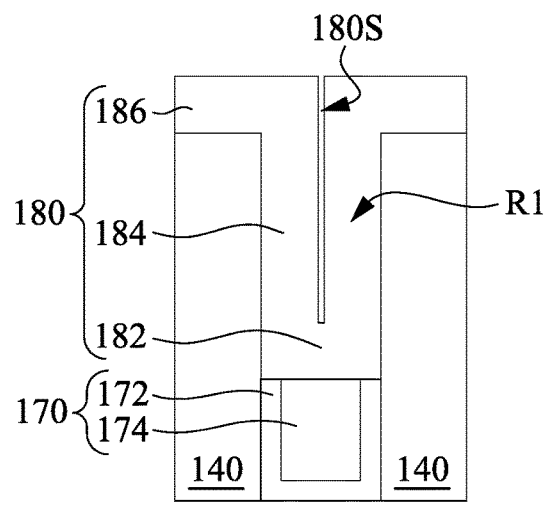
FIGS. 25A-25E illustrate a method for manufacturing a crystallized hard mask in a semiconductor device at various stages in accordance with some embodiments of the present disclosure.
Figure 25B:
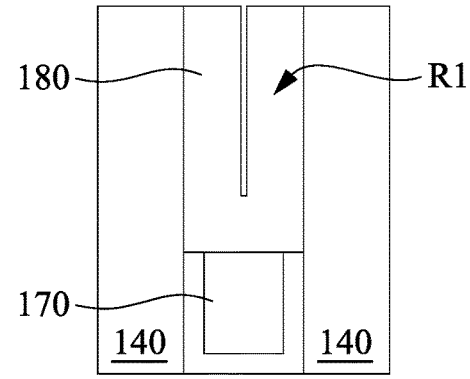

Referring to FIGS. 25A and 25B, as illustrated previously, a metal-containing compound material 180 is conformally deposited into the recess R1 and over the top surfaces of the semiconductor fins 140, and then a planarization process (e.g., a CMP process) is performed, thereby removing portions of the metal-containing compound material 180 out of recesses R1 (e.g., the top portion 186). In some embodiments, the deposited metal-containing compound material 180 may be in amorphous state.

Figure 25C:
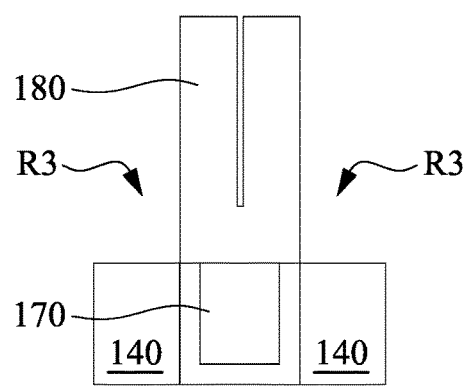

Referring to FIG. 25C, the semiconductor fins 140 are recessed by suitable etching back process. For example, a recess R3 is formed over the remaining semiconductor fins 140 and surrounding the metal-containing compound material 180. The etching back process may include suitable dry etch process. The metal-containing compound material 180 may have a higher etch resistance to the etching back process than that of the semiconductor fins 140, such that the metal-containing compound material 180 remains substantially intact.

Figure 25D:
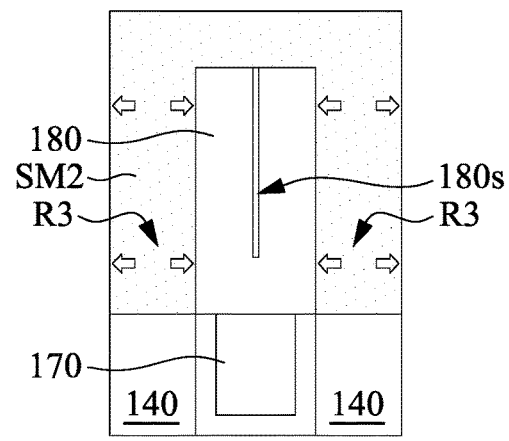

Referring to FIG. 25D, a stress material SM2 is deposited into the recess R3 and over the metal-containing compound material 180. The stress material SM2 may surround the metal-containing compound material 180 and overfill the recess R3. In some embodiments, material of the stress material SM2 is selected to create a high compressive stress field to the metal-containing compound material 180. For example, the stress material SM2 include silicon, SiGe, SiC, or the like.

Figure 25E:
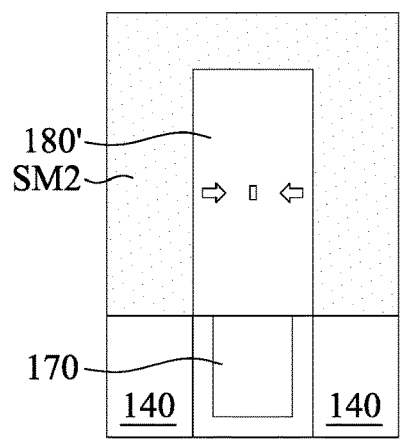

Referring to FIG. 25E, an annealing process is performed to induce crystallization in the metal-containing compound material 180, such that the metal-containing compound material 180 is converted from amorphous to crystalline. In some embodiments, the annealing process may also induce the merge of the side portions 184 (referring to FIG. 25A), such that the slit 180S (referring to FIG. 25D) may disappear. After the annealing process, the metal-containing compound material 180 is referred to as crystallized hard masks 180'.

In some embodiments, the annealing process may be performed with an environment containing $H_2O$, $O_2$, or other oxide-containing gas, such that the annealing process may cause oxidation of the stress material SM2 (referring to FIG. 25D). The stress material SM2 (referring to FIG. 25D) is referred to as oxidized stress material SM2' after being oxidized. The oxidation may increase the size of the material. For example, the volume of the oxidized stress material SM2' may be greater than that of the stress material SM2 (referring to FIG. 25D). Therefore, the oxidized stress material SM2' may show a larger compressive stress to the metal-containing compound material 180 than that of the stress material SM2 (referring to FIG. 25D). For example, in some embodiments where the stress material SM2 includes Si, the annealing process is performed such that the Si stress material SM2 is converted to SiOCN.

In some embodiments of the present disclosure, since the stress material SM2' may create a high compressive stress field to opposite sides of the metal-containing compound material 180, driving forces from the external compressive stress is exerted on the metal-containing compound material 180 when the side portions 184 are merged during annealing process. Through the configuration, the crystallized hard masks 180' may have less or no seam/void.

In some embodiments, the method shown in FIGS. 25A-25E is applied to the structure of FIG. 6B, thereby forming crystallized hard masks 180' over the structure of FIG. 6B, which are illustrated in the embodiments of FIGS. 26-31 below.

FIGS. 26-31 illustrate a semiconductor device at various stages of manufacturing in accordance with some embodiments of the present disclosure. It is understood that additional operations may be provided before, during, and after the operations shown by FIGS. 26-31, and some of the operations described below can be replaced or eliminated for additional embodiments of the method. The order of the operations/processes may be interchangeable.

Figure 26:
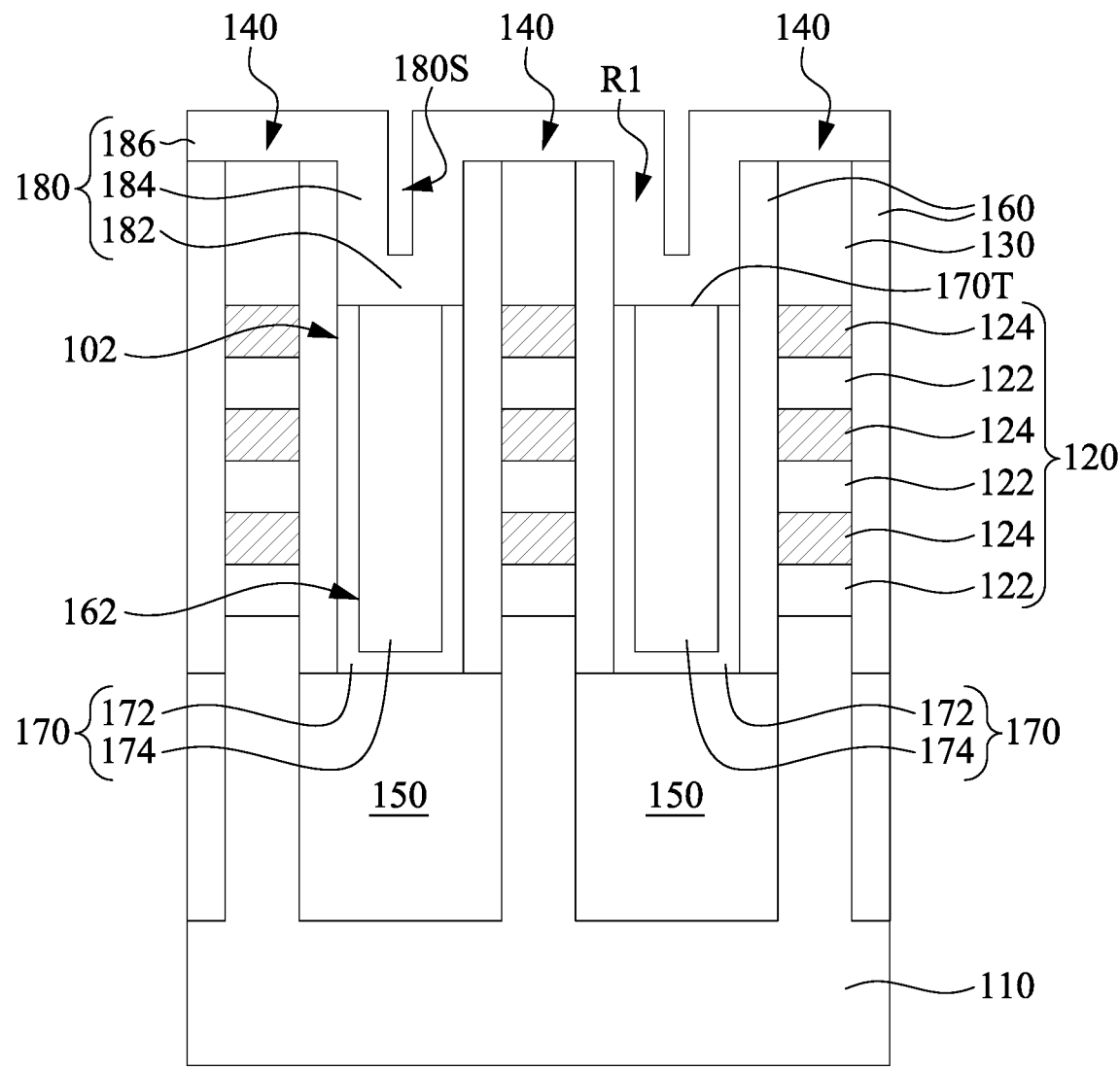
FIGS. 26-31 illustrate a semiconductor device at various stages of manufacturing in accordance with some embodiments of the present disclosure.
Figure 27:
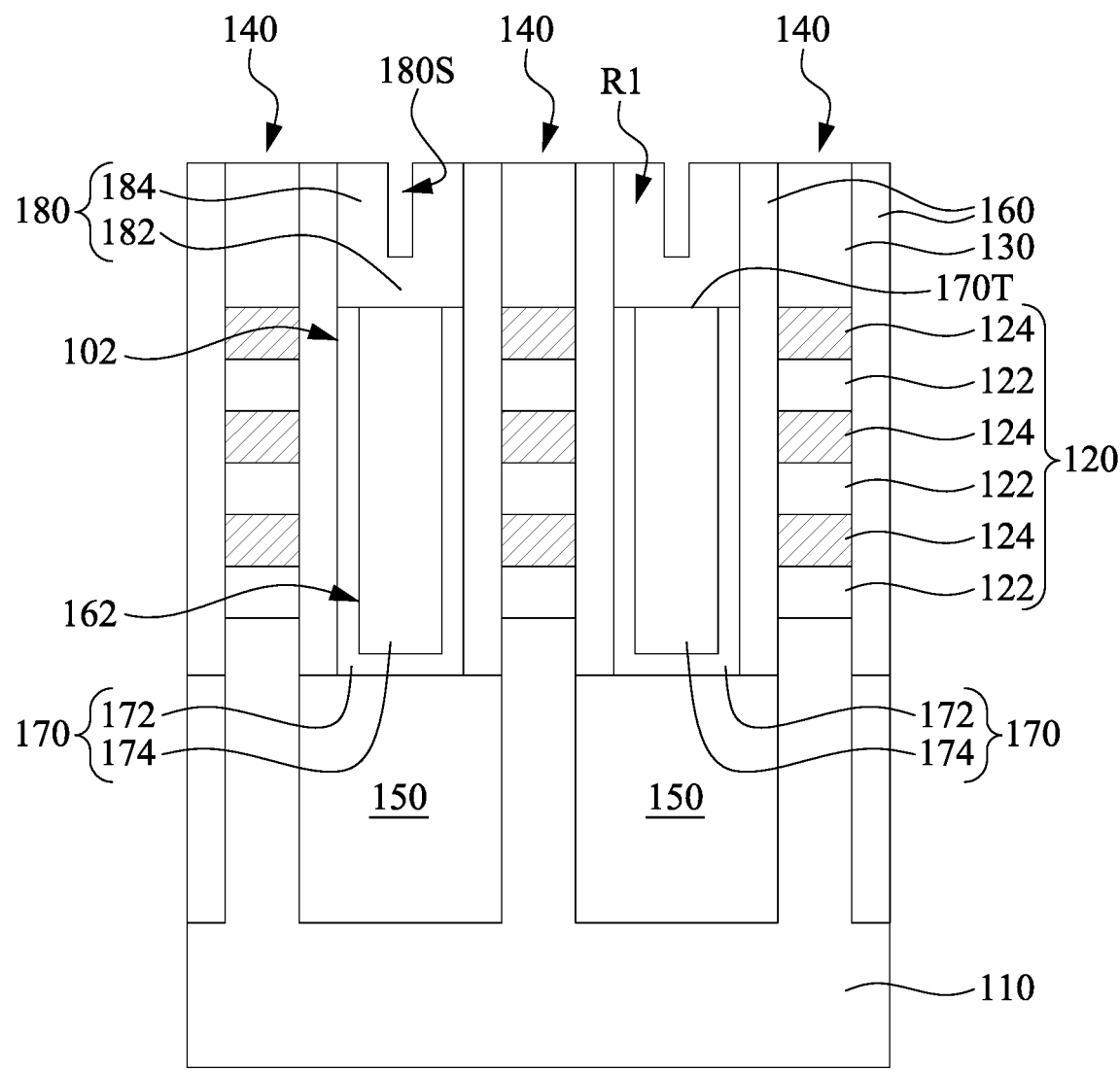

Referring to FIG. 26, as illustrated previously, a metal-containing compound material 180 is conformally deposited into the recess R1 and over the top surfaces of the semiconductor fins 140. Then, referring to FIG. 27, a planarization process (e.g., a CMP process) is performed, thereby removing portions of the metal-containing compound material 180 out of recesses R1 (e.g., the top portion 186).

Figure 28:
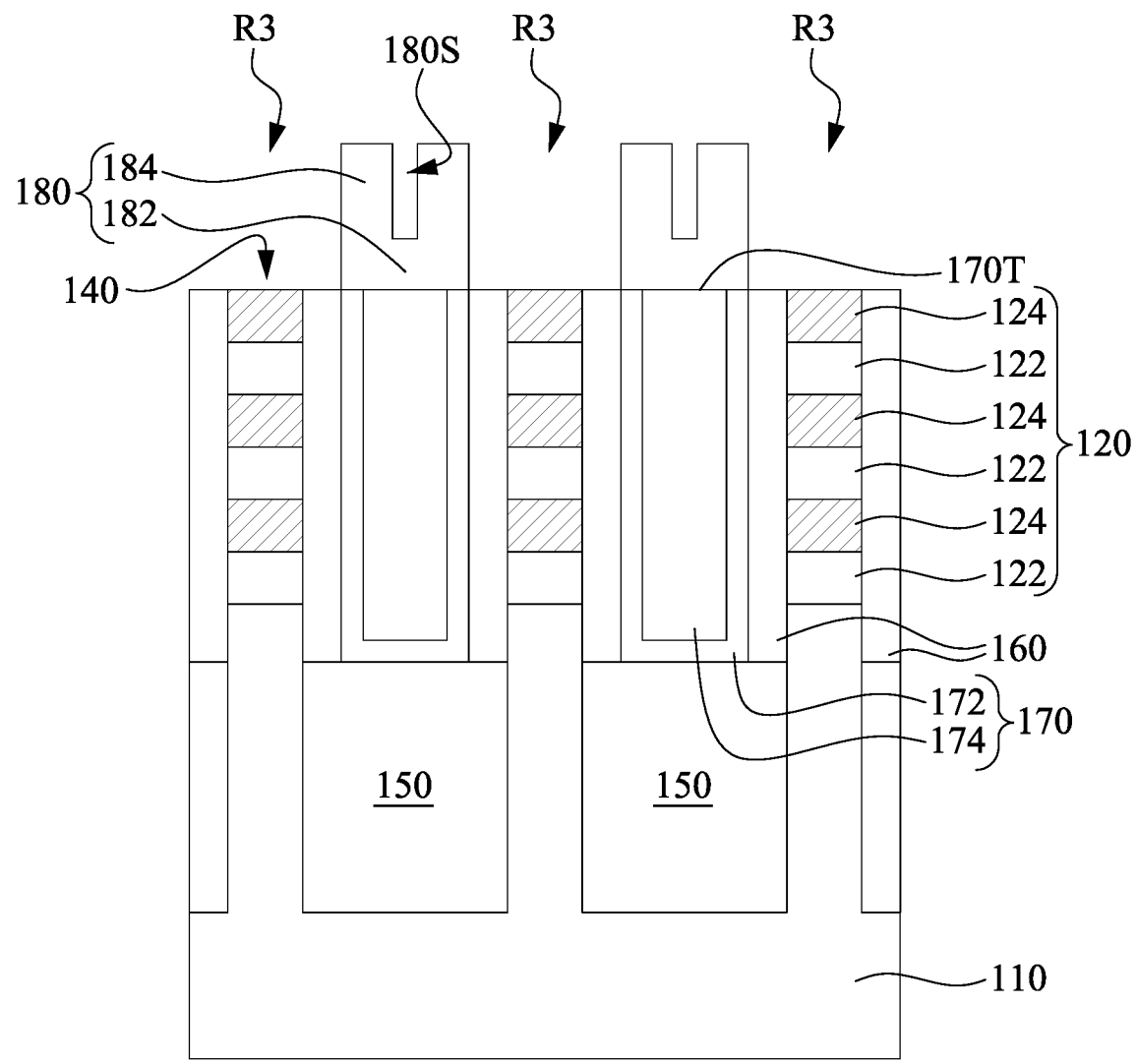

Reference is made to FIG. 28. The cap semiconductor layer 130 and the cladding layers 160 (referring to FIG. 27) may be etched back, such that the cap semiconductor layer 130 (referring to FIG. 27) and portions of the cladding layers 160 above top surfaces of the topmost semiconductor layer 124 are removed. The etching back process may show etch selectivity between the layers 130/160 and the semiconductor layer 124. For example, during the etching back process, an etch rate of the semiconductor layer 124 is less than an etch rate of the cap semiconductor layer 130 (referring to FIG. 27), and an etch rate of the semiconductor layer 124 is less than an etch rate of the cladding layers 160. In some embodiments, the metal-containing compound material 180 may act as an etch stop layer during the etching back process, thereby preventing underlying dielectric fin structures 170 from being etched. The etching back processes include dry etching process, wet etching process, or combinations thereof. The etching back processes may result in recesses R2.

Figure 29:
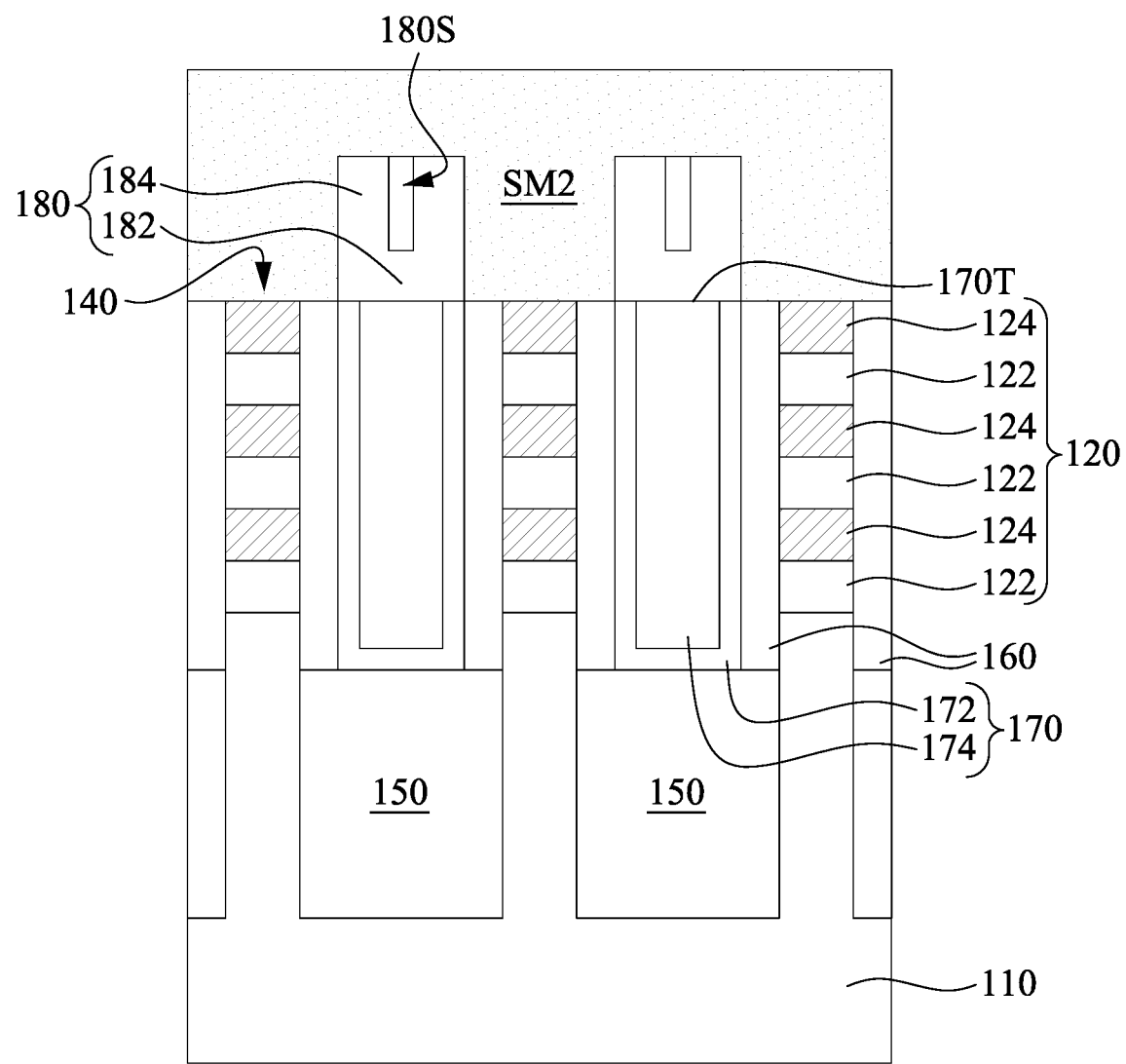

Reference is made to FIG. 29. A stress material SM2 is deposited into the recess R2 and over the metal-containing compound material 180. The stress material SM2 may surround the metal-containing compound material 180 and overfill the recess R2. In some embodiments, the stress material SM2 may create a high compressive stress field to the metal-containing compound material 180.

Figure 30:
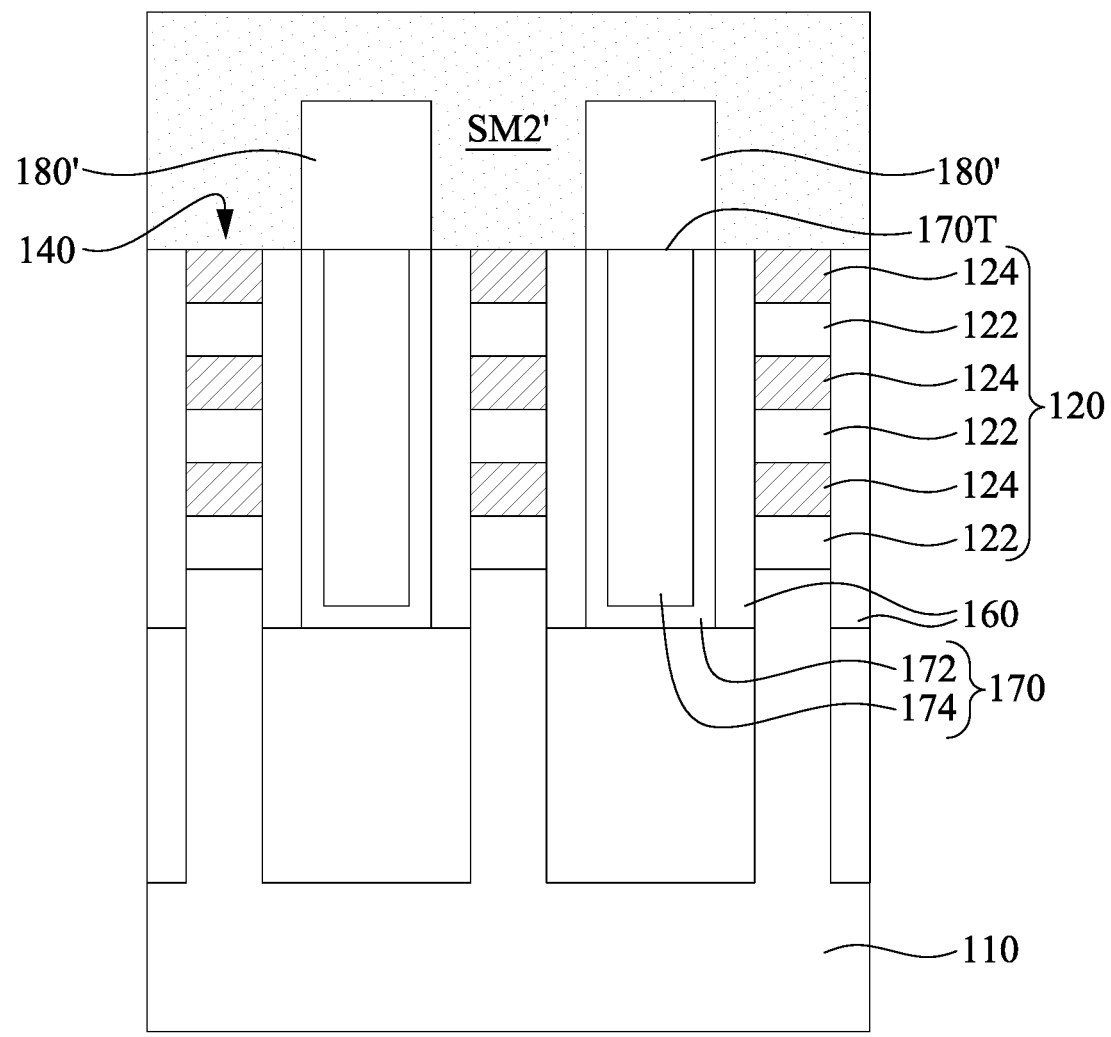

Reference is made to FIG. 30. An annealing process is performed to induce crystallization in the metal-containing compound material 180, thereby converting the metal-containing compound material 180 into the crystallized hard masks 180'. Through the annealing process performed under the high compressive stress, the slit 180S (referring to FIG. 29) is eliminated, and the crystallized hard masks 180' have little or no seam/void.

In some embodiments, the annealing process is performed such that the oxidized stress material SM2' is formed while the underlying semiconductor layers 124 are prevented from oxidation. For example, in some embodiments, one or more additional layers may be formed over the semiconductor layers 124 prior to the formation of the stress material SM2 to stop oxide diffusion. In some alternative embodiments, the material/composition of the stress material SM2 (referring to FIG. 29) may be selected to be easier oxidized then that of the underlying semiconductor layers 124.

Figure 31:
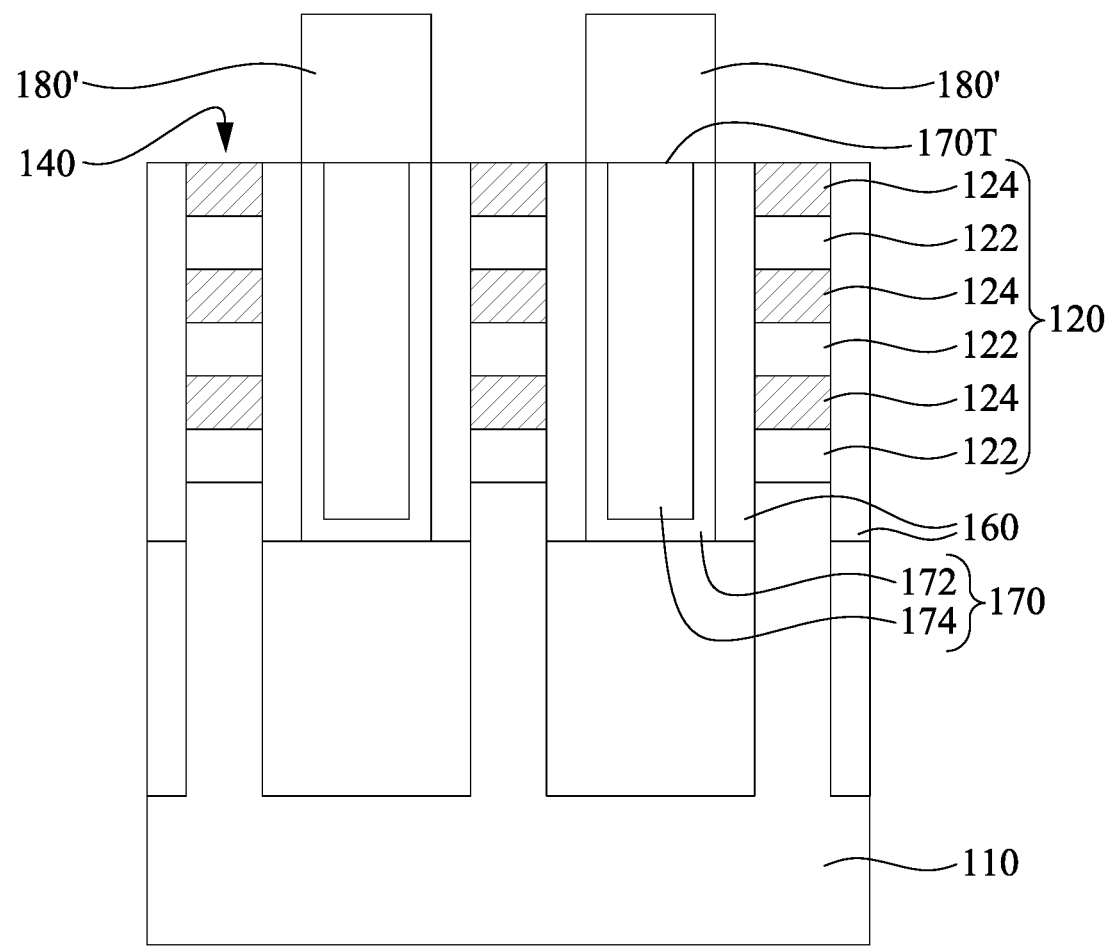

Reference is made to FIG. 31. After the formation of the crystallized hard masks 180', the stress material SM2' is removed from top surfaces of the topmost semiconductor layers 124 and the crystallized hard masks 180'. The removal of the stress material SM2' may include suitable etching/cleaning process, such as wet clean/etch, dry etching, or the combination thereof. For example, the wet etching/cleaning process may use a liquid etchant such as diluted Hf or the like. The wet etching/cleaning process may have an etch selectivity between the stress material SM2' and the topmost semiconductor layers 124, an etch selectivity between the stress material SM2' and the cladding layers 160, an etch selectivity between the stress material SM2' and the crystallized hard mask 180'. In other words, the topmost semiconductor layers 124, the cladding layers 160, and the crystallized hard mask 180' may have a higher etch resistance to the wet etching/cleaning process than that of the stress material SM2', such that the wet etching/cleaning process may not consume the topmost semiconductor layers 124, the cladding layers 160, and the crystallized hard mask 180'. After the processes illustrated in the present embodiments (referring to FIG. 26-31), the processes shown in FIGS. 14-24 may be performed.

Figure 32A:
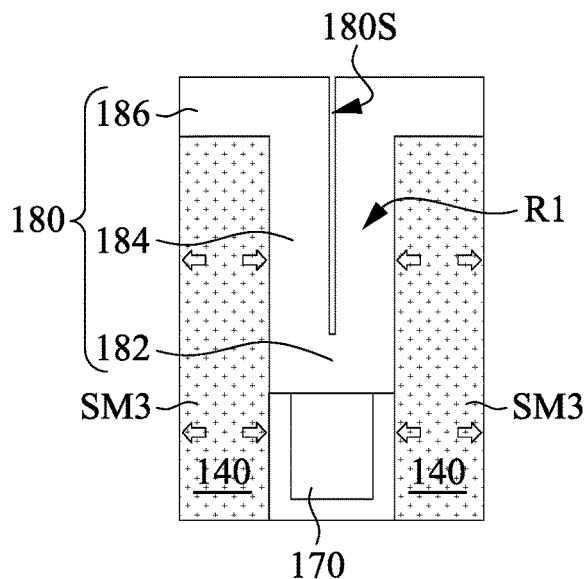
FIGS. 32A-32C illustrate a method for manufacturing a crystallized hard mask in a semiconductor device at various stages in accordance with some embodiments of the present disclosure.
Figure 32B:
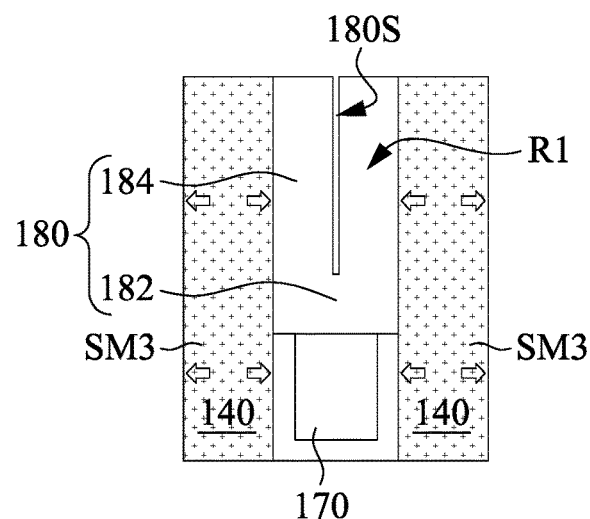
Figure 32C:
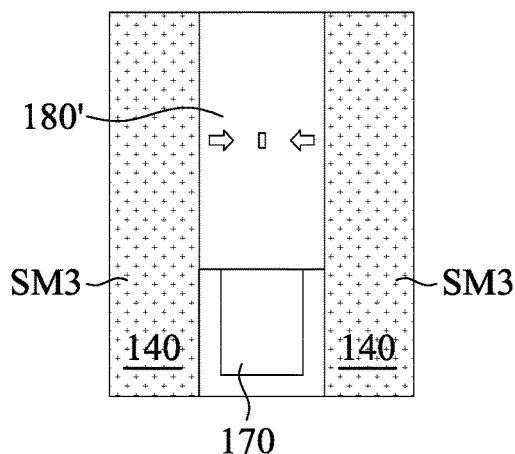

FIGS. 32A-32C illustrate a method for manufacturing a crystallized hard mask in a semiconductor device at various stages in accordance with some embodiments of the present disclosure. The present embodiments are similar to the embodiments illustrated in FIGS. 25A-25E, except that the semiconductor fins 140 in the present embodiments may inherently include a stress material SM3, such that the stress material SM2 in the embodiments of FIGS. 25A-25E may be omitted.

Referring to FIGS. 32A and 32B, as illustrated previously, a metal-containing compound material 180 is conformally deposited into the recess R1 and over the top surfaces of the semiconductor fins 140, and then a planarization process (e.g., a CMP process) is performed, thereby removing portions of the metal-containing compound material 180 out of recesses R1 (e.g., the top portion 186). The deposited metal-containing compound material 180 may be in amorphous state. In some embodiments, the stress material SM3 of the semiconductor fins 140 is selected to create a high compressive stress field to the metal-containing compound material 180. For example, the stress material SM3 include silicon, SiGe, or the like. The stress material SM3 is indicated by dotted pattern in the figure.

Referring to FIG. 32C, an annealing process is performed to induce crystallization in the metal-containing compound material 180, such that the metal-containing compound material 180 is converted from amorphous to crystalline. In some embodiments, the annealing process may also induce the merge of the side portions 184 (referring to FIG. 32B), such that the slit 180S (referring to FIG. 32B) may disappear. After the annealing process, the metal-containing compound material 180 is referred to as a crystallized hard mask 180'.

In some embodiments, the annealing process may be performed with an environment containing $H_2O$, $O_2$, or other oxide-containing gas, such that the annealing process may cause oxidation of the stress material SM3. Therefore, through the annealing process, the stress material SM3 has an expanded size and becomes oxidized stress material SM3. Therefore, the oxidized stress material SM3 may show a larger compressive stress to the metal-containing compound material 180 than that of the oxidized stress material SM3 in FIG. 32B. For example, in some embodiments where the stress material SM3 includes Si, the annealing process is performed such that the Si stress material SM3 is converted to SiOCN or $SiO_x$. For example, in some embodiments where the stress material SM3 includes SiGe, the annealing process is performed such that the Si stress material SM3 is converted to SiGeO, $SiO_x$, or $GeO_x$.

In some embodiments of the present disclosure, since the stress material SM3 may create a high compressive stress field to opposite sides of the metal-containing compound material 180, driving forces from the external compressive stress is exerted on the metal-containing compound material 180 when the side portions 184 are merged during annealing process. Through the configuration, the crystallized hard mask 180' may have less or no seam/void.

In some embodiments, the method shown in FIGS. 32A-32C is applied to the structure of FIG. 6B, thereby forming crystallized hard mask 180' over the structure of FIG. 6B, which are illustrated in the embodiments of FIGS. 33-36 below.

FIGS. 33-36 illustrate a semiconductor device at various stages of manufacturing in accordance with some embodiments of the present disclosure. It is understood that additional operations may be provided before, during, and after the operations shown by FIGS. 33-36, and some of the operations described below can be replaced or eliminated for additional embodiments of the method. The order of the operations/processes may be interchangeable.

Figure 33:
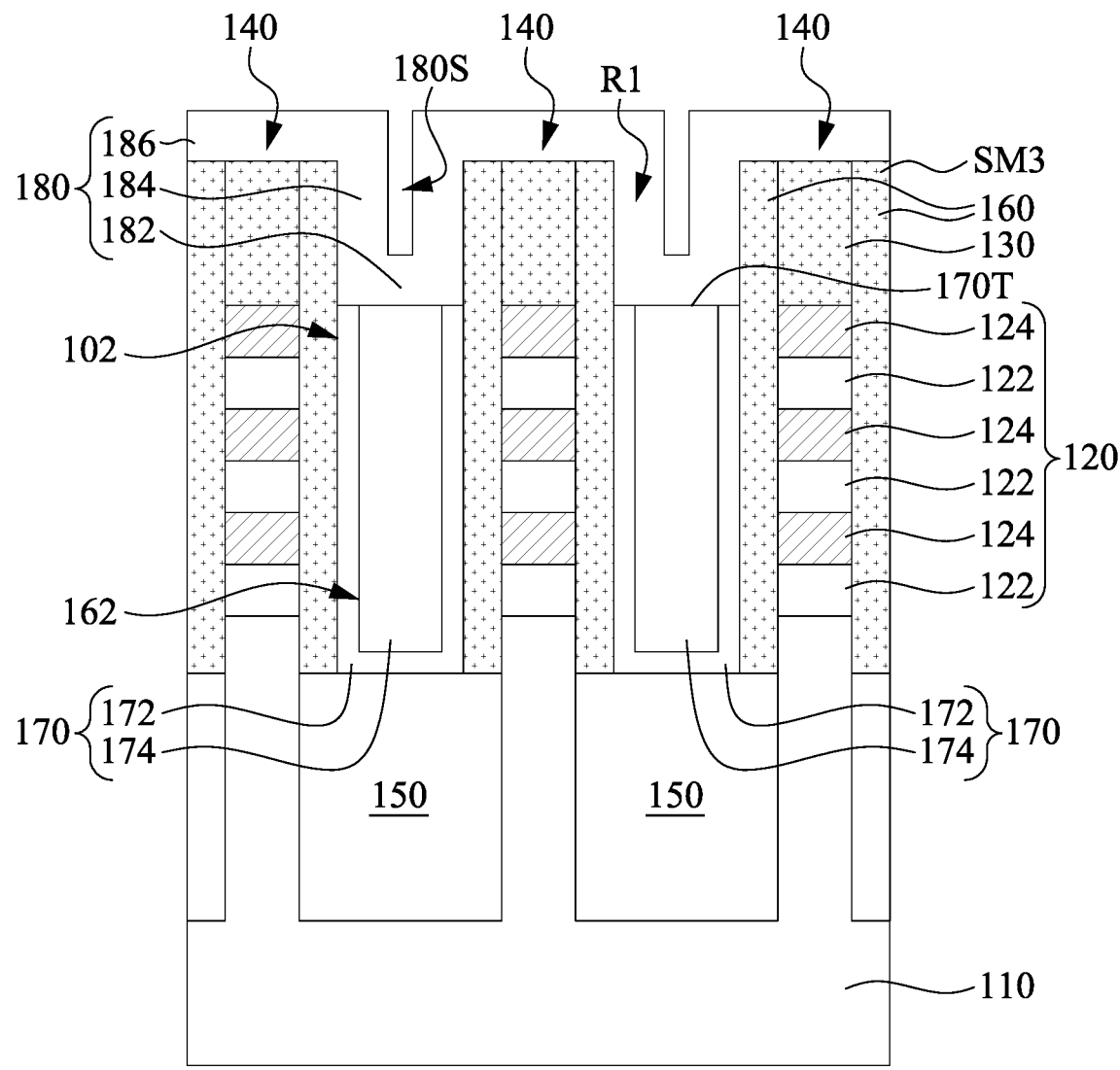
FIGS. 33-36 illustrate a semiconductor device at various stages of manufacturing in accordance with some embodiments of the present disclosure.
Figure 34:
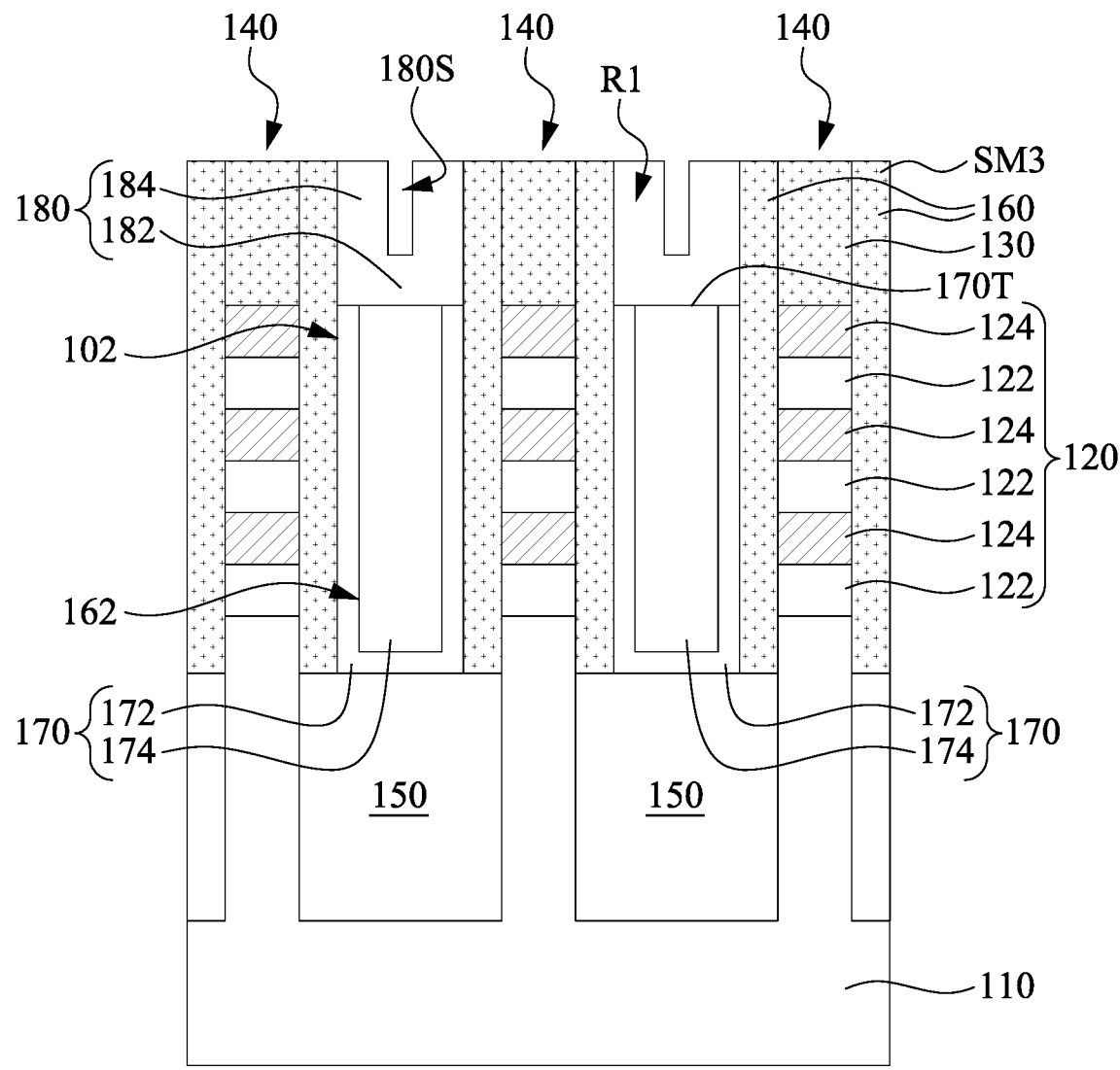

Referring to FIGS. 33, as illustrated previously, a metal-containing compound material 180 is conformally deposited into the recess R1 and over the top surfaces of the semiconductor fins 140. Then, referring to FIG. 34, a planarization process (e.g., a CMP process) is performed, thereby removing portions of the metal-containing compound material 180 out of recesses R1 (e.g., the top portion 186). In some embodiments, the semiconductor fins 140 and/or the cladding layer 160 may include a stress material SM3 that is capable of creating a high compressive stress field to the metal-containing compound material 180. For example, the stress material SM3 include silicon, SiGe, or the like. The stress material SM3 is indicated by dotted pattern in the figure.

Figure 35:
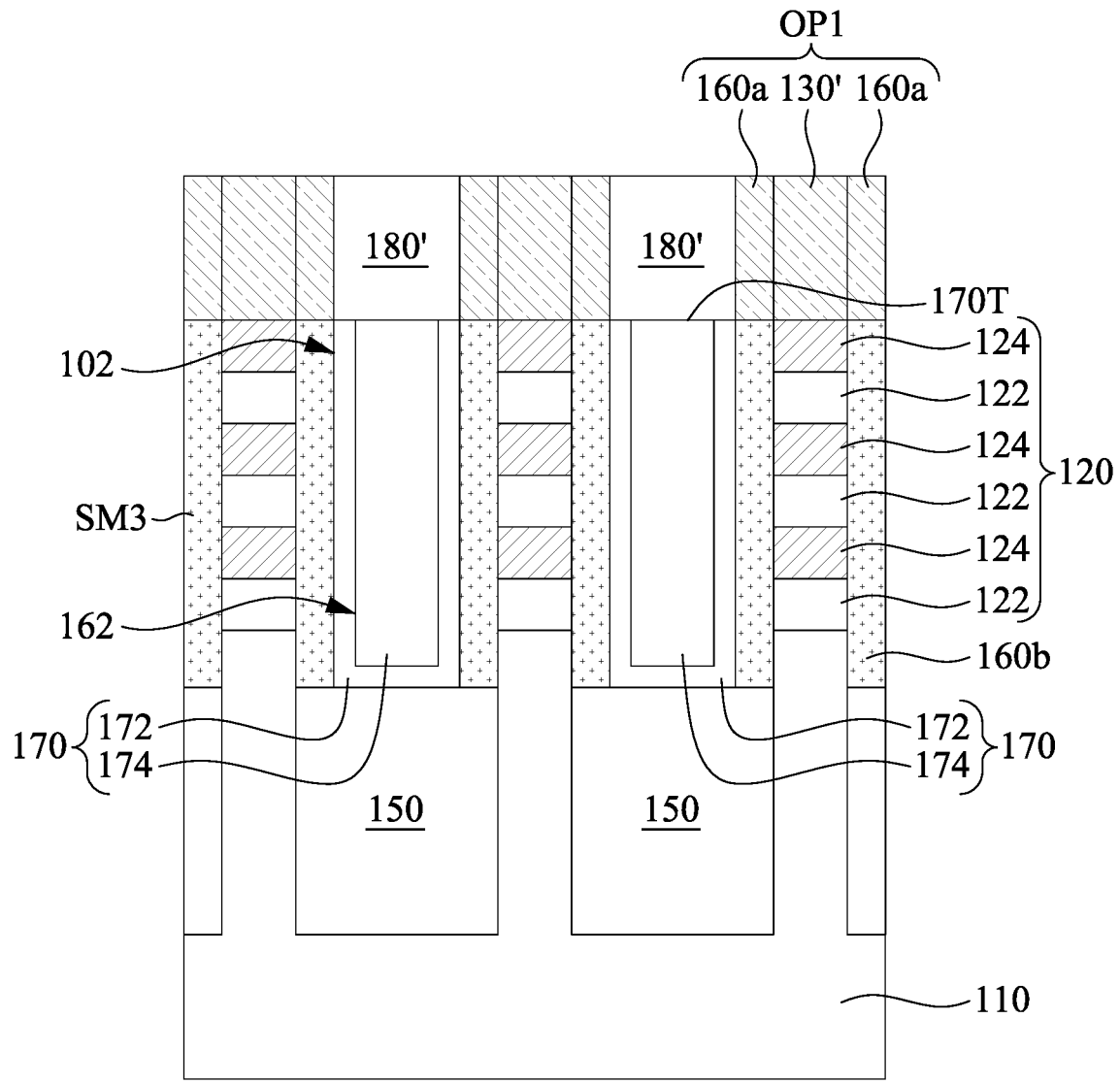

Reference is made to FIG. 35. An annealing process is performed to induce crystallization in the metal-containing compound material 180, thereby converting the metal-containing compound material 180 into the crystallized hard masks 180'. Through the annealing process performed under the high compressive stress, the slit 180S is eliminated, and the crystallized hard masks 180' have little or no seam/void.

In some embodiments, the annealing process is performed such that the cap semiconductor layer 130 and top portions of the cladding layers 160 (referring to FIG. 34) are oxidized into the stress oxide portions OP1, while the underlying semiconductor layers 124 are prevented from oxidation. To be specific, the stress oxide portions OP1 include a portion 130' oxidized from the cap semiconductor layer 130 (referring to FIG. 34) and a portion 160a oxidized from the top portions of the cladding layers 160 (referring to FIG. 34). In present embodiments, the material/composition of the cap semiconductor layer 130 and the cladding layers 160 (referring to FIG. 34) may be selected according to their contribution to the compressive stress. For example, the material/composition of the cap semiconductor layer 130 and the cladding layers 160 are easier oxidized then the underlying semiconductor layers 124. In some other embodiments, one or more additional layers may be formed between the semiconductor layers 124 and the cap semiconductor layer 130 (referring to FIG. 34) to stop oxide diffusion to the semiconductor layers 124. In some embodiments, a lower portion of the cladding layers 160 (e.g., the portion 160b) may not be oxidized.

In some alternative embodiments, the stress oxide portions OP1 may include the portion 130' oxidized from the cap semiconductor layer 130 (referring to FIG. 34), but does not include any portion oxidized from the top portions of the cladding layers 160. For example, the material/composition of the cap semiconductor layer 130 (referring to FIG. 34) may be selected according to their contribution to the compressive stress, but material/composition of the cladding layers 160 is not limited thereto. In some alternative embodiments, the stress oxide portions OP1 may include the portion 160a oxidized from the top portions of the cladding layers 160, but does not include any the portion oxidized from the cap semiconductor layer 130 (referring to FIG. 34). For example, the material/composition of the cladding layers 160 may be selected according to their contribution to the compressive stress, but material/composition of the cap semiconductor layer 130 (referring to FIG. 34) is not limited thereto.

Figure 36:
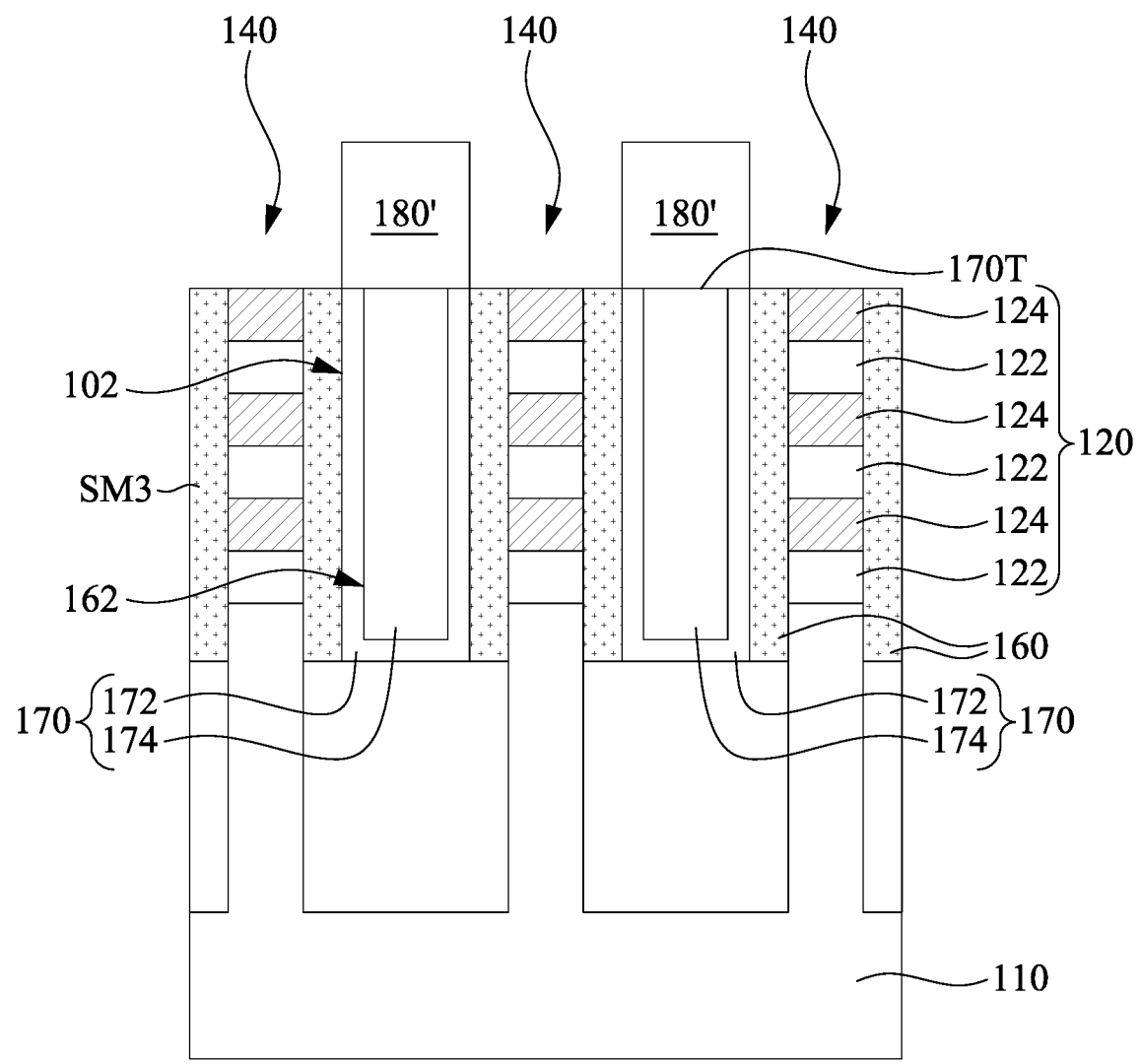

Reference is made to FIG. 36. After the formation of the crystallized hard masks 180', the stress oxide portions OP1 is removed from top surfaces of the topmost semiconductor layers 124. The removal of the stress oxide portions OP1 may include suitable etching/cleaning process, such as wet etching/cleaning, dry etching, or the combination thereof. For example, the wet etching/cleaning process may use a liquid etchant such as diluted Hf or the like. The wet etching/cleaning process may have an etch selectivity between the stress oxide portions OP1 and the topmost semiconductor layers 124, an etch selectivity between the stress oxide portions OP1 and the remaining cladding layers 160, and an etch selectivity between the stress oxide portions OP1 and the crystallized hard mask 180'. In other words, the topmost semiconductor layers 124, the remaining cladding layers 160, and the crystallized hard mask 180' may have a higher etch resistance to the wet etching/cleaning than that of the stress oxide portions OP1, such that the wet etching/cleaning may not consume the topmost semiconductor layers 124, the remaining cladding layers 160, the crystallized hard mask 180'. After the processes illustrated in the present embodiments (referring to FIGS. 33-36), the aforementioned processes shown in FIGS. 14-24 may be performed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the metal-containing compound hard mask, also referred to as crystallized materials, are applied to gap fill hard mask for their large etch resistance. The metal-containing compound hard mask may be used in self-aligned patterning for forming recesses accommodating epitaxy structures. Another advantage is that by using a high tensile stress material over a top surface of the metal-containing compound hard mask, when the annealing process induces crystallization in the metal-containing compound hard mask, seam/void in the metal-containing compound hard mask was eliminated by the driving force from an external tensile stress. Still another advantage is that by using a high compressive stress material surrounding the metal-containing compound hard mask, when the annealing process induces crystallization in the metal-containing compound hard mask, seam/void in the metal-containing compound hard mask was eliminated by the driving force from a compressive tensile stress.

According to some embodiments, a method for manufacturing a semiconductor device is provided. The method includes forming a semiconductor fin over a substrate; forming an isolation feature adjacent semiconductor fin; recessing the isolation feature to form a recess; forming a metal-containing compound mask in the recess; depositing a stress layer over the metal-containing compound mask, such that the stress layer is in contact with a top surface of the metal-containing compound mask; and annealing the metal-containing compound mask when the stress layer is in contact with the top surface of the metal-containing compound mask.

According to some embodiments, a method for manufacturing a semiconductor device is provided. The method includes forming a semiconductor fin over a substrate; forming an isolation feature adjacent the semiconductor fin; recessing the isolation feature to form a first recess; forming a metal-containing compound mask in the first recess; recessing the semiconductor fin to expose a sidewall of the metal-containing compound mask; depositing a stress layer over the recessed the semiconductor fin and in contact with the sidewall of the metal-containing compound mask; and annealing the metal-containing compound mask.

According to some embodiments, a method for manufacturing a semiconductor device is provided. The method includes forming a semiconductor fin over a substrate, wherein the semiconductor fin comprises an epitaxial stack and a semiconductor cap layer over the epitaxial stack; forming an isolation feature adjacent the semiconductor fin; recessing the isolation feature to form a recess; forming a metal-containing compound mask in the recess, wherein the metal-containing compound mask has a first portion and a second portion respectively on opposite sidewalls of the recess; annealing the metal-containing compound mask such that the first and second portions of the metal-containing compound mask are merged.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a semiconductor fin over a substrate;
    forming an isolation feature adjacent the semiconductor fin;
    recessing the isolation feature to form a recess;
    forming a metal-containing compound mask in the recess;
    depositing a stress layer over the metal-containing compound mask, such that the stress layer is in contact with a top surface of the metal-containing compound mask; and
    annealing the metal-containing compound mask when the stress layer is in contact with the top surface of the metal-containing compound mask.

2. The method of claim 1, further comprising:
    removing the stress layer from the top surface of the metal-containing compound mask after annealing the metal-containing compound mask.

3. The method of claim 2, wherein forming the semiconductor fin is performed such that the semiconductor fin comprises an epitaxial stack and a semiconductor cap layer over the epitaxial stack, and the method further comprises:
    removing the semiconductor cap layer from the epitaxial stack after removing the stress layer.

4. The method of claim 1, wherein depositing the stress layer is performed such that the stress layer is in contact with a top surface of the semiconductor fin.

5. The method of claim 1, further comprising:
    forming a gate structure over a first portion of the semiconductor fin;
    etching a second portion of the semiconductor fin, wherein the metal-containing compound mask has a higher etch resistance to etching the second portion of the semiconductor fin than that of semiconductor fin; and
    forming an epitaxy structure over the etched second portion of the semiconductor fin.

6. The method of claim 1, wherein depositing the stress layer is performed such that the stress layer comprises a plurality of hydrogen terminals.

7. The method of claim 1, further comprising:
    planarizing the top surface of the metal-containing compound mask and a top surface of the semiconductor fin prior to depositing the stress layer.

8. The method of claim 1, wherein forming the metal-containing compound mask is performed such that the metal-containing compound mask has a slit, and the slit shrinks after annealing the metal-containing compound mask.

9. A method for manufacturing a semiconductor device, comprising:
    forming a semiconductor fin over a substrate;
    forming an isolation feature adjacent the semiconductor fin;
    recessing the isolation feature to form a first recess;
    forming a metal-containing compound mask in the first recess;
    recessing the semiconductor fin to expose a sidewall of the metal-containing compound mask;
    depositing a stress layer over the recessed the semiconductor fin and in contact with the sidewall of the metal-containing compound mask; and
    annealing the metal-containing compound mask.

10. The method of claim 9, wherein depositing the stress layer is performed such that the stress layer is further over the metal-containing compound mask.

11. The method of claim 9, wherein annealing the metal-containing compound mask is performed with an oxide-containing gas such that the stress layer is oxidized.

12. The method of claim 9, further comprising:
    removing the stress layer after annealing the metal-containing compound mask.

13. The method of claim 9, wherein forming the semiconductor fin is performed such that the semiconductor fin comprises an epitaxial stack and a semiconductor cap layer over the epitaxial stack, and recessing the semiconductor fin comprises:

removing the semiconductor cap layer from the epitaxial stack.

14. The method of claim 9, further comprising:
forming a gate structure over a first portion of the semiconductor fin;
etching a second portion of the semiconductor fin, wherein the metal-containing compound mask has a higher etch resistance to etching the second portion of the semiconductor fin than that of semiconductor fin; and
forming an epitaxy structure over the etched second portion of the semiconductor fin.

15. The method of claim 9, wherein forming the metal-containing compound mask comprises:
conformally depositing a metal-containing compound material over the recess; and
planarizing a top surface of the metal-containing compound material and a top surface of the semiconductor fin prior to recessing the semiconductor fin.

16. A method for manufacturing a semiconductor device, comprising:
forming a semiconductor fin over a substrate, wherein the semiconductor fin comprises an epitaxial stack and a semiconductor cap layer over the epitaxial stack;
forming an isolation feature adjacent the semiconductor fin;
recessing the isolation feature to form a recess;
forming a metal-containing compound mask in the recess, wherein the metal-containing compound mask has a first portion and a second portion respectively on opposite sidewalls of the recess; and
annealing the metal-containing compound mask such that the first and second portions of the metal-containing compound mask are merged.

17. The method of claim 16, wherein annealing the metal-containing compound mask is performed with an oxide-containing gas, such that the semiconductor cap layer is oxidized.

18. The method of claim 17, further comprising:
removing the oxidized semiconductor cap layer after annealing the metal-containing compound mask.

19. The method of claim 16, wherein forming the metal-containing compound mask comprises:
conformally depositing a metal-containing compound material over the recess; and
planarizing a top surface of the metal-containing compound material and a top surface of the semiconductor fin.

20. The method of claim 16, further comprising:
forming a gate structure over a first portion of the semiconductor fin;
etching a second portion of the semiconductor fin, wherein the metal-containing compound mask has a higher etch resistance to etching the second portion of the semiconductor fin than that of semiconductor fin; and
forming an epitaxy structure over the etched second portion of the semiconductor fin.

* * * * *